US012796135B2

(12) United States Patent
Chen et al.

(10) Patent No.: US 12,796,135 B2
(45) Date of Patent: Nov. 10, 2026

(54) OPTICAL STRUCTURE AND METHOD FOR MANUFACTURING THE SAME

(71) Applicant: TAIWAN SEMICONDUCTOR MANUFACTURING COMPANY, LTD., Hsinchu (TW)

(72) Inventors: Chieh-En Chen, Tainan (TW); Chen-Hsien Lin, Tainan (TW); Tzu-Hsuan Hsu, Kaohsiung (TW); Cheng Yu Huang, Hsinchu (TW); Wei-Chieh Chiang, Changhua (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 797 days.

(21) Appl. No.: 17/865,769

(22) Filed: Jul. 15, 2022

(65) Prior Publication Data

US 2024/0021636 A1 Jan. 18, 2024

(51) Int. Cl.
*H10F 39/00* (2025.01)
*G02B 3/00* (2006.01)
(Continued)

(52) U.S. Cl.
CPC ....... *H10F 39/8057* (2025.01); *H10F 39/024* (2025.01); *G02B 3/0006* (2013.01); (Continued)

(58) Field of Classification Search
CPC .... H10F 39/024; H10F 39/182; H10F 39/199; H10F 39/8053; H10F 39/8057;
(Continued)

(56) References Cited

U.S. PATENT DOCUMENTS 9,991,303 B2 * 6/2018 Hsu ...................... H10F 39/014
2014/0077323 A1 3/2014 Velichko et al.
(Continued)

FOREIGN PATENT DOCUMENTS

CN 103000644 B 5/2017
TW I509781 B 11/2015
TW I736944 B 8/2021

*Primary Examiner* — Kevin K Pyo
(74) *Attorney, Agent, or Firm* — NZ Carr Law Office

(57) ABSTRACT

An optical structure and methods of forming an optical structure are provided. In some embodiments, the optical structure includes a substrate having a frontside and a backside opposite the frontside, a plurality of image-sensing elements arranged within the substrate, and a deep trench isolation (DTI) structure disposed between adjacent image-sensing elements. The DTI structure extends from the backside of the substrate to a first depth within the substrate and laterally surrounds the plurality of image-sensing elements. The optical structure further includes a light transmission layer formed over the backside of the substrate. The light transmission layer includes a first side and a second side adjacent to the backside of the substrate. The optical structure further includes a buried grid structure in the light transmission layer, the buried grid structure extending from the first side of the light transmission layer to a second depth within the light transmission layer.

20 Claims, 43 Drawing Sheets

(51) Int. Cl.
*G02B 5/20* (2006.01)
*H10F 39/12* (2025.01)
*H10F 39/18* (2025.01)

(52) U.S. Cl.
CPC .............. *G02B 5/20* (2013.01); *H10F 39/182* (2025.01); *H10F 39/199* (2025.01); *H10F 39/8053* (2025.01); *H10F 39/8063* (2025.01); *H10F 39/807* (2025.01)

(58) Field of Classification Search
CPC . H10F 39/8063; H10F 39/807; G02B 3/0006; G02B 5/20
See application file for complete search history.

(56) References Cited

U.S. PATENT DOCUMENTS

2015/0155320 A1* 6/2015 Chien ................. H10F 39/8053
257/432
2020/0098813 A1* 3/2020 Huang .................. H10F 39/805

* cited by examiner

OPTICAL STRUCTURE AND METHOD FOR MANUFACTURING THE SAME

BACKGROUND

Digital cameras and other optical imaging devices often employ optical structures such as semiconductor image sensors. Optical structures can be used to sense radiation and convert optical images to digital data that may be represented as digital images. For example, complementary metal-oxide-semiconductor (CMOS) image sensors (CIS) and charge-coupled device (CCD) sensors are widely used in various applications such as digital cameras, mobile phones, detectors, or the like. The optical structures utilize light detection regions to sense light, wherein the light detection regions may include pixels, illumination image sensors (such as back side illumination image sensors, which can be referred to as backside illumination (BSI) image sensors), or other types of image sensor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
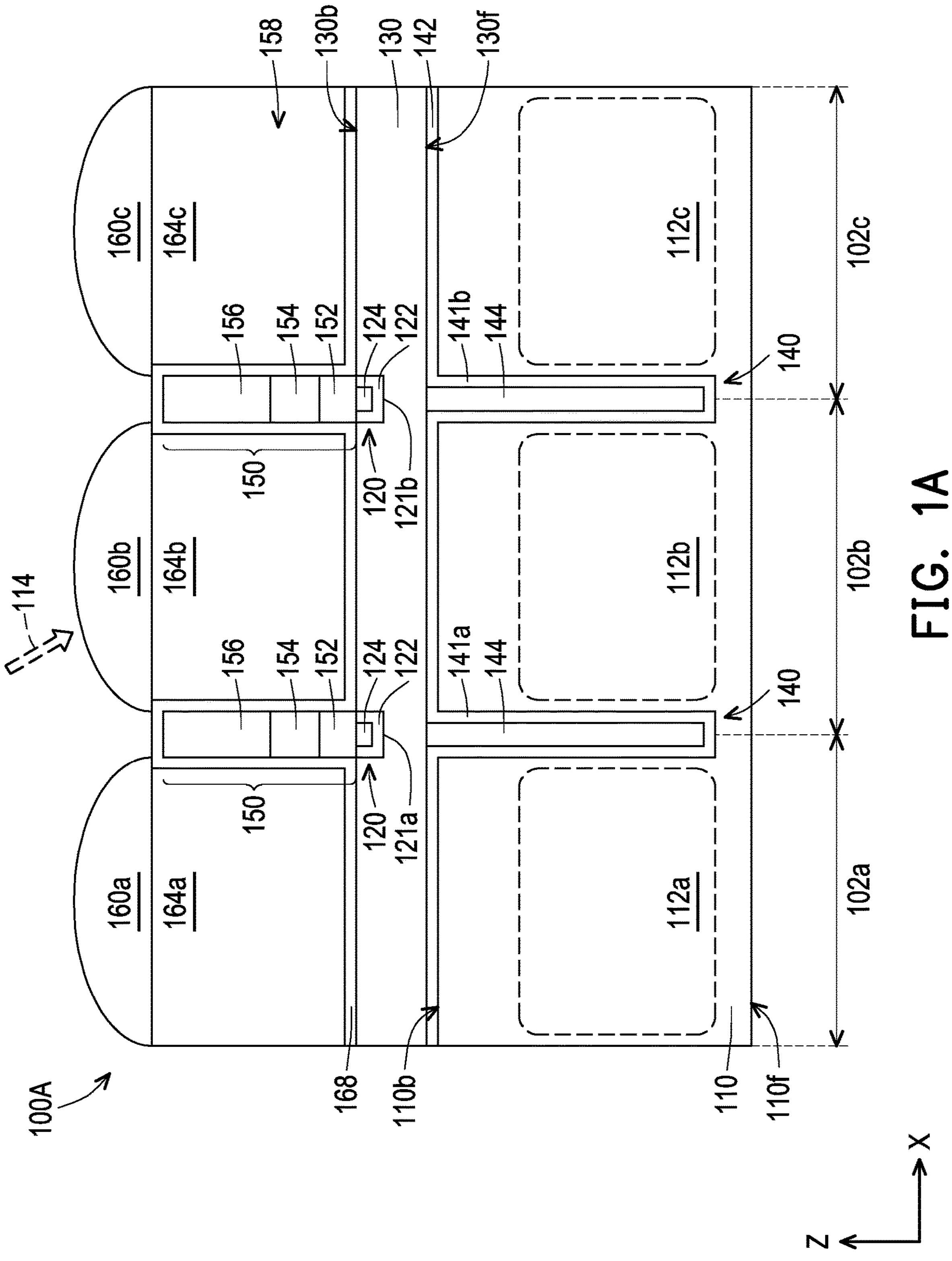
FIG. 1A illustrates a cross-sectional view of an optical structure including a buried grid structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “on,” “top,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variation of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

Light detection devices include frontside illumination (FSI) image sensors, BSI image sensors, both having an array of pixel sensors, or other suitable image sensor designs. One challenge of image sensors is crosstalk between adjacent light detection regions, or adjacent pixel regions. Optical crosstalk may occur when photons that are intended to be received by one light detection region, end up being erroneously received by a neighboring light detection region. Optical crosstalk may degrade the performance, for example, the resolution, of the image sensor. As image sensors become smaller and smaller through development, the risk of crosstalk increases significantly.

Improvement in quantum efficiency (QE) is also a sought-after characteristic as image sensors develop. QE is a ratio of the number of photons that contribute to an electrical signal generated by an image-sensing element within a pixel region to the number of photons incident on the pixel region. Incident light may not penetrate through metallic materials, or metallic material is opaque to photons. When metallic structures are present in an image sensor, photons impinging on the metallic structures may not contribute to electrons generated, and therefore the QE of the image sensor may be reduced.

Various embodiments provide an optical structure including a buried grid structure to improve optical isolation between adjacent light detection regions to reduce crosstalk without considerably sacrificing QE. Various embodiments provide an optical structure having a buried grid structure, and methods of forming the buried grid structure. The buried grid structure reduces crosstalk and improves QE of the resultant image-sensing device. The buried grid structure can be easily embedded and/or positioned within different image-sensing devices based upon the optical needs of the user. In addition, the buried grid structure can be used in conjunction with currently available grid structures to further reduce crosstalk without sacrificing QE.

FIG. 1A illustrates a cross-sectional view of an optical structure 100A including a buried grid structure 120 in accordance with some embodiments. The optical structure 100A at least includes a device substrate 110, a pixel region or light detection region 102*a*, 102*b*, 102*c* (collectively 102) formed in the device substrate 110, and a light transmission layer 130 having the buried grid structure 120 formed therein. The optical structure 100A may further include an isolation structure 140 formed in the device substrate 110, an upper grid structure 150, micro lenses 160*a-c* (collectively 160), and color filters 164*a-c* (collectively 164).

The optical structure 100A includes the device substrate 110. In some embodiments, the device substrate 110 is a p-type semiconductor substrate (P-Substrate) or an n-type semiconductor substrate (N-Substrate) comprising silicon. In some other alternative embodiments, the device substrate 110 includes other elementary semiconductor materials, such as germanium; a compound semiconductor including silicon carbide, gallium arsenic, gallium phosphide, indium phosphide, indium arsenide, and/or indium antimonide; an alloy semiconductor including silicon germanium (SiGe), gallium arsenide phosphide (GaAsP), aluminum indium arsenide (AlInAs), aluminum gallium arsenide (AlGaAs), indium gallium arsenide (InGaAs), indium gallium phosphide (InGaP), indium gallium arsenide phosphide (InGaAsP), combinations thereof, or the like. In some other embodiments, the device substrate 110 is a semiconductor on insulator (SOI). In some other embodiments, the device substrate 110 may include an epitaxial layer, a gradient semiconductor layer, and/or a semiconductor layer overlying another different type of semiconductor layer, such as a silicon layer on a silicon germanium layer. The device substrate 110 may or may not include doped regions, such as a p-well, an n-well, or combination thereof.

The device substrate 110 has a frontside 110*f* (also referred to as a front surface) and a backside 110*b* (also referred to as a back surface) opposite the frontside 110*f*. The device substrate 110 includes, for example, image-sensing elements 112*a*, 112*b*, and 112*c* (collectively 112), arranged to correspond to each light detection region 102. The image-sensing elements 112*a-c* are configured to sense radiation (or radiation waves), such as an incident light 114, that is projected toward the device substrate 110 from the backside 110*b*. The incident light 114 would enter the device substrate 110 through the backside 110*b* (or the back surface) and be detected by one or more of the image-sensing elements 112*a-c*. The image-sensing elements 112*a-c* can be arranged in rows and/or columns within the device substrate 110. In some embodiments, each light detection region 102 includes image-sensing elements arranged in an array including one or more rows or and one or more columns. For example, the light detection region 102 may include two columns and two rows (e.g., a 2×2 structure). It will be appreciated that the light detection region 102 may include other combinations of rows and columns, for example, one row and two columns (e.g., a 2×1 structure) or one row and one column (e.g., a 1×1 structure). In some embodiments, the image-sensing elements 112*a-c* each include a photodiode. In other embodiments, the image-sensing elements 112*a-c* may include pinned layer photodiodes, photogates, reset transistors, source follower transistors, and transfer transistors. The image-sensing elements 112*a-c* may also be referred to as radiation-detection devices or pixel sensors.

The optical structure 100A further includes a light transmission layer 130. The light transmission layer 130 may be formed over or in contact with the backside 110*b* of the device substrate 110. The light transmission layer 130 has a backside 130*b* opposite to the device substrate 110 and a frontside 130*f* facing the backside 110*b* of the device substrate 110. The light transmission layer 130 may include an oxide dielectric (such as silicon oxide, hafnium oxide, spin-on glass, fluoride-doped silicate glass, undoped silica glass, or the like), antireflective coating (ARC), a multilayer structure of oxide dielectric and/or ARC, or the like. In some embodiments, where both the ARC and the oxide dielectric are present, the oxide dielectric is typically arranged over the ARC. The light transmission layer 130 spaces the device substrate 110 from the upper grid structure 150 that overlies the device substrate 110.

The optical structure 100A further includes the buried grid structure 120. The buried grid structure 120 is formed in the light transmission layer 130. The buried grid structure 120 defines an isolation grid made up of individual rectangles, squares, or other shapes the abut one another. Further, the buried grid structure 120 extends into the light transmission layer 130 from about even with the backside 130*b* of the light transmission layer 130 toward the frontside 130*f* of the light transmission layer 130. The buried grid structure 120 includes buried grid structure section 121*a* and buried grid structure section 121*b*. The buried grid structure 120 is laterally arranged around and between the image-sensing elements 112 to advantageously provide optical isolation between neighboring image-sensing elements 112. The buried grid structure 120 helps block light from passing between neighboring image-sensing elements 112 to help reduce crosstalk. In some embodiments, the buried grid structure 120 may include a metal section, a metal nitride section, a dielectric section, a low refractive index ("low-n") section, and/or an organic section. A low-n material has a refractive index less than the color filters 164*a-c* overlying corresponding image-sensing elements 112. In some embodiments, the buried grid structure 120 includes a metal nitride grid section 122 and a metallic section 124 as shown in FIG. 1A.

In some embodiments, the optical structure 100A may further include an isolation structure 140 formed in the device substrate 110. The isolation structure 140 includes isolation structure sections 141*a* and 141*b*. In some embodiments, the isolation structure 140 may be a deep trench isolation (DTI) structure, such as a backside deep trench isolation (BDTI) structure. The isolation structure 140 defines a substrate isolation grid, made up of grid segments, such as individual rectangles, squares, or other shapes which abut one another. Further, in some embodiments, the isolation structure 140 extends into the device substrate 110 from about even with the backside 110*b* of the device substrate 110. The isolation structure 140 is laterally arranged around and between the image-sensing elements 112 to advantageously provide optical isolation between neighboring image-sensing elements 112. The isolation structure 140 can include an isolation material selected from a high-k dielectric material, a dielectric material, a low-n material, a metallic material, or a multi-layer combination thereof. In some embodiments, the isolation structure 140 includes a high-k dielectric liner 142 and an isolation material 144. The isolation material 144 may include, for example, a metal, such as tungsten, copper, aluminum, or aluminum copper. Alternatively, the isolation material 144 may be, for example, a low-n material. In some embodiments, the isolation material 144 has a refractive index less than about 1.6. Further, in some embodiments, isolation material 144 is a dielectric, such as an oxide (e.g., $SiO_2$) or hafnium oxide (e.g., $HfO_2$), or a material with a refractive index less than silicon.

In some embodiments, the optical structure 100A may further include an upper grid structure 150. The upper grid structure 150 may be formed over the backside 110*b* of the device substrate 110 and the backside 130*b* of the light transmission layer 130 containing the buried grid structure 120. In some embodiments, the upper grid structure 150 contacts the buried grid structure 120. The upper grid structure 150 can be laterally arranged around and between the image-sensing elements 112*a-c* to define openings 158 within which the color filters 164*a-c* are arranged. In some embodiments, the openings 158 correspond to the light detection region 102*a-c* and are centrally aligned with the image-sensing elements 112*a-c* of the corresponding light detection regions 102*a-c*. In other embodiments, the openings 158 are laterally shifted or offset (e.g., along the x-axis) relative to the image-sensing elements 112*a-c* of the corresponding light detection regions 102*a-c*.

In some embodiments, the upper grid structure 150 is a composite grid structure that includes one or more of a metal nitride grid section, a metallic grid section, a low-n grid section, or a dielectric grid section in various combinations. In some embodiments, as depicted in FIG. 1A, the upper grid structure 150 includes a metal nitride grid section 152, a metallic grid section 154, and a dielectric grid section 156 stacked in that order over the light transmission layer 130. Each grid section 152, 154, 156 is made up of grid segments, such as individual rectangles, squares, or other shapes which abut one another to collectively make up each grid section 152, 154, 156 and which surround respective image-sensing elements 112*a-c*. Each grid section 152, 154, 156 also includes openings 158 between the grid segments and which overlie the image-sensing elements 112*a-c*. In some embodiments, the metal nitride grid section 152 functions as a barrier layer to prevent metal from the metallic grid section 154 from leaking into the light transmission layer 130. In some embodiments, the metal nitride grid section 154 may comprise, for example, titanium nitride, tantalum nitride, or combinations thereof. The metallic grid section 154 blocks light from passing between neighboring image-sensing elements 112*a-c* to help reduce crosstalk. In some embodiments, the metallic grid section 154 may be, for example, tungsten, copper, or aluminum copper. In some embodiments, the dielectric grid section 156 includes a material with a refractive index less than a refractive index of the color filters 164*a-c*. Due to the low refractive index, the dielectric grid section 156 serves as a light guide to incident light 114 to the color filters 164*a-c* and to effectively increase the size of the color filters 164*a-c*. Further, due to the low refractive index, the dielectric grid section 156 serves to provide optical isolation between neighboring light detection regions 102*a-c*. Light within the color filters 164*a-c* that strikes the boundary of the dielectric grid section 156 typically undergoes total internal reflection due to the refractive indexes. In some embodiments, the dielectric grid section 156 is an oxide, for example, silicon oxide (e.g., $SiO_2$) or hafnium oxide (e.g., $HfO_2$), or a material with a refractive index less than silicon. In other embodiments, the dielectric grid section 156 may be, for example, silicon nitride or silicon oxynitride. In other embodiments, the upper grid structure 150 includes a low-n grid section. In other embodiments, the upper grid structure 150 includes a dielectric grid section.

The color filters 164*a-c* are arranged over the light transmission layer 130. Further, the color filters 164*a-c* are arranged over the image-sensing elements 112*a-c* of corresponding light detection regions 102*a-c* within the openings 158 of the upper grid structure 150. In some embodiments, the color filters 164*a-c* have upper surfaces that are approximately even with an upper surface of the upper grid structure 150. Further, the color filters 164*a-c* are assigned corresponding colors or wavelengths of light and configured to filter out all but the assigned colors or wavelengths of light. Typically, the color filter assignments alternate between red, green, and blue light, such that the color filters 164*a-c* include red color filters, green color filters, and blue color filters. In some embodiments, the color filter assignments alternate between red, green, and blue light according to a Bayer filter mosaic.

In some embodiments, a dielectric capping layer 168 lines the upper grid structure 150 spacing the color filters 164*a-c* from the upper grid structure 150, and the micro lenses 160*a-c* corresponding to the light detection region 102*a-c* covering the color filters 164*a-c*. The dielectric capping layer 168 may provide protection to the grid sections 156 during subsequent operation. The dielectric capping layer 168 may be the same material or a different material than the dielectric grid section 156. The dielectric capping layer 168 may include oxide, such as silicon oxide ($SiO_2$), hafnium oxide ($HfO_2$), or the like. In other embodiments, the dielectric capping layer 168 may be a nitride or oxynitride, for example, silicon nitride or silicon oxynitride. In some embodiments, the dielectric capping layer 168 includes the same material as the dielectric grid section 156. In other embodiments, the dielectric capping layer 168 includes material that is different than the material of the dielectric grid section 156. In some embodiments, the micro lenses 160*a-c* are centered with the image-sensing elements 112*a-c* of the corresponding light detection regions 102*a-c*, and are typically symmetrical about vertical axes centered on the image-sensing elements 112*a-c*. In other embodiments, the micro lenses 160*a-c* are laterally shifted or offset (e.g., along the x-axis) relative to the image-sensing elements 112*a-c* and are asymmetrical relative to the vertical axes centered on the image-sensing elements 112*a-c*. Further, in some embodiments, the micro lenses 160*a-c* typically overhang the upper grid structure 150 around the openings 158 so neighboring edges of the micro lenses 160*a-c* abut.

Figure 1B:
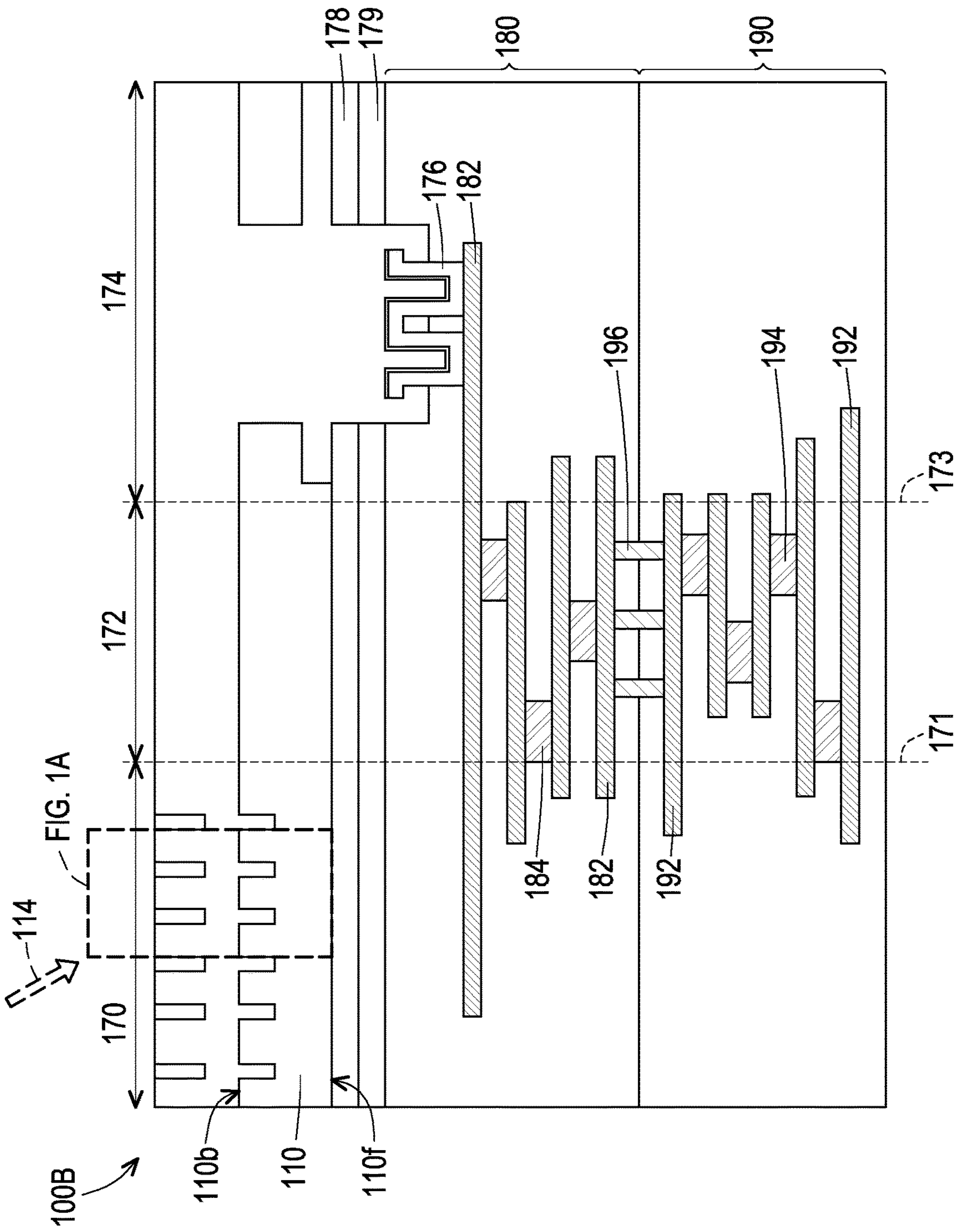
FIG. 1B illustrates an image sensor device including the optical structure of FIG. 1A in accordance with some embodiments.

FIG. 1B illustrates an image sensor device 100B including the optical structure 100A of FIG. 1A in accordance with some embodiments. The image-sensing elements 112*a-c* are formed in a region of the image sensor device 100B referred to as a pixel array region 170 (or a pixel-array region). The image sensor device 100B may further include a black level correction (BLC) region 172 laterally surrounding the pixel array region 170. In addition, the image sensor device 100B may further include a bonding pad region 174. The dashed line 171 and the dashed line 173 in FIG. 1B designate approximate boundaries between the regions 170, 172, and 174, though it is understood that the regions 170, 172, and 174 are not drawn to scale herein and may extend vertically above and below the device substrate 110.

The optical structure 100A may be used in the pixel array region 170 of the image sensor device 100B depicted in FIG. 1B. The optical structure 100A may be used in optical devices other than the image sensor device 100B of FIG. 1B.

The BLC region 172 typically includes devices that are kept optically dark. For example, the BLC region 172 may include a digital device, such as an application-specific integrated circuit (ASIC) device, a system-on-chip (SOC) device, and/or a logic circuit. In some embodiments, the BLC region 172 includes a reference pixel that is used to establish a baseline of an intensity of light for the image sensor device 100B.

The bonding pad region 174 includes a region where one or more conductive bonding pads 176 of the image sensor device 100B are formed so that electrical connections between the image sensor device 100B and external devices may be established. Among other things, the bonding pad region 174 may contain an isolation structure, such as a shallow trench isolation (STI) (not shown) to help insulate the silicon of the device substrate 110 from the one or more conductive bonding pads 176 formed in the bonding pad region 174.

Although not illustrated herein for reasons of simplicity, it is understood that the image sensor device 100B may also include a scribe line region. The scribe line region includes a region that separates one semiconductor die (for example, a semiconductor die that includes the bonding pad region 174, the BLC region 172, and the pixel array region 170 from an adjacent semiconductor die (not illustrated)). The scribe line region is cut therethrough in a later fabrication process to separate adjacent dies before the dies are packaged and sold as integrated circuit chips. The scribe line region is cut in such a way that the semiconductor devices in each die are not damaged.

Still referring to FIG. 1B, in some embodiments, a buffer layer 178 is formed over the frontside 110*f* of the device substrate 110. In some embodiments, the buffer layer 178 includes a dielectric material, for example, an oxide such as silicon oxide ($SiO_2$). Alternatively, the buffer layer 178 may include a nitride, for example, silicon nitride (SiN). The buffer layer 178 may be formed by chemical vapor deposition (CVD), physical vapor deposition (PVD), or other suitable techniques. In some embodiments, the buffer layer 178 is planarized to form a smooth surface by a chemical mechanical planarization (CMP) process. Among other things, the buffer layer 178 provides electrical isolation between the device substrate 110 and subsequently formed interconnect devices. In addition, the buffer layer 178 provides mechanical strength and support during additional processing of the device substrate 110.

Still referring to FIG. 1B, in some embodiments, a layer 179 is formed over the buffer layer 178 on the backside 110*b* of the device substrate 110. The layer 179 has a material composition that is different from the buffer layer 178. In some embodiments, a sufficiently high etching selectivity exists between the layer 179 and the buffer layer 178. In other words, the buffer layer 178 and the layer 179 have substantially different etching rates, such that the etching process may be performed to remove one of the buffer layer 178 and the layer 179 without affecting the other. In some embodiments where the buffer layer 178 contains silicon oxide, the layer 179 may contain silicon nitride (SiN), silicon carbide (SiC), silicon oxynitride (SiON), titanium nitride (TiN), or even a suitable metal or metal compound material such as tungsten (W), aluminum copper (AlCu), and copper (Cu). In some embodiments, the layer 179 has a thickness in a range from about 100 angstroms to about 1500 angstroms. This thickness range is configured such that the layer 179 may perform as an etch-stop layer (ESL) in subsequent processes.

In some embodiments, the image sensor device 100B may further include a first interconnect structure 180. The first interconnect structure 180 is formed or positioned over the frontside 110*f* of the device substrate 110. In some embodiments, the first interconnect structure 180 is formed on or over the layer 179. The first interconnect structure 180 includes a plurality of patterned dielectric layers and conductive layers that provide interconnections (e.g., wiring) between the various doped features, circuitry, and input/output of the image sensor device 100B. In some embodiments, the first interconnect structure 180 includes an interlayer dielectric (ILD) and a multilayer interconnect (MLI) structure. The MLI structure includes contacts, vias and metal lines. For purposes of illustration, a plurality of conductive lines 182 and vias/contacts 184 are shown in FIG. 1B, it being understood that the conductive lines 182 and vias/contacts 184 illustrated are merely exemplary, and the actual positioning and configuration of the conductive lines 182 and vias/contacts 184 may vary depending on design needs.

The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including PVD (or sputtering), CVD, atomic layer deposition (ALD), or combinations thereof. Other manufacturing techniques to form the aluminum interconnect may include photolithography processing and etching to pattern the conductive materials for vertical connection (for example, vias/contacts 184) and horizontal connection (for example, conductive lines 182). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

In some embodiments, the image sensor device 100B may further include a second interconnect structure 190. The second interconnect structure 190 may be formed or positioned over the frontside 110*f* of the device substrate 110. In some embodiments, the second interconnect structure 190 is formed on or over the first interconnect structure 180. Similar to the first interconnect structure, the second interconnect structure 190 includes a plurality of patterned dielectric layers and conductive layers that provide interconnections (e.g., wiring) between the various doped features, circuitry, and input/output of the image sensor device 100B. The second interconnect structure 190 includes an ILD and a MLI structure. The MLI structure includes contacts, vias and metal lines. For purposes of illustration, a plurality of conductive lines 192 and vias/contacts 194 are shown in FIG. 1B, it being understood that the conductive lines 192 and vias/contacts 194 illustrated are merely exemplary, and the actual positioning and configuration of the conductive lines 192 and vias/contacts 194 may vary depending on design needs.

In some embodiments, as shown in FIG. 1B, a conductive line of the plurality of conductive lines 192 of the second interconnect structure 190 is electrically coupled with a conductive line of the plurality of conductive lines 182 of the first interconnect structure 180 by pillars 196 or other connecting structure. In some embodiments, the first interconnect structure 180 includes a system-on-chip (SOC) device and the second interconnect structure 190 includes an application specific integrated circuit (ASIC).

In some embodiments, the conductive bonding pad 176 is formed on the exposed surface of the conductive line 182 in the bonding pad region 174. The conductive bonding pad 176 may be formed by one or more deposition and patterning processes. In some embodiments, the conductive bonding pad 176 contains aluminum. In other embodiments, the conductive bonding pad 176 may contain another suitable metal, for example copper. A bonding wire (or another electrical interconnection element) may be attached to the conductive bonding pad 176 in a later process, and accordingly the conductive bonding pad 176 may also be referred to as a bond pad or a conductive pad. Also, since the conductive bonding pad 176 is formed on the conductive line 182, it is electrically coupled to the conductive line 182 and the rest of the first interconnect structure 180 and the second interconnect structure 190 through the conductive line 182. In other words, electrical connections may be established between external devices and the image sensor device 100B at least in part through the conductive bonding pad 176.

Figure 2:
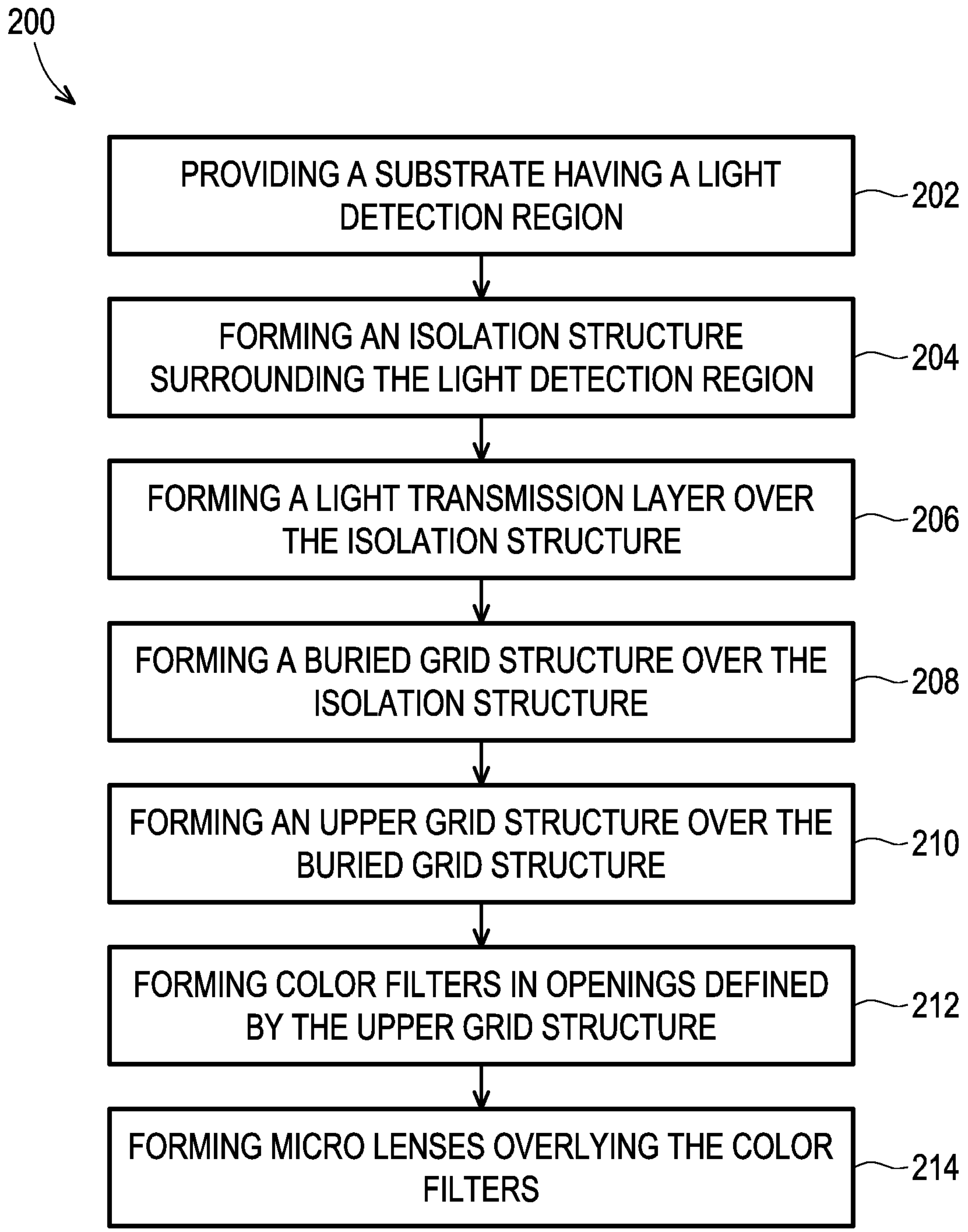
FIG. 2 illustrates a flow chart of a method for manufacturing an optical structure in accordance with some embodiments.

FIG. 2 illustrates a flow chart of a method 200 for manufacturing an optical structure in accordance with some embodiments.

At operation 202, a substrate is provided. The substrate may be a device substrate or semiconductor substrate as described herein. The substrate may have a light detection region and/or pixel regions already formed therein.

At operation 204, an isolation structure surrounding the light detection region is formed. The isolation structure may be a DTI structure, such as a BDTI structure. The isolation structure may define a substrate isolation grid, made up of grid segments, such as individual rectangles, squares, or other shapes which abut one another.

At operation 206, a light transmission layer is formed over the isolation structure.

At operation 208, a buried grid structure is formed over the isolation structure. The buried grid structure may be formed in the light transmission layer formed over the substrate. The buried grid structure may define an isolation grid made up of buried grid segments, such as rectangles, squares, or other shapes which abut one another.

At operation 210, an upper grid structure is formed over the buried grid structure. The upper grid structure may be formed over the substrate and the light transmission layer containing the buried grid structure. The upper grid structure may define openings within which the color filters are arranged.

At operation 212, color filters are formed in the openings defined by the upper grid structure.

At operation 214, micro lenses are formed over the color filters.

With reference to FIGS. 3-11, 12A-12B, 13A-13D, 14A-14D, and 15A-15D, cross-sectional views of some embodiments of a device structure for image sensors at various stages of manufacture are provided to illustrate the method of FIG. 2. Although FIGS. 3-11, 12A-12B, 13A-13D, 14A-14D, and 15A-15D are described in relation to the method 200, it will be appreciated that the structures disclosed in FIGS. 3-11, 12A-12B, 13A-13D, 14A-14D, and 15A-15D are not limited to the method 200, but instead may stand alone as structures independent of the method 200. Similarly, although the methods are described in relation to FIGS. 3-11, 12A-12B, 13A-13D, 14A-14D, and 15A-15D, it will be appreciated that the method 200 is not limited to the structures disclosed in FIGS. 3-11, 12A-12B, 13A-13D, 14A-14D, and 15A-15D, but instead may stand alone independent of the structures disclosed in FIGS. 3-11, 12A-12B, 13A-13D, 14A-14D, and FIGS. 3-12B illustrate cross-sectional side views of various stages of manufacturing an optical structure including a buried grid structure that can be used with the image sensor device 100B of FIG. 1B in accordance with some embodiments.

Figure 3:
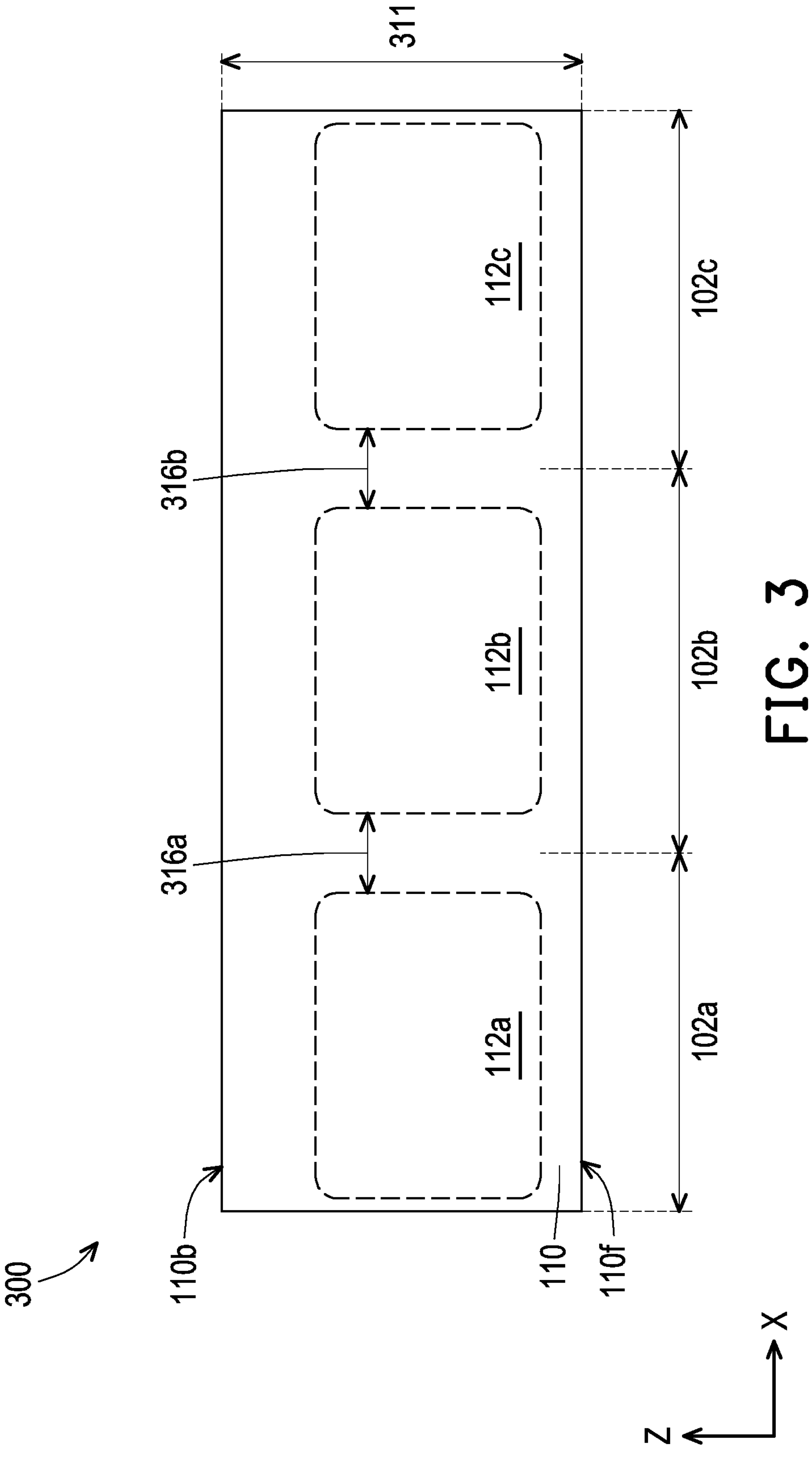
FIGS. 3-11, 12A-12B, 13A-13E, 14A-14C, and 15A-15D illustrate views of various stages of manufacturing an optical structure in accordance with some embodiments.

FIG. 3 illustrates a cross-sectional view 300 of an optical structure during intermediate stages of manufacturing operations corresponding to operation 202, in accordance with some embodiments. The device substrate 110 has the frontside 110*f* and the backside 110*b* opposite the frontside 110*f*. In some embodiments, as depicted in FIG. 3, the device substrate 110 has an initial thickness 311 that is in a range from about 1 micron (μm) to about 10 μm. In particular embodiments, the initial thickness 311 of the device substrate 110 is in a range from about 2.5 μm to about 7 μm.

The device substrate 110 includes, for example, image-sensing elements 112*a-c*, arranged to correspond to the light detection region 102*a-c*, respectively. The image-sensing elements 112*a-c* may be varied from one another to have different junction depths, thicknesses, widths, and so forth. For the sake of simplicity, only three image-sensing elements 112*a-c* are illustrated in FIG. 3, but it is understood that any number of pixels may be implemented in the device substrate 110. The image-sensing elements 112*a-c* may be formed by any suitable method. In some embodiments, the image-sensing elements 112*a-c* are formed by performing an implantation process on the device substrate 110 from the frontside 110*f*. The implantation process may include doping the device substrate 110 with a p-type dopant such as boron. In an alternative embodiment, the implantation process may include doping the device substrate 110 with an n-type dopant such as phosphorus or arsenic. In other embodiments, the image-sensing elements 112*a-c* may also be formed by a diffusion process.

The image-sensing elements 112*a-c* are separated from one another by a plurality of gaps in the device substrate 110. For example, a gap 316*a* separates the image-sensing elements 112*a* and 112*b*, a gap 316*b* separates the image-sensing elements 112*b* and 112*c*, and a gap (not illustrated) separates the image-sensing element 112*a* from an adjacent image-sensing element to its left (not illustrated) if present. Of course, it is understood that the gaps 316*a-b* are not voids or open spaces in the device substrate 110, but they may be regions of the device substrate 110 (either a semiconductor material or a dielectric isolation element) that are located between the adjacent image-sensing elements 112*a-c*.

Figure 4:
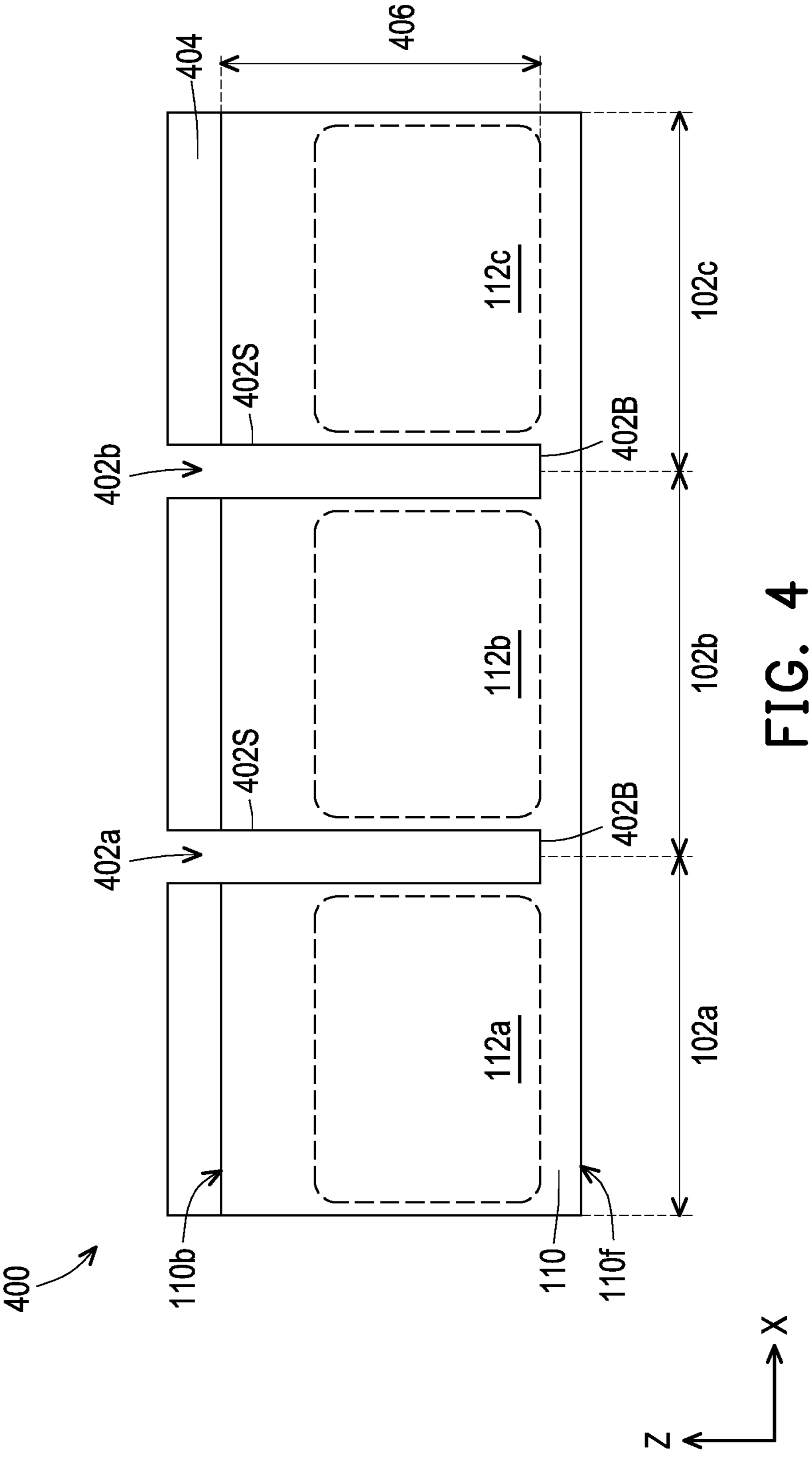

FIG. 4 illustrates a cross-sectional view 400 of an optical structure during intermediate stages of manufacturing operations corresponding to operation 204, in accordance with some embodiments. As shown in FIG. 4, a patterning process is performed to form trenches 402*a* and 402*b* (collectively 402) within the backside 110*b* of the device substrate 110 between adjacent image-sensing elements 112*a* and 112*b* and adjacent image-sensing elements 112*b* and 112*c*, respectively. The trench 402 includes sidewalls 402S defined by the device substrate 110 and a bottom surface 402B also defined by the device substrate 110 that extends between the sidewalls 402S. In some embodiments, one or more of the sidewalls 402S can be tapered. In some embodiments, the trench 402 may be formed by etching processes (wet etching or dry etching) or photolithography patterning followed by reactive ion etching (RIE). In some embodiments, the device substrate 110 may be patterned by forming a masking layer 404 on the backside 110*b* of the device substrate 110. The device substrate 110 is then exposed to an etchant in regions not covered by the masking layer 404. The etchant etches the device substrate 110 to form the trench 402. In some embodiments, the trench 402 extends from the backside 110*b* of the device substrate 110 to a first depth 406 within the device substrate 110. In some embodiments, the first depth 406 is in a range from about 0.5 μm to about 7 μm. In some embodiments, the trench 402 has a width in a range from about 0.1 μm to about 0.4 μm. After the patterning process, the masking layer 404 may be removed. In some embodiments, the trenches 402 are formed at locations laterally removed from the image-sensing elements 112*a-c*. In some embodiments, the trenches 402 laterally surround each of the image-sensing elements 112*a-c*.

Figure 5:
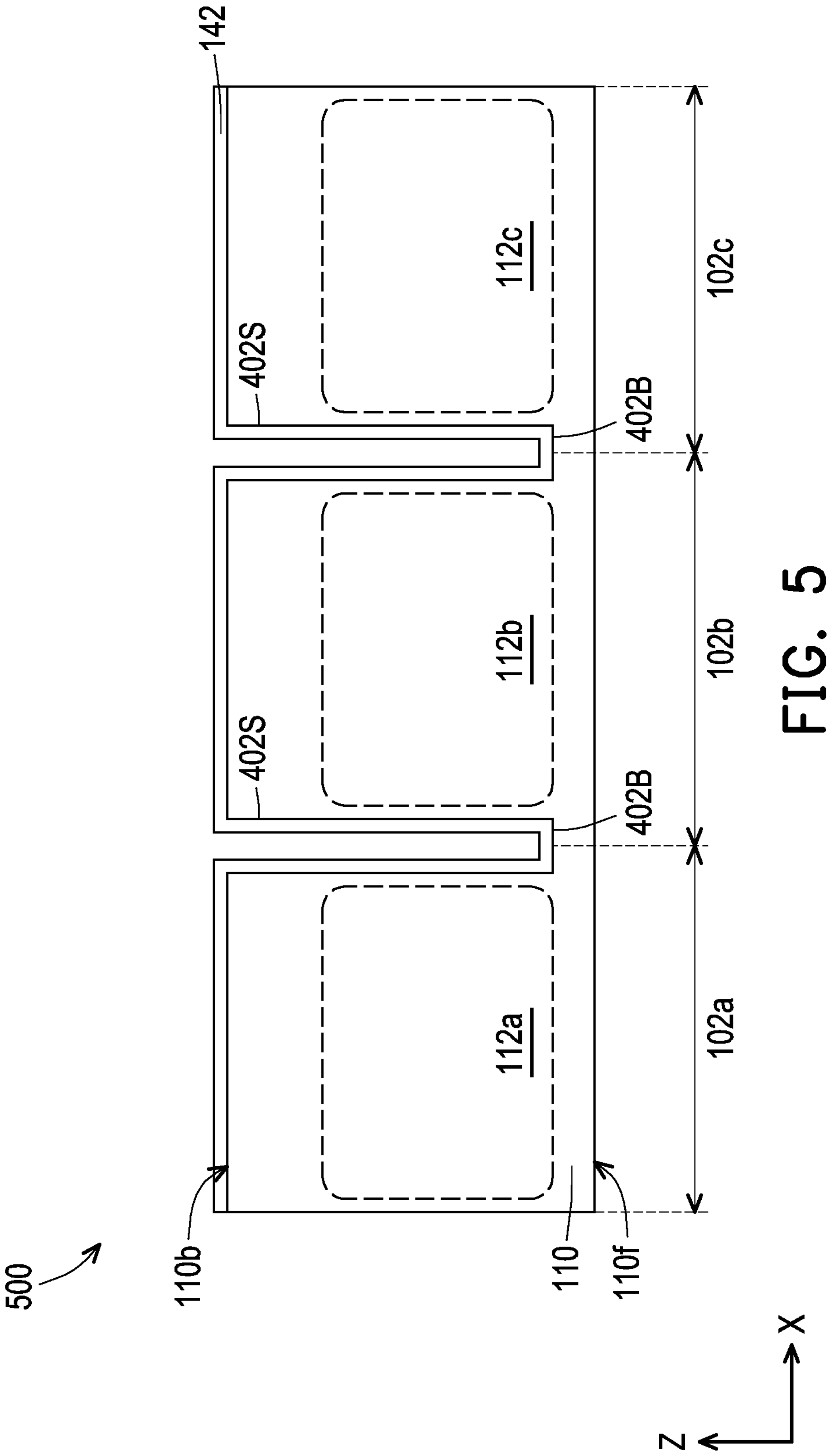

FIG. 5 illustrates a cross-sectional view 500 of an optical structure during intermediate stages of manufacturing operations also corresponding to operation 204, in accordance with some embodiments. As shown in FIG. 5, in some embodiments, a high-k dielectric liner 142 is deposited over the device substrate 110. The high-k dielectric liner 142 lines the sidewalls 402S and the bottom surfaces 402B of the trenches 402. The high-k dielectric liner 142 may function as a passivation layer and separate the device substrate 110 from the subsequently deposited isolation material 144 (See FIG. 6). In addition, the high-k dielectric liner 142 may help alleviate crosstalk between adjacent light detection regions 102. The high-k dielectric liner 142 may include aluminum oxide (AlO), tantalum oxide (TaO), hafnium oxide (HfO), hafnium silicon oxide (HfSiO), hafnium aluminum oxide (HfAlO), or hafnium tantalum oxide (HfTaO), for example. The high-k dielectric liner 142 may be deposited by vapor deposition, such as CVD or PVD, or grown by thermal oxidation. In some embodiments, the high-k dielectric liner 142 includes a plurality of layers. For example, the high-k dielectric liner 142 includes a first high-k dielectric layer and a second high-k dielectric layer arranged below the first high-k dielectric layer. In some embodiments, the high-k dielectric liner 142 may be deposited to a thickness in a range from about 10 Å to about 100 Å. The high-k dielectric liner 142 may be a conformal layer. In some embodiments, as shown in FIG. 5, the high-k dielectric liner 142 has top surfaces coplanar with a lateral surface of the backside 110*b* of the device substrate 110, the high-k dielectric liner 142 may extend upwardly from the trench 402 over the backside 110*b* of the device substrate 110 and laterally disposed along the backside 110*b* of the device substrate 110.

Figure 6:
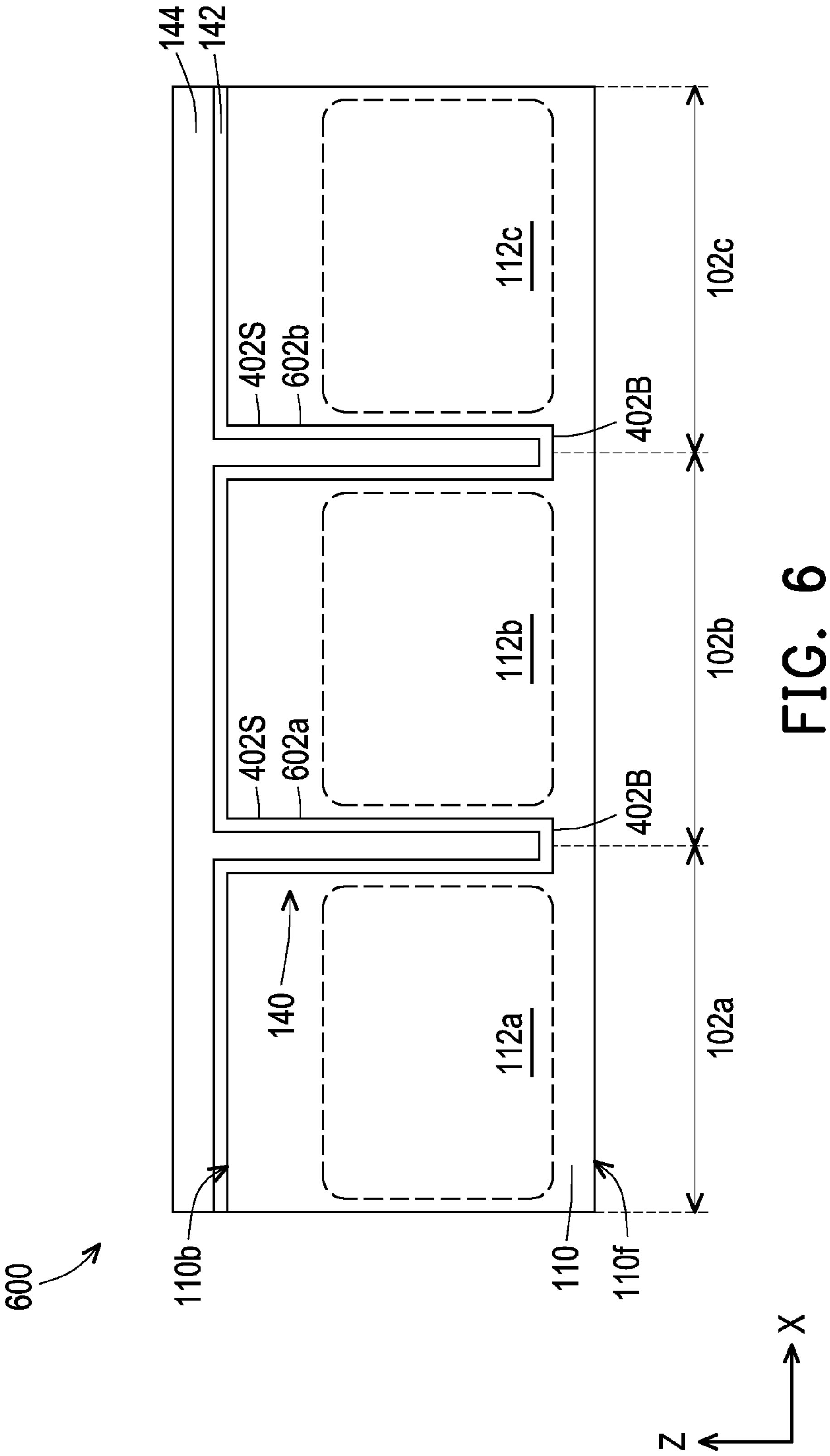

FIG. 6 illustrates a cross-sectional view 600 of an optical structure during intermediate stages of manufacturing operations also corresponding to operation 204, in accordance with some embodiments. Turning to FIG. 6, the trenches 402 are filled with isolation material 144 to form an isolation structure 140. The isolation structure 140 includes isolation structure segments 602*a*, 602*b* (collectively 602). In some embodiments, the isolation structure 140 may be a deep trench isolation (DTI) structure, such as a backside deep trench isolation (BDTI) structure. In some embodiments where the high-k dielectric liner 142 is present, the isolation structure 140 includes the high-k dielectric liner 142 and the isolation material 144. The isolation material 144 is deposited to fill the area of the trenches 402 not filled by the high-k dielectric liner 142 (if present). The isolation material 144 may be a dielectric material (such as an oxide material or a nitride material, for example, silicon oxide ($SiO_2$), hafnium oxide ($HfO_2$), or the like. Deposition of the isolation material 144 may involve a variety of techniques, such as chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), sub-atmospheric CVD (SACVD), PVD, atomic layer deposition (ALD), sputtering, and/or other suitable operations. The refractive index of the isolation material 144 may be less than the refractive index of silicon. The optical structure shown in FIG. 6 may be an intermediate structure, and the high-k dielectric liner 142 and the isolation material 144 may or may not be subject to a planarization process such that top surfaces of the layers could be altered as will be discussed in FIG. 7.

Figure 7:
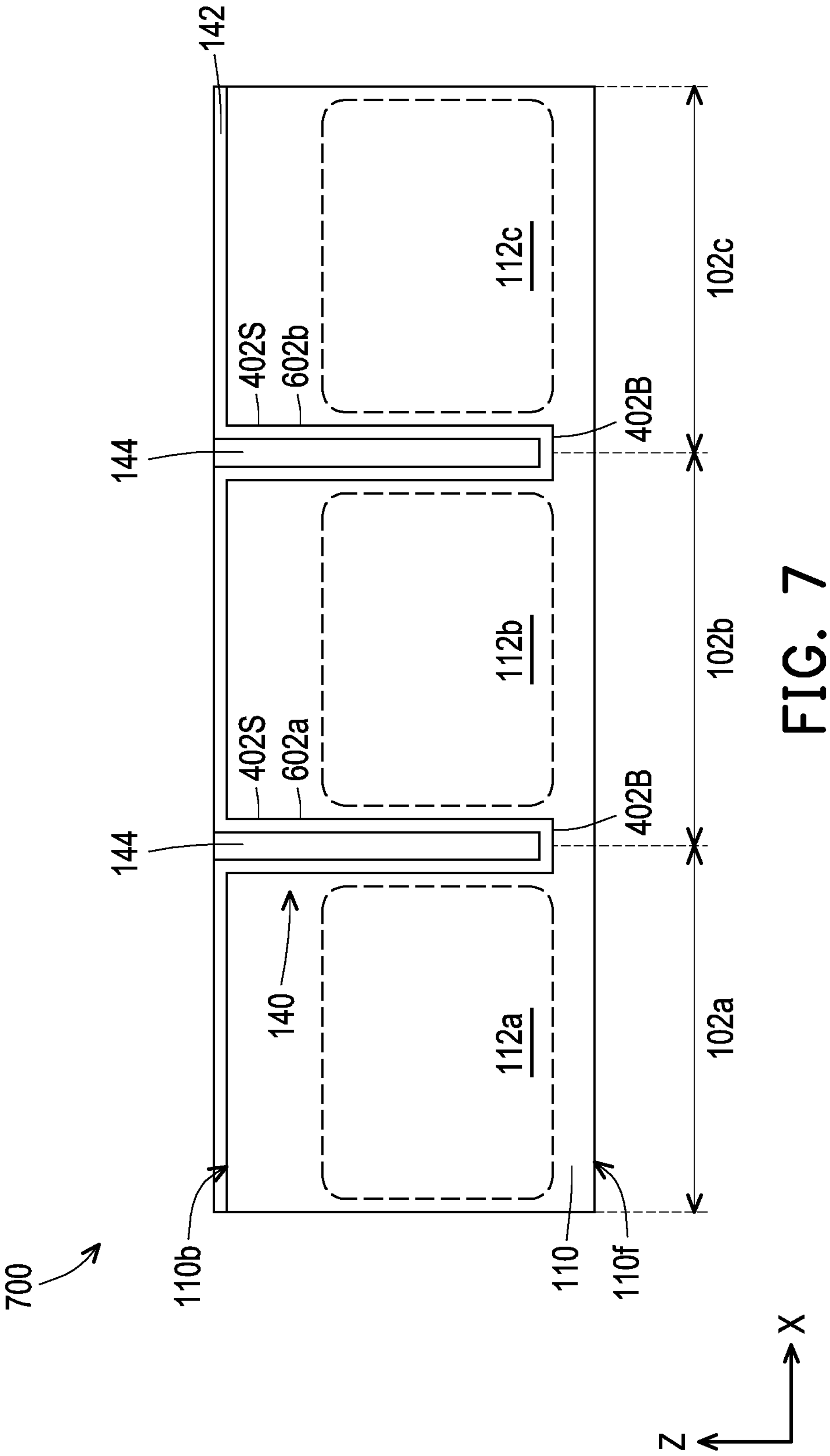

FIG. 7 illustrates a cross-sectional view 700 of an optical structure during intermediate stages of manufacturing operations also corresponding to operation 204, in accordance with some embodiments. Referring to FIG. 7, in some embodiments, isolation material 144 is subjected to a planarization process, for example, a CMP process, to form a planar surface. In some embodiments, as shown in FIG. 7, the isolation material 144 above the high-k dielectric liner 142 is removed such that a top surface of the isolation material 144 is co-planar or substantially co-planar with a top surface of the high-k dielectric liner 142 formed on the lateral surfaces of the backside 110*b* of the device substrate 110. In other embodiments, a portion of the isolation material 144 above the high-k dielectric liner 142 is removed to planarize a top surface of the isolation material 144 such that a top surface of the isolation material 144 remains above a top surface of the high-k dielectric liner 142 as shown in FIG. 6. In alternative embodiments, the isolation material 144 and the high-k dielectric liner 142 are removed such that a top surface of the isolation material 144 and a top surface of the high-k dielectric liner 142 are both co-planar or substantially co-planar with the backside 110*b* of the device substrate 110.

Figure 8:
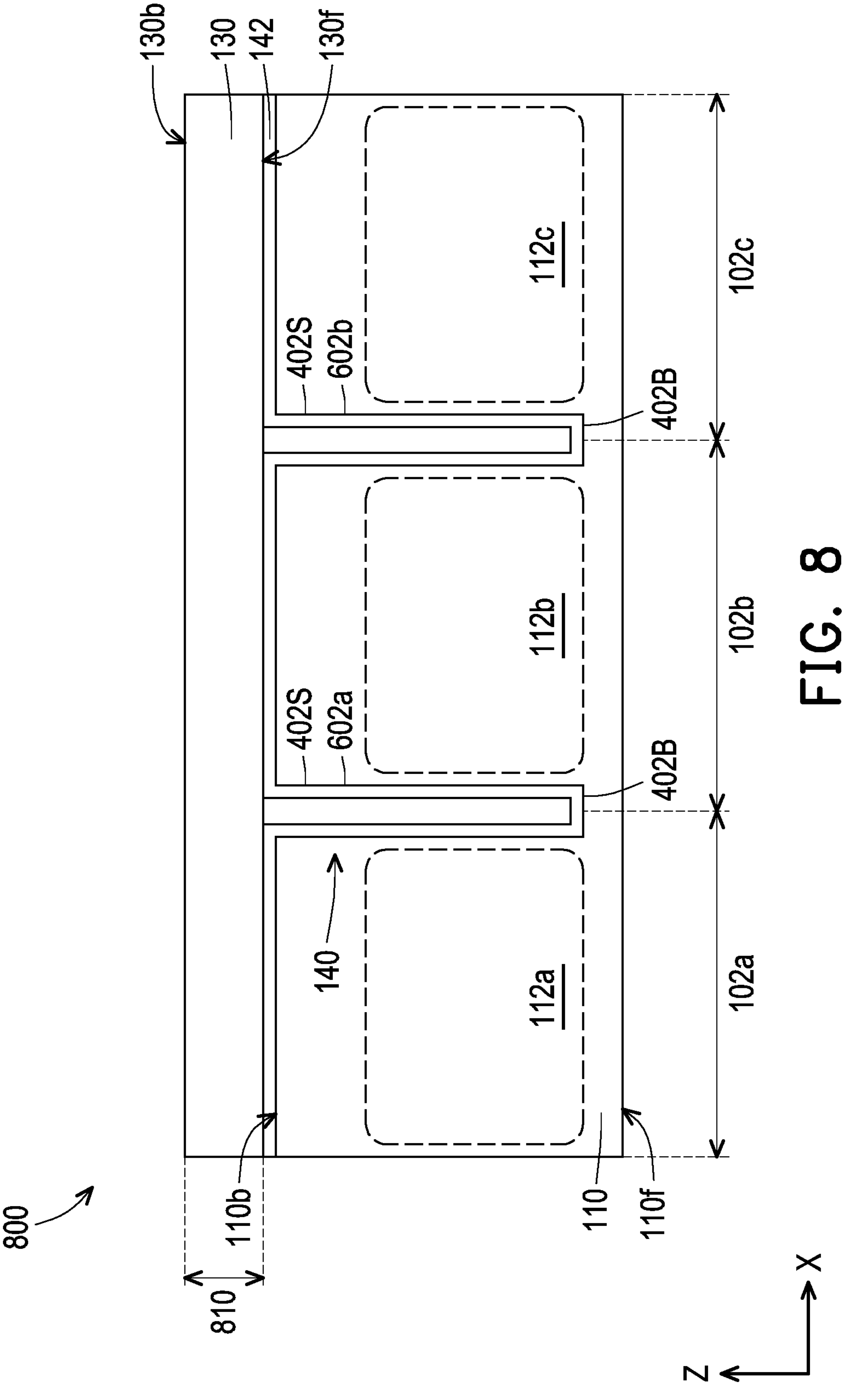

FIG. 8 illustrates a cross-sectional view 800 of an optical structure during intermediate stages of manufacturing operations also corresponding to operation 206, in accordance with some embodiments. Subsequently, as shown in FIG. 8, the light transmission layer 130 is formed over the device substrate 110 and the isolation structure 140. The light transmission layer 130 has a backside 130*b* opposite to the device substrate 110 and a frontside 130*f* facing the backside 110*b* of the device substrate 110. The light transmission layer 130 may include a dielectric, for example, an oxide (such as silicon oxide, hafnium oxide, spin-on glass, fluoride-doped silicate glass, undoped silica glass, or the like), an ARC, a multilayer structure of oxide dielectric and/or ARC, or the like. A material of the light transmission layer 130 may or may not be the same as the isolation material 144 of the isolation structure 140. The light transmission layer 130 may be formed by a variety of techniques, such as chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), sub-atmospheric CVD (SACVD), coating, spin-on, sputtering, and/or other suitable processes. In some embodiments, the light transmission layer 130 has an initial thickness 810 extending from the backside 130*b* to the frontside 130*f* in a range from about 500 Å to about 2000 Å.

In some embodiments where the material of the light transmission layer 130 is the same as the isolation material 144 of the isolation structure 140, both the light transmission layer 130 and the isolation structure 140 may be formed by the same deposition process. For example, with reference to FIG. 6, the isolation material 144 formed above the high-k dielectric liner 142 formed on the lateral surfaces of the backside 110*b* may function as the light transmission layer 130.

Figure 9:
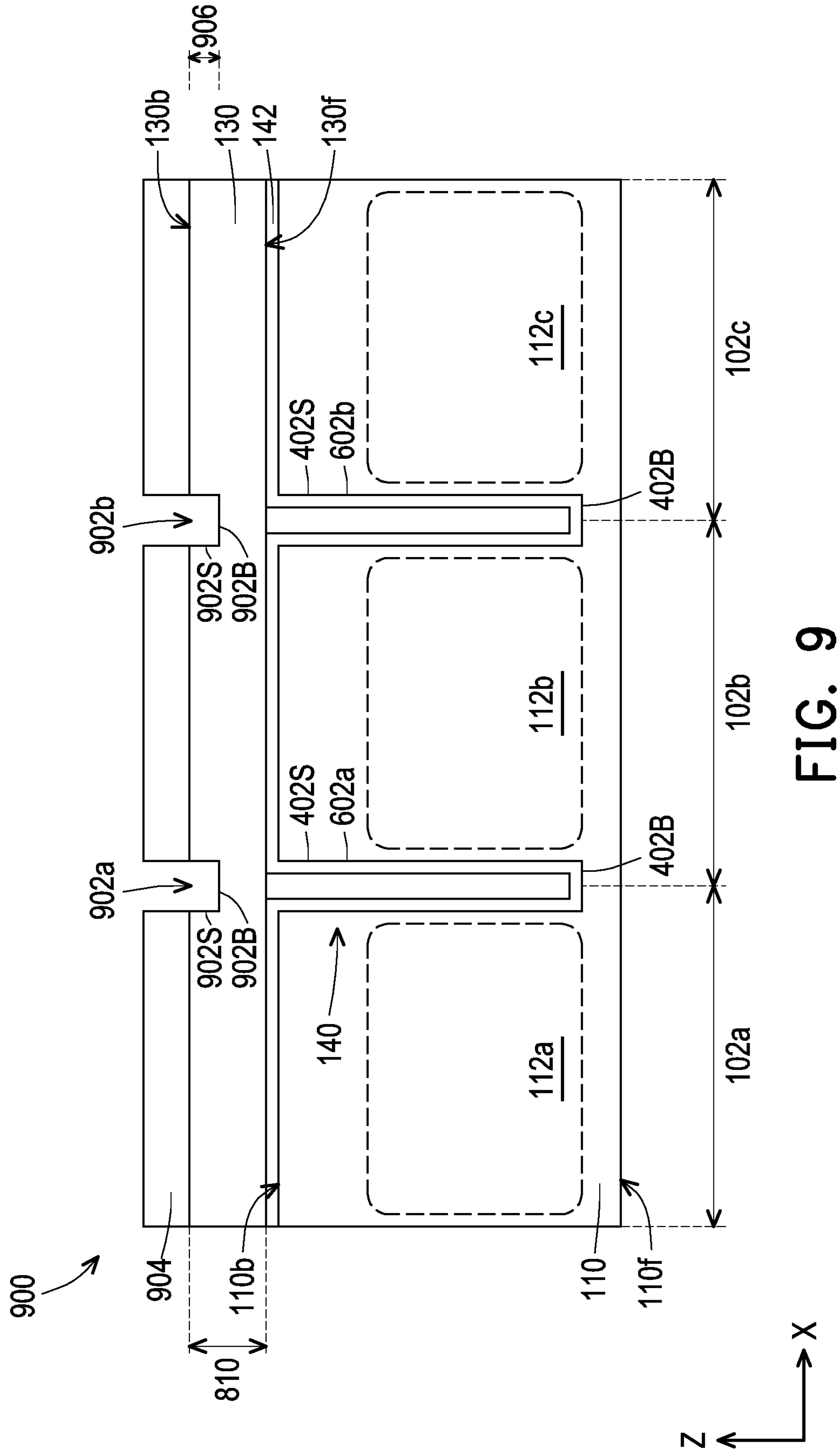

FIG. 9 illustrates a cross-sectional view 900 of an optical structure during intermediate stages of manufacturing operations also corresponding to operation 208, in accordance with some embodiments. As shown in FIG. 9, a patterning process is performed to form buried grid (BG) trenches 902*a*, 902*b* (collectively 902) within the backside 130*b* of the light transmission layer 130. The BG trench 902 includes sidewalls 902S defined by the light transmission layer 130 and a bottom surface 902B also defined by the light transmission layer 130 that extends between the sidewalls 902S. In some embodiments, one or more of the sidewalls 902S can be tapered. In some embodiments, the BG trench 902 is formed at locations laterally removed from the image-sensing elements 112*a-c*. In some embodiments, the BG trench 902 laterally surrounds each of the image-sensing elements 112*a-c*. In some embodiments, the BG trench 902 may be formed by etching processes (wet etching or dry etching) or photolithography patterning followed by reactive ion etching (RIE). In some embodiments, the light transmission layer 130 may be etched by forming a masking layer 904 on the backside 130*b* of the light transmission layer 130. The light transmission layer 130 is then exposed to an etchant in regions not covered by the masking layer 904. The etchant etches the light transmission layer 130 to form the BG trench 902. The BG trench 902 extends from the backside 130*b* of the light transmission layer 130 to a second depth 906 within the device substrate 110. In some embodiments, the second depth 906 is in a range from about 200 Å to about 1000 Å. In some embodiments, the BG trench 902 has a width in a range from about μm to about 0.2 μm. After the patterning process, the masking layer 904 may be removed.

Figure 10:
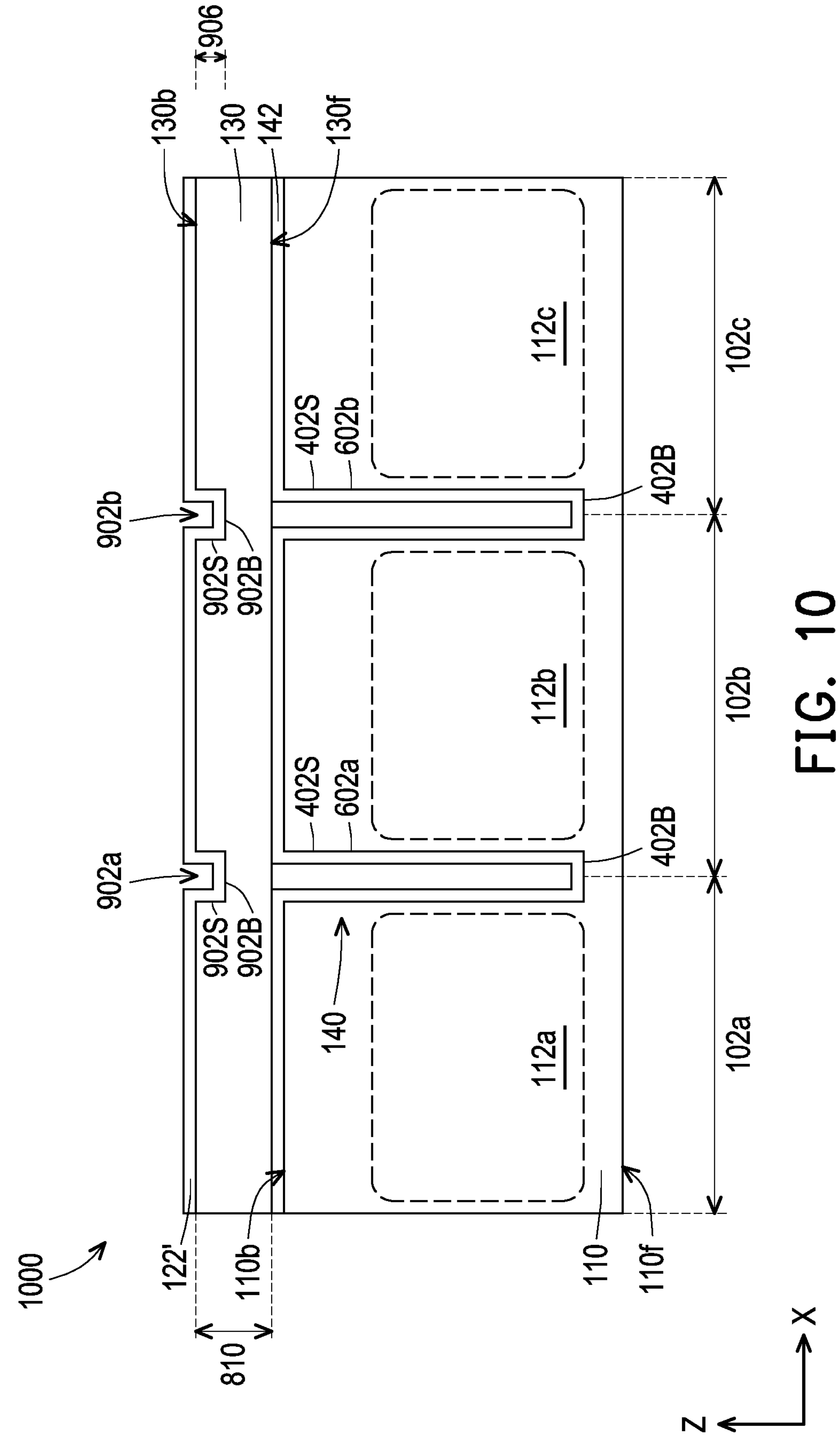

FIG. 10 illustrates a cross-sectional view 1000 of an optical structure during intermediate stages of manufacturing operations also corresponding to operation 208, in accordance with some embodiments. As shown in FIG. 10, in some embodiments, a metal nitride layer 122' is deposited over the device substrate 110. The metal nitride layer 122' lines the backside 130*b* of the light transmission layer 130, the sidewalls 902S and the bottom surfaces 902B of the BG trenches 902. The metal nitride layer 122' may function as a barrier layer and separate the light transmission layer 130 from the subsequently deposited metallic layer 124' (See FIG. 11). In addition, the metal nitride layer 122' may help alleviate crosstalk between adjacent image-sensing elements 112*a-c*. The metal nitride layer 122' may comprise titanium nitride (TiN), or tantalum nitride, for example. The metal nitride layer 122' may be deposited by vapor deposition, such as CVD, atomic layer deposition (ALD), or PVD. In some embodiments, the metal nitride layer 122' may be deposited to a thickness in a range from about 10 Å to about 100 Å. The metal nitride layer 122' may be a conformal layer. In some embodiments, as shown in FIG. 10, the metal nitride layer 122' may extend upwardly from the BG trench 902 over the backside 130*b* of the light transmission layer 130 and laterally disposed along the backside 130*b* of the light transmission layer 130.

Figure 11:
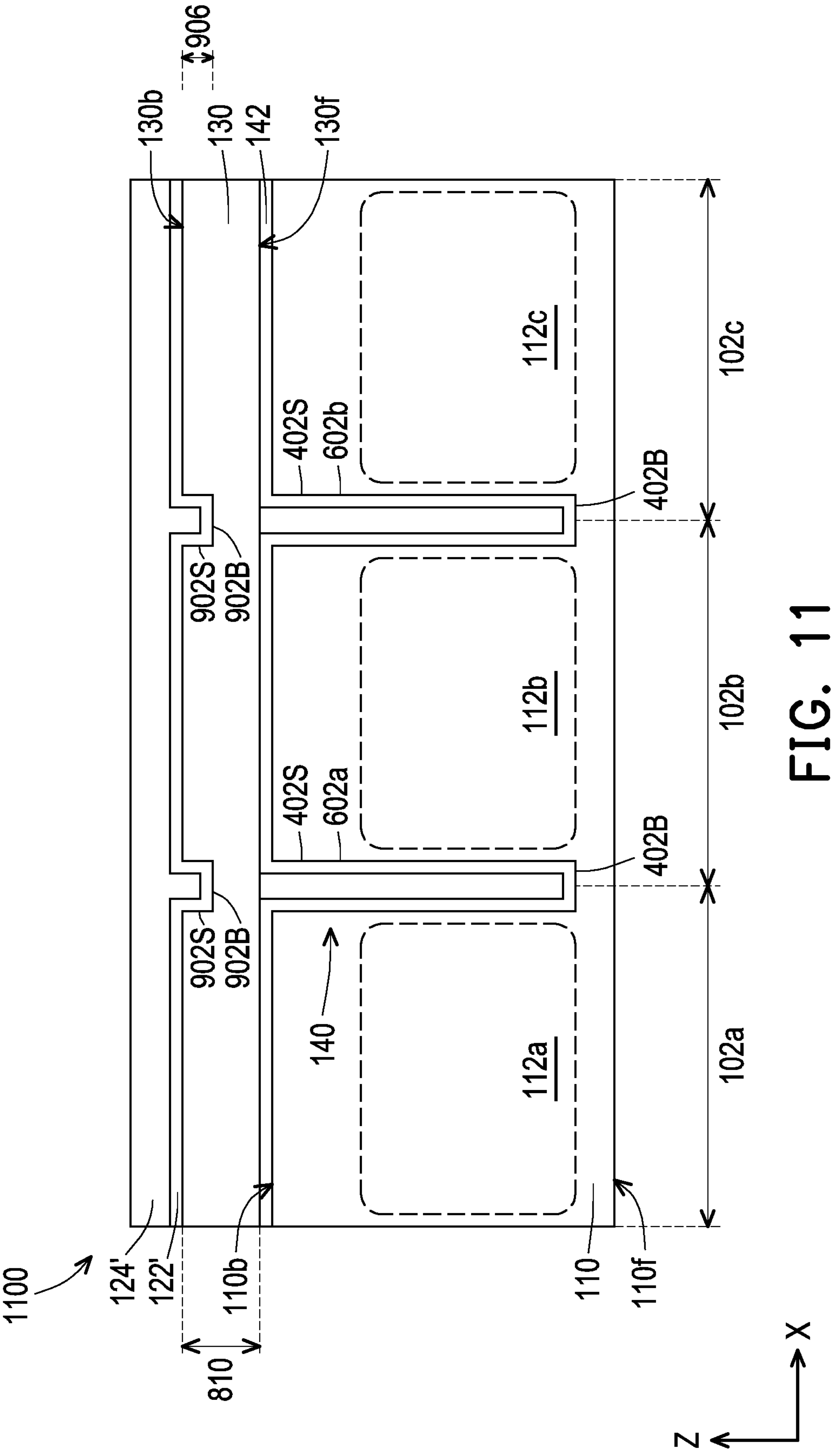

FIG. 11 illustrates a cross-sectional view 1100 of an optical structure during intermediate stages of manufacturing operations also corresponding to operation 208, in accordance with some embodiments. Turning to FIG. 11, the BG trenches 902 are filled with metallic layer 124'. The metallic layer 124' is deposited to fill the area of the BG trenches 902 not filled by the metal nitride layer 122' (if present). If metal nitride layer 122' is not present, the metallic layer 124' may be deposited directly on the backside 130*b* of the light transmission layer 130. In some embodiments, the metallic layer 124' may be selected from tungsten, aluminum, copper, or aluminum copper, for example. Deposition of the metallic material may involve a variety of techniques, such as CVD, PECVD, APCVD, LPCVD, HDPCVD, ALCVD, SACVD, PVD, ALD, sputtering, plating processes (e.g., electroplating, electroless plating, etc.), and/or other suitable operations. The cross-sectional view 1100 shown in FIG. 11 may be an intermediate structure, and the metal nitride layer 122' and the metallic layer 124' may or may not subject to a planarization process such that top surfaces of the layers could be altered as will be discussed in relation to FIG. 12A.

Figure 12A:
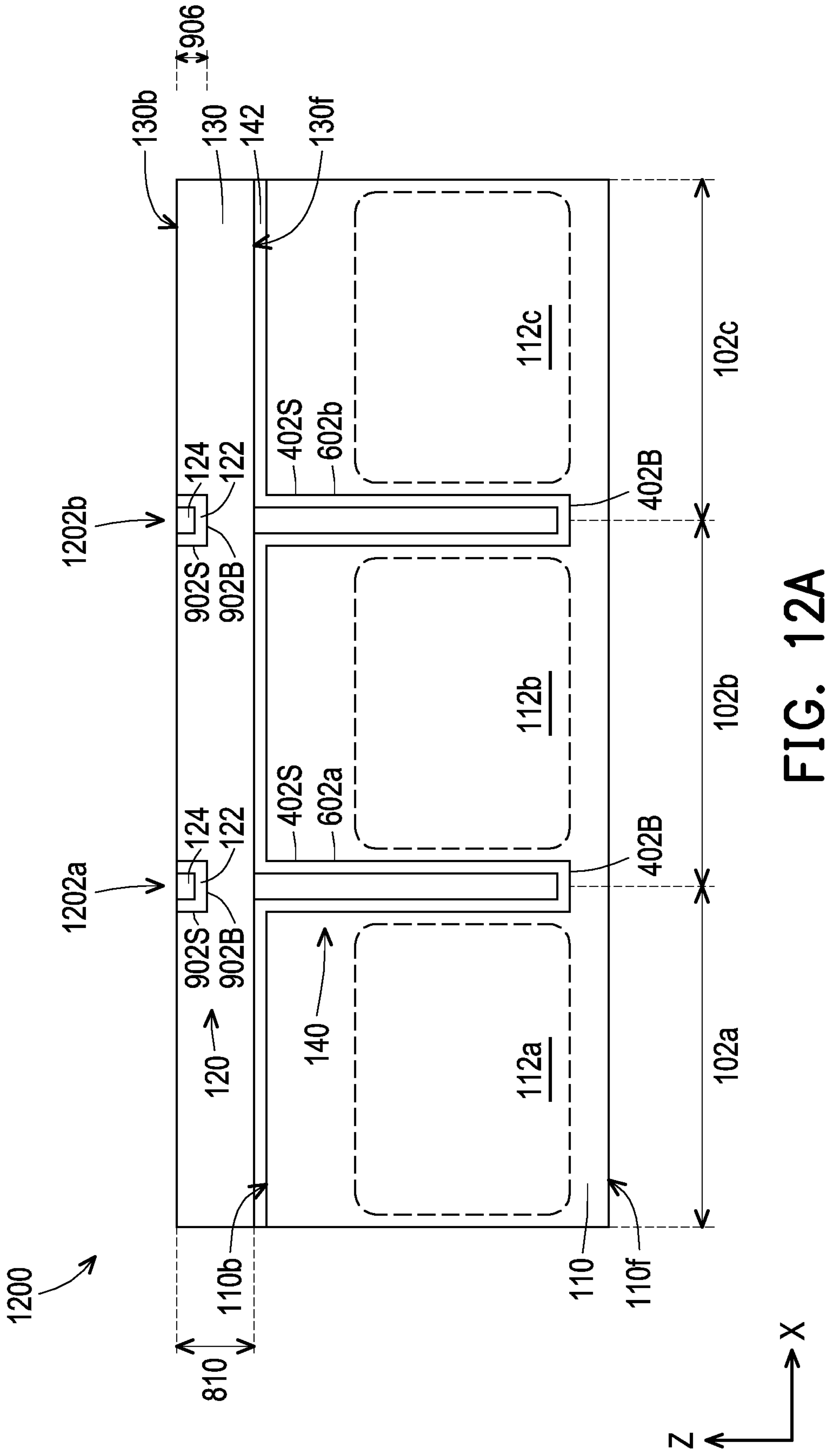

FIG. 12A illustrates a cross-sectional view 1200 of an optical structure during intermediate stages of manufacturing operations also corresponding to operation 208, in accordance with some embodiments. Referring to FIG. 12A in some embodiments, the metallic layer 124' and the metal nitride layer 122' are subjected to a planarization process, for example, a CMP process, to form a planar surface and the buried grid structure 120. The buried grid structure 120 includes buried grid structure segments 1202*a*, 1202*b*. In some embodiments, as shown in FIG. 12A, portions of the metallic layer 124' and the metal nitride layer 122' above the backside 130*b* of the light transmission layer 130 are removed to form a metal nitride grid section 122 and a metallic grid section 124 such that a top surface of the metal nitride grid section 122 and a top surface of the metallic grid section 124 are co-planar or substantially co-planar with a top surface or the lateral surfaces of the backside 130*b* of the light transmission layer 130.

Figure 12B:
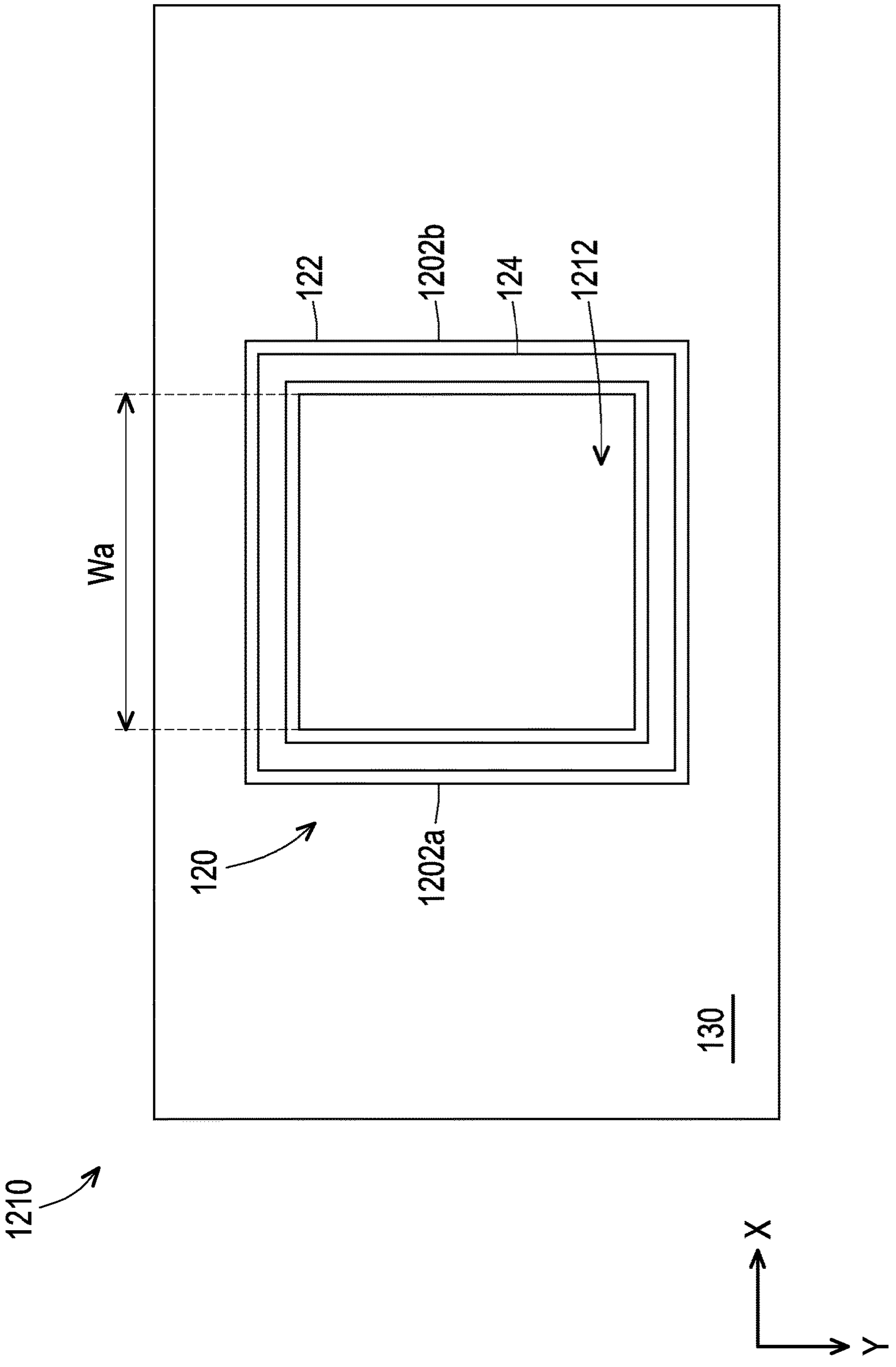

FIG. 12B illustrates a top view 1210 of the cross-sectional view 1200 shown in FIG. 12A taken along the backside 130*b* of the light transmission layer 130. The light transmission layer 130 includes the buried grid structure 120. In some embodiments, as shown in FIG. 12B, the buried grid structure 120 has a tetragon shape. In alternate embodiments, the buried grid structure 120 defines other shapes such as circular, for example. In some embodiments, the buried grid structure 120 is vertically aligned with the isolation structure 140 and a width "Wa" of the buried grid structure 120 may be identical to or substantially identical to a width of the image-sensing element 112*a-c*. Although shown as a continuous tetragon shape in FIG. 12A, the buried grid structure 120 may be of non-continuous patterns according to various designs. The buried grid structure 120 defines a gap 1212. Of course, it is understood that the gap 1212 is not a void or open space in the light transmission layer 130, but they may be regions of the light transmission layer 130 that are located between the buried grid structure 120. In some embodiments, the buried grid structure 120 is vertically aligned with the isolation structure 140 and a width "Wa" of the gap 1212 may be identical to or substantially identical to a width of the image-sensing element 112*a-c*. In other embodiments, the buried grid structure 120 is laterally shifted or offset (e.g., along the x-axis) relative to the isolation structure 140 as is shown, for example, in FIG. 15B.

Figure 13A:
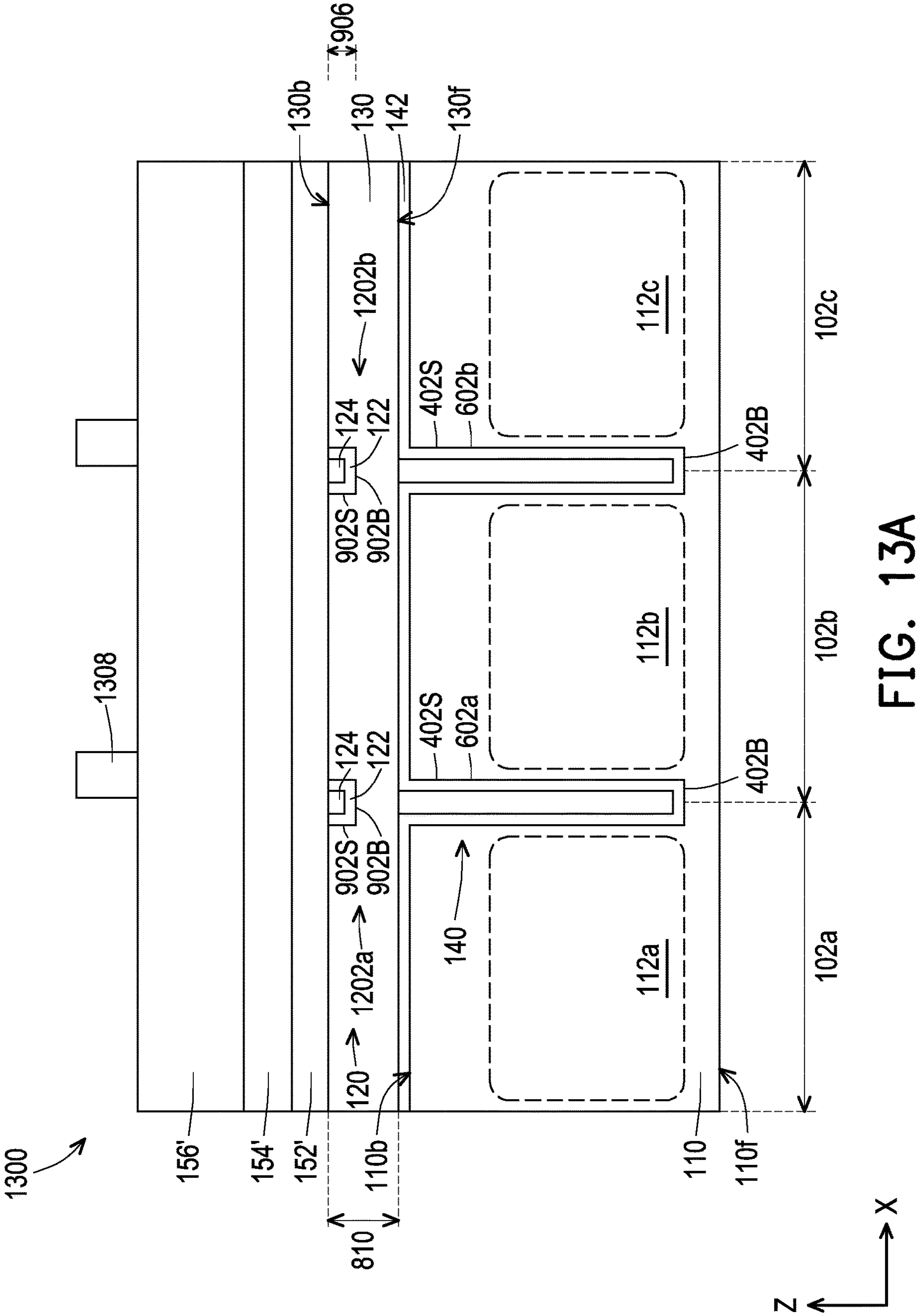
Figure 13B:
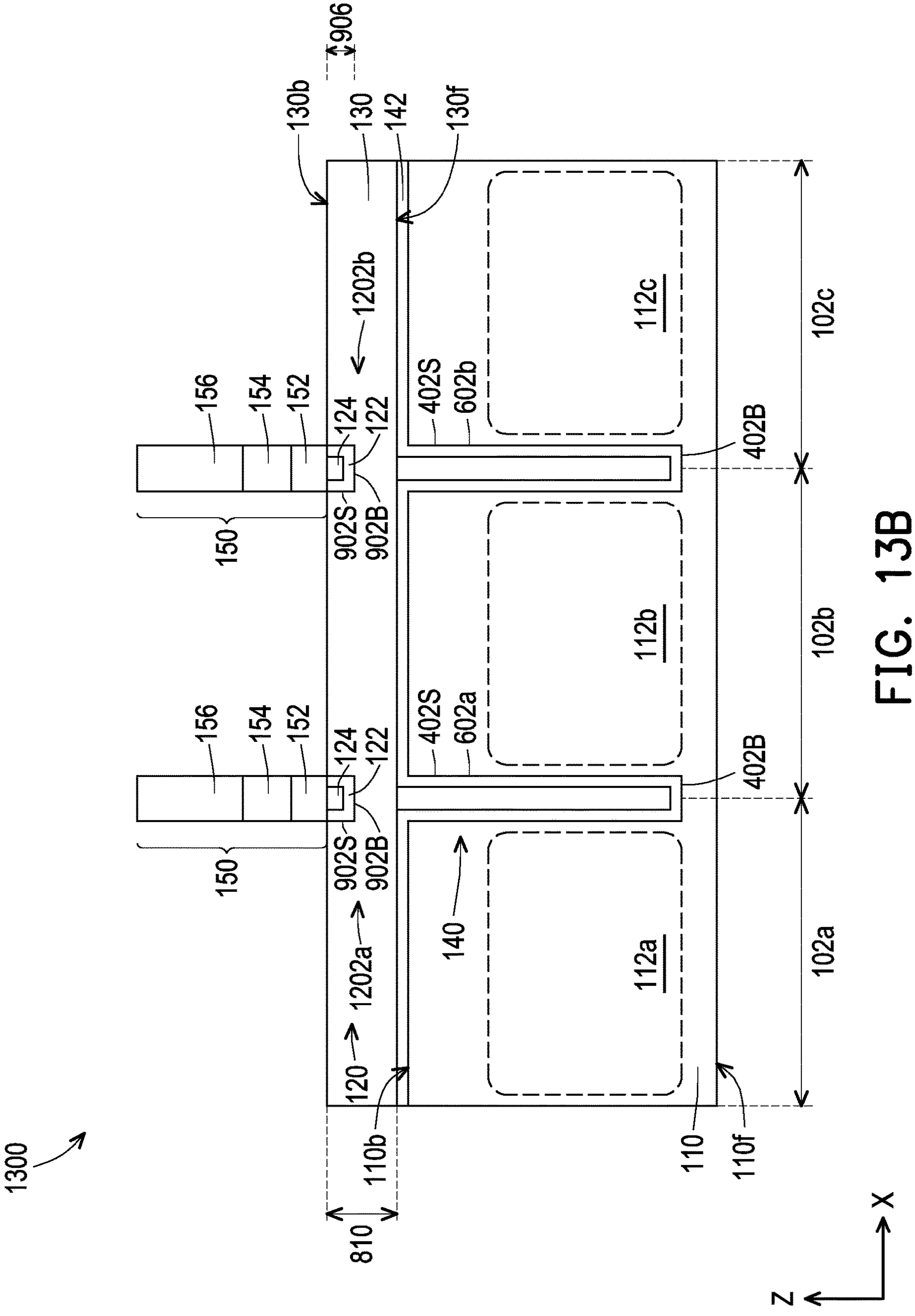

FIGS. 13A-13E illustrate a cross-sectional view 1300 of an optical structure during intermediate stages of manufacturing operations, in accordance with some embodiments. In some embodiments, an upper grid structure 150 is formed over the backside 130*b* of the light transmission layer 130. In some embodiments, the upper grid structure 150 is a composite grid structure. The upper grid structure 150 may include a metal section, a metal nitride section, a dielectric section, a low-n material section, and/or an organic section. In some embodiments, the upper grid structure 150 may have a tetragon shape or circular shape from a top view. In some embodiments, the upper grid structure 150 is vertically aligned with the buried grid structure 120. In some embodiments, the upper grid structure 150 is vertically aligned with the isolation structure 140 and a width or diameter of the upper grid structure may be identical or substantially identical to a width or a diameter of the image-sensing element 112*a-c*. In some embodiments, the upper grid structure 150 is vertically aligned with both the buried grid structure 120 and the isolation structure 140 as is shown in FIGS. 13B-

13E. In other embodiments, the upper grid structure 150 is laterally shifted or offset (e.g., along the x-axis) relative to at least one of the buried grid structure 120 and the isolation structure 140 as is shown, for example, in FIG. 15B.

FIG. 13A is a cross-sectional view 1300 of an optical structure during intermediate stages of manufacturing operations corresponding to operation 210, in accordance with some embodiments. FIG. 13A depicts the formation of one example of the upper grid structure 150 in which the upper grid structure 150 is a composite structure. Optionally, a metal nitride layer 152' may be formed above the light transmission layer 130 when a composite grid is to be formed. The metal nitride layer 152' may include metal nitrides, such as titanium nitride, tantalum nitride, or the like.

A metallic layer 154' may be formed over the light transmission layer 130, or over the metal nitride layer 152' if the metal nitride layer was previously formed over the light transmission layer 130. The metallic layer 154' may include metal, such as copper, tungsten, aluminum, aluminum copper, or the like.

A dielectric layer 156' may be formed over the light transmission layer 130, or over the metallic layer 154', if the metallic layer was previously formed over the light transmission layer 130. The dielectric layer 156' may include oxide, such as silicon oxide ($SiO_2$), hafnium oxide ($HfO_2$), or the like. In some other embodiments, the dielectric layer 156' may include organic material. The dielectric layer 156' may be formed by a variety of techniques, such as CVD, PVD, atomic layer deposition (ALD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), sub-atmospheric CVD (SACVD), and/or other suitable operations.

Referring to FIG. 13A and FIG. 13B, subsequently, a photolithography operation is performed, wherein the metal nitride layer 152', the metallic layer 154', and the dielectric layer 156' are patterned by a masking layer 1308 to form the upper grid structure 150. Specifically, the metal nitride layer 152', the metallic layer 154', and the dielectric layer 156' are patterned into a metal nitride grid section 152, a metallic grid section 154, and a dielectric grid section 156, respectively. It should be noted that the metal nitride grid section 152, the metallic grid section 154, and the dielectric grid section 156 may have a circular shape or a tetragon shape from a top view perspective. In some embodiments, as shown in FIG. 13B, the metal nitride grid section 152, the metallic grid section 154, and the dielectric grid section 156 (which would become a portion of the upper grid structure 150 subsequently) are vertically aligned with the isolation structure 140 and the buried grid structure 120 to improve the alignment between an arrangement of each of the image-sensing elements 112 and an arrangement of the corresponding upper grid structure 150. The masking layer 1308 is subsequently removed.

Figure 13C:
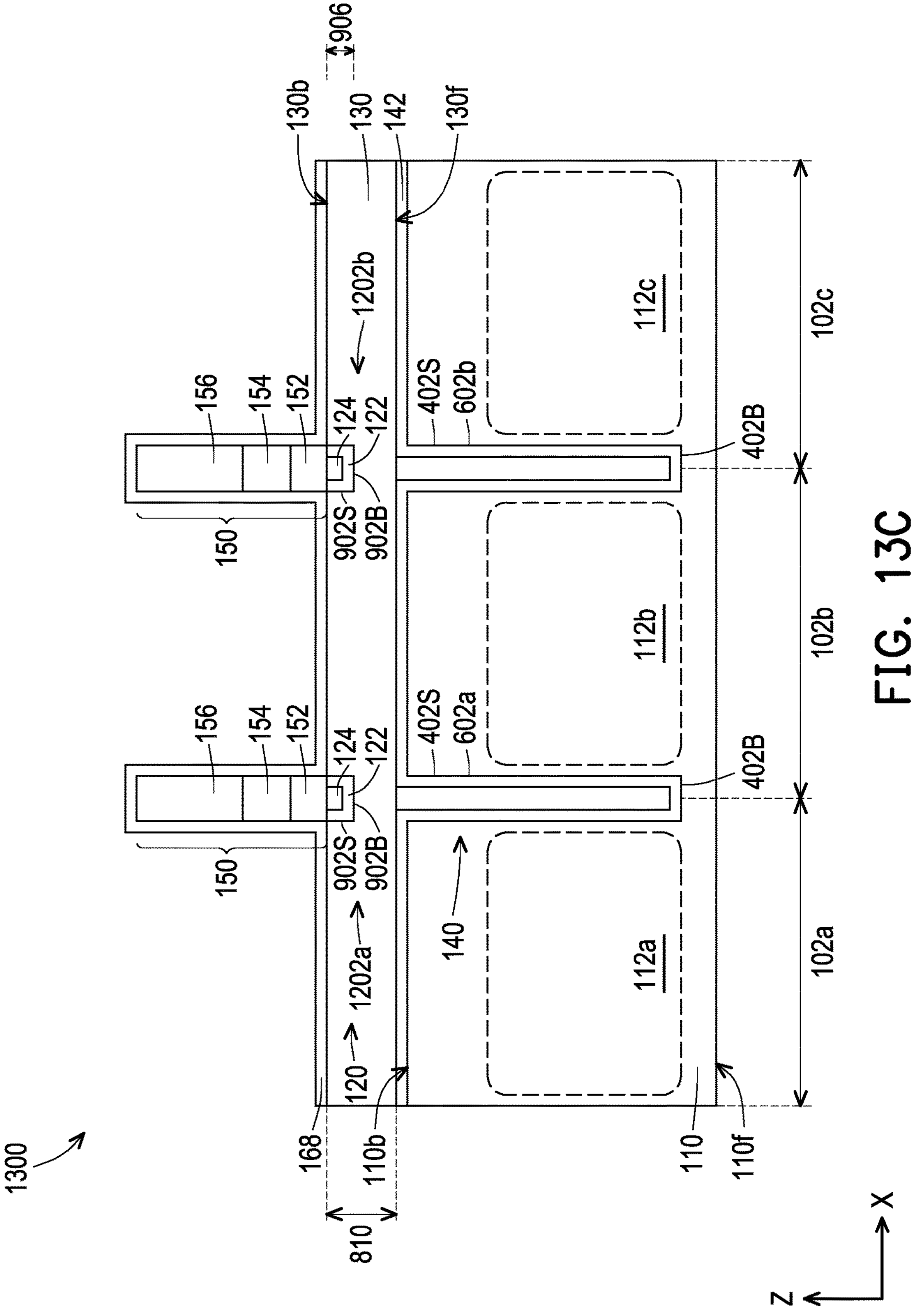

FIG. 13C is a cross-sectional view 1300 of an optical structure during intermediate stages of manufacturing operations also corresponding to operation 210, in accordance with some embodiments. Referring to FIG. 13C, in some embodiments, the dielectric capping layer 168 is formed over the exposed surfaces of the light transmission layer 130 and the upper grid structure 150. Thereby the upper grid structure 150 is inside the dielectric capping layer 168 and surrounded by the dielectric capping layer 168. In some embodiments, the dielectric capping layer 168 may be a conformal layer.

Figure 13D:
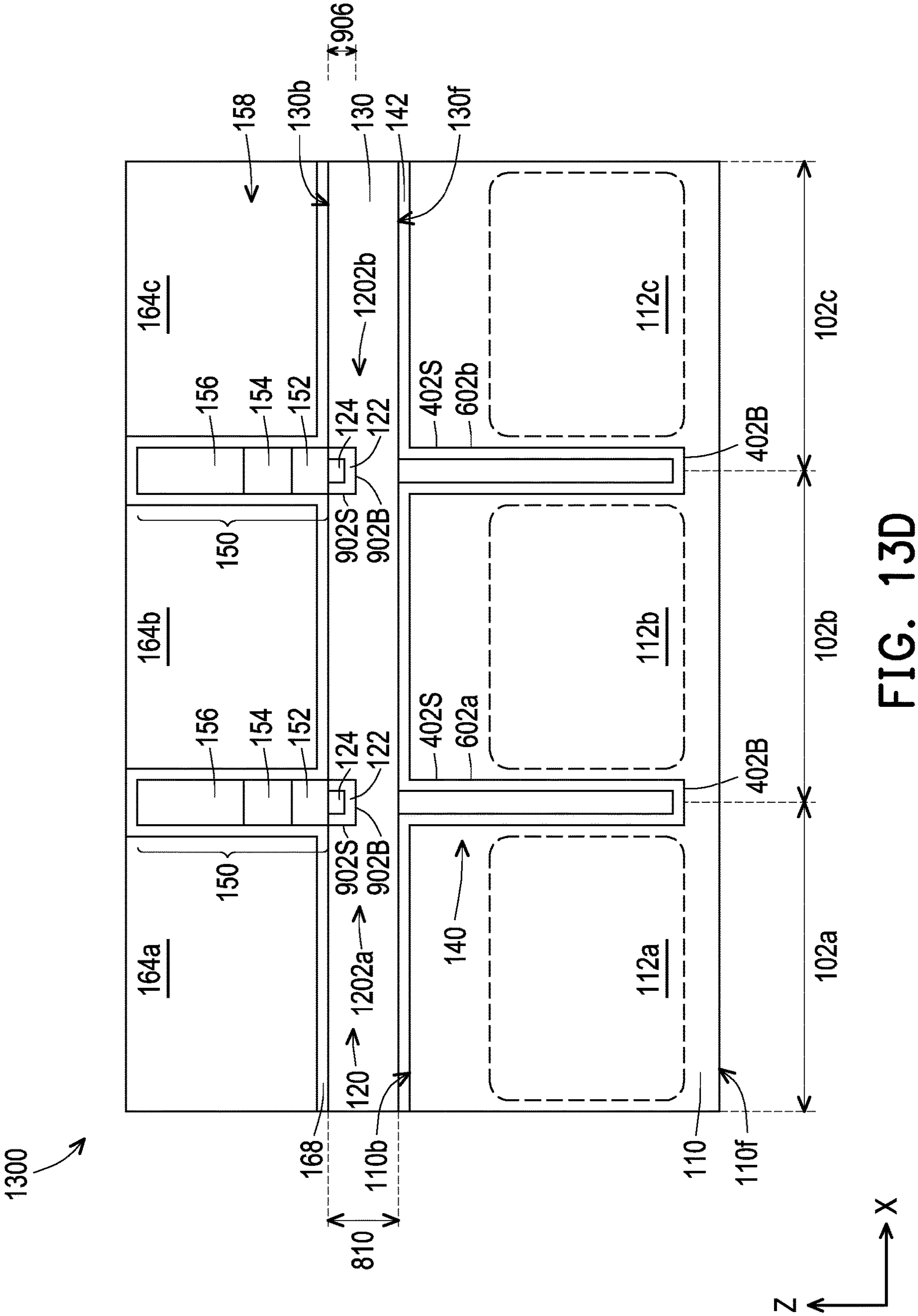

FIG. 13D is a cross-sectional view 1300 of an optical structure during intermediate stages of manufacturing operations corresponding to operation 212, in accordance with some embodiments. Referring to FIG. 13D, color filters 164*a-c* are formed over the light transmission layer 130. In some embodiments where the upper grid structure 150 is present, the upper grid structure 150 is in the color filters 164*a-c*. The color filters 164*a-c* may be formed to fill openings defined by the upper grid structure 150. In some embodiments where the upper grid structure 150 is not present, the color filters 164*a-c* may be formed over or on the light transmission layer 130. In some embodiments, the color filters 164*a-c* may include an organic dielectric, such as a polymer. In some embodiments, a refractive index of the color filters 164*a-c* is greater than a refractive index of the upper grid structure 150 (at least the dielectric grid section 156 and the metallic grid section 154 if it is previously formed) and the buried grid structure 120. In some embodiments, a thickness of the color filters 164*a-c* is identical or substantially identical with a height of the upper grid structure 150. Alternatively in some other embodiments, a thickness of the color filters 164*a-c* is greater than a height of the upper grid structure 150.

Figure 13E:
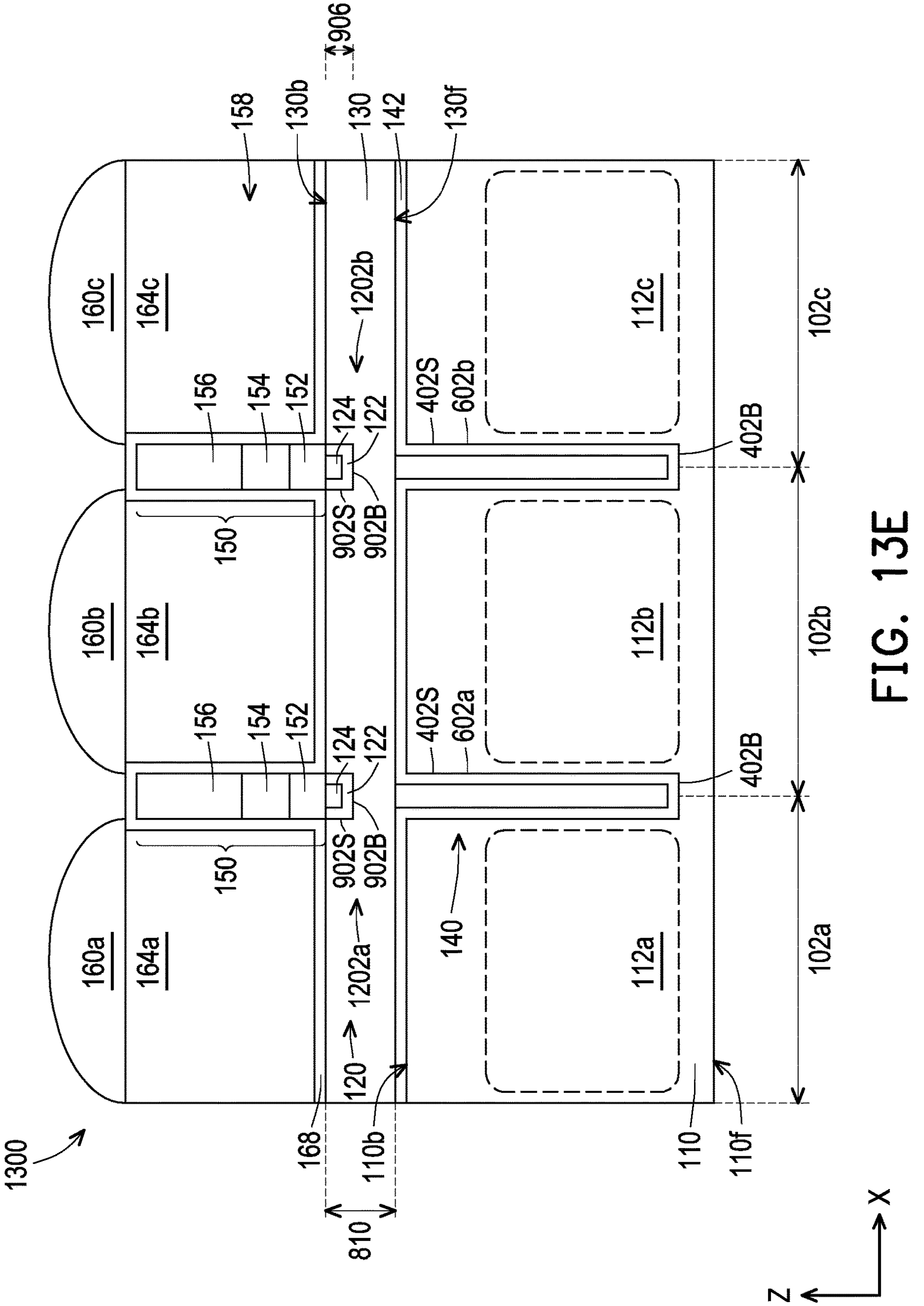

FIG. 13E is a cross-sectional view 1300 of an optical structure during intermediate stages of manufacturing operations corresponding to operation 214, in accordance with some embodiments. Referring to FIG. 13E, micro lenses 160*a-c* corresponding to the image-sensing elements 112*a-c* are formed above the color filters 164*a-c*. In some embodiments, the micro lenses 160*a-c* are vertically aligned with the image-sensing elements 112*a-c*. In some embodiments, the micro lenses 160*a-c* may be a condensing lens, which may have a semi-ellipsoid, a hemisphere shape, or other suitable shape. A size of the micro lenses 160*a-c* may be comparable to the size of the upper grid structure 150 from a top view perspective. In some embodiments, the micro lenses 160*a-c* may be laterally shifted or offset (e.g., along the x-axis) in at least one direction from the image-sensing elements 112*a-c*. It should be noted that the optical structure depicted in FIGS. 13A-13E may be tunable for various light conditions by modifying the isolation structure 140 by, for example, removing one or more of the isolation structure sections 602*a-b* and/or modifying the upper grid structure 150, by removing one or more portions of the upper grid structure 150.

Figure 14A:
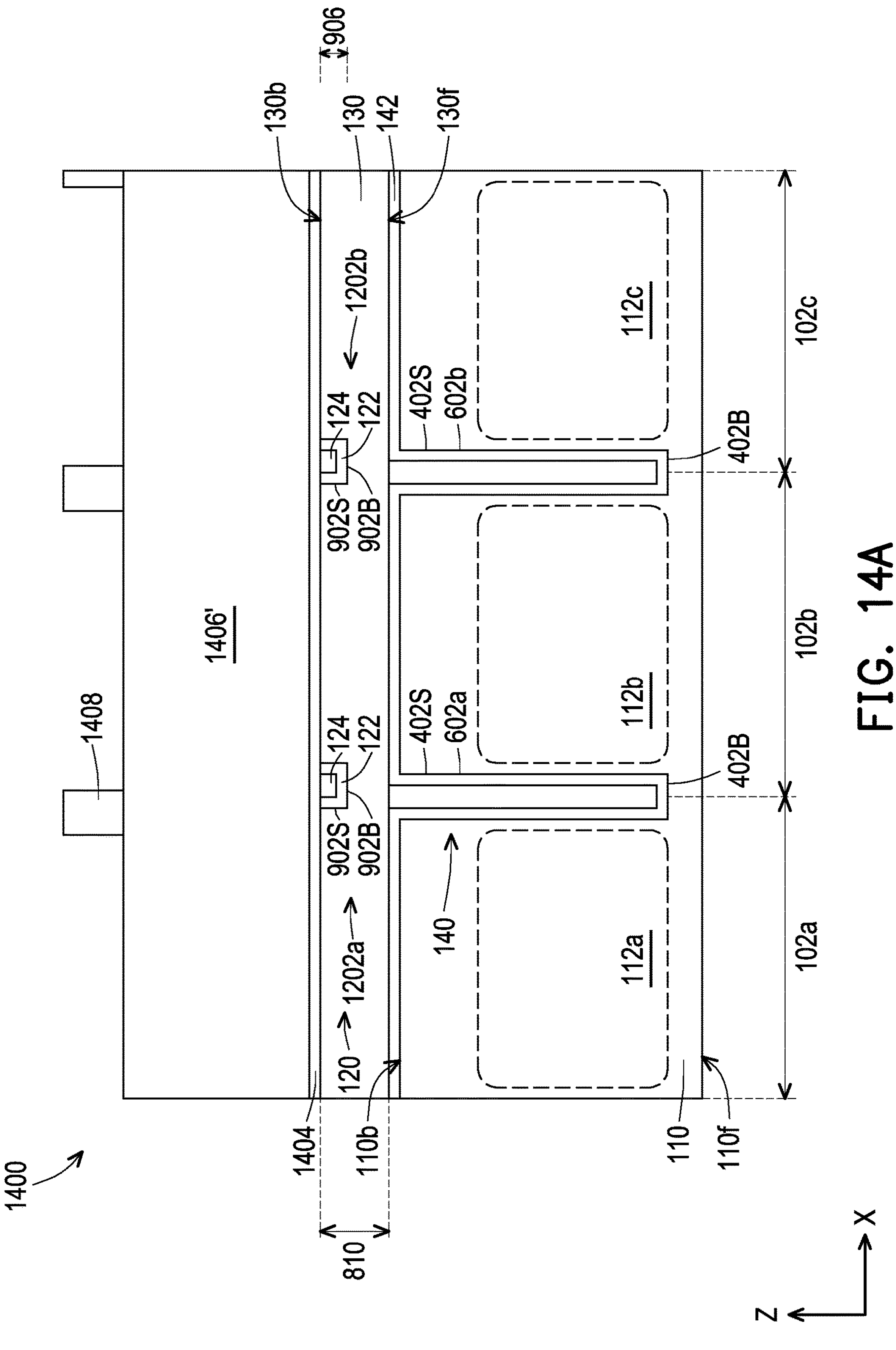
Figure 14B:
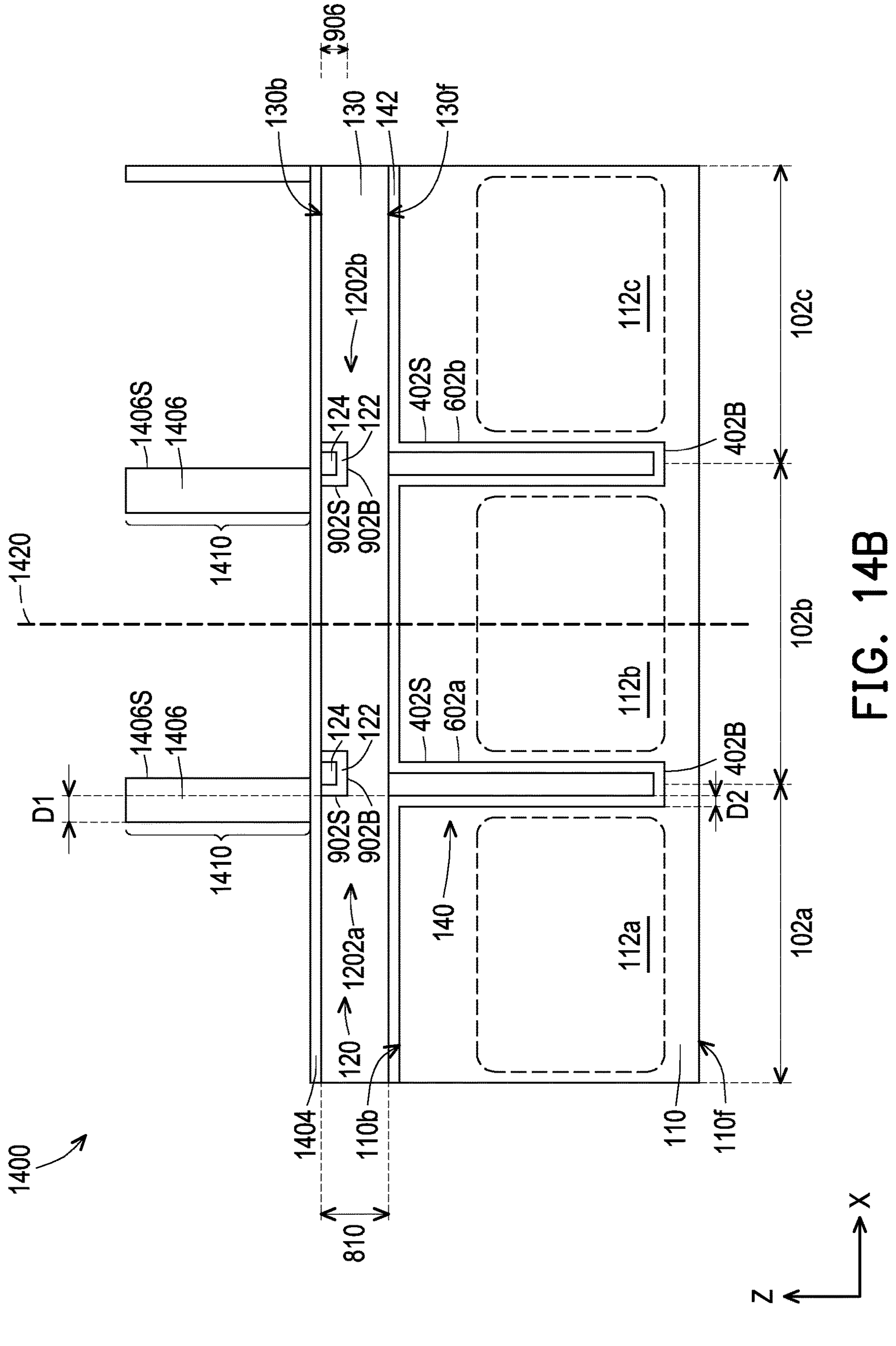
Figure 14C:
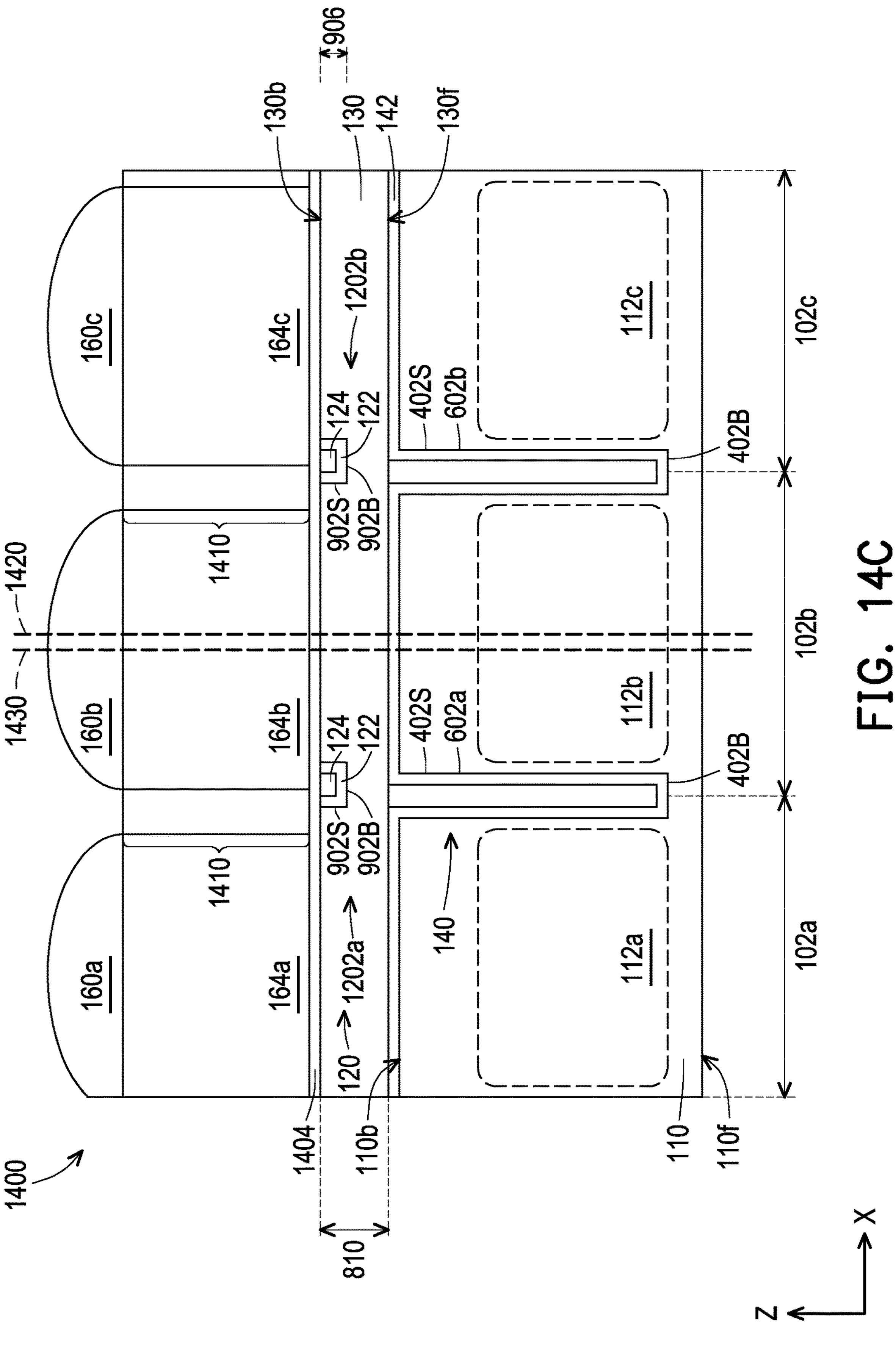

FIGS. 14A-14C illustrate a cross-sectional view 1400 of an optical structure during intermediate stages of manufacturing operations, in accordance with some embodiments. FIGS. 14A-14C depict another embodiment in which an upper grid structure 1410 is formed over the backside 130*b* of the light transmission layer 130, which includes the buried grid structure 120. The upper grid structure 1410 includes a low refractive index material or low-n material. The low-n material has a refractive index less than the refractive index of the color filters 164*a-c*. Due to the low refractive index, the low-n material isolates neighboring color filters 164*a-c* and directs light to the color filters to increase the effective size of the color filters 164*a-c*. In some embodiments, the upper grid structure 1410 may have a tetragon shape or circular shape from a top view. In some embodiments, the upper grid structure 1410 is vertically aligned with the buried grid structure 120. In some embodiments, the upper grid structure 1410 is vertically aligned with the isolation structure 140 and a width or diameter of the upper grid structure may be identical or substantially identical to a width or a diameter of the image-sensing element 112*a-c* or the light detection region 102*a-c*. In some embodiments, the upper grid structure 1410 is aligned with both the buried grid structure 120 and the isolation structure 140. In some embodiments, the upper grid structure 1410 is laterally shifted or offset (e.g., along the x-axis) relative to the buried grid structure 120 as is shown in FIGS. 14B-14C. In some embodiments, the upper grid structure 1410 is laterally shifted or offset (e.g., along the x-axis) relative to the isolation structure 140 as is also shown in FIGS. 14B-14C. In some embodiments, the upper grid structure 1410 is laterally shifted or offset (e.g., along the x-axis) relative to both the isolation structure 140 and the buried grid structure as is also shown in FIGS. 14B-14C.

Referring to FIG. 14A, in some embodiments, a dielectric capping layer 1404 is formed over the light transmission layer 130 and the exposed surfaces of the buried grid structure 120. The dielectric capping layer 1404 may function as an etch stop layer (ESL) during subsequent etching operations. Generally, an ESL can provide a mechanism to stop an etch process when forming, for example, an upper grid structure. The ESL may be formed of a dielectric material having a different etch selectively from adjacent layers or components. For example, the dielectric capping layer 1404 has a different etch selectivity than the low-n material layer 1406' such that the low-n material layer 1406' is removed at a greater rate than the dielectric capping layer 1404. In some embodiments, the dielectric capping layer 1404 may include or be silicon nitride, silicon oxynitride, silicon oxycarbide, silicon carbonitride, silicon carbon oxide, silicon carboxynitride, carbon nitride, silicon oxide, hafnium oxide, a combination thereof, or the like.

Still referring to FIG. 14A, the low-n material layer 1406' is formed over the light transmission layer 130, or over the dielectric capping layer 1404 if the dielectric capping layer was previously formed over the light transmission layer 130. In some embodiments, the low-n material layer 1406' is a transparent material with a refractive index less than a refractive index of the color filters 164_a-c_. In some embodiments, the low-n material layer 1406' is a dielectric, such as an oxide (e.g., $SiO_2$) or hafnium oxide (e.g., $HfO_2$), or a material with a refractive index less than silicon. In some embodiments, the low-n material layer 1406' includes the same material as the dielectric capping layer 1404. In other embodiments, the low-n material layer 1406' includes material that is different than the material of the dielectric capping layer 1404. The low-n material layer 1406' may be formed by a variety of techniques, such as CVD, PVD, atomic layer deposition (ALD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), sub-atmospheric CVD (SACVD), and/or other suitable operations.

Referring to FIG. 14B and FIG. 14C, subsequently, a photolithography operation is performed, wherein the low-n material layer 1406' is patterned by a masking layer 1408 to form a low-n grid section 1406 of the upper grid structure 1410. Specifically, the low-n material layer 1406' is patterned into the low-n grid section 1406. The dielectric capping layer 1404 functions as an etch stop for the photolithography and patterning operation. Due to the low refractive index of the low-n grid section 1406, the upper grid structure 1410 serves as a light guide to direct light to the color filters 164_a-c_ and to effectively increase the size of the color filters 164_a-c_. Further, due to the low refractive index, the low-n grid section 1406 serves to provide optical isolation between neighboring image-sensing elements 112_a-c_. Light within the color filters 164_a-c_ that strikes the boundary with the low-n grid section 1406 typically undergoes total internal reflection due to the refractive indexes. The masking layer 1408 is subsequently removed.

In addition, in some embodiments, the upper grid structure 1410 may be laterally shifted or offset (e.g., along the x-axis) relative to the buried grid structure 120 and/or the isolation structure 140 in at least one direction by an amount "D1". The amount "D1" may be measured from the sidewall 902S of the buried grid structure 120 to sidewall 1406S of the low-n grid structure 1406 as is shown in FIG. 14B. In some embodiments, the amount "D1" is from about 0 μm to about ±0.2 μm. Although the upper grid structure 1410 is laterally shifted in a direction away from a centerline 1420 of the image-sensing element 112_b_ it should be noted that depending upon the desired optical properties, the upper grid structure 1410 may be shifted toward the centerline 1420 of the image-sensing element 112_b_. Shifting of the upper grid structure 1410 can help improve pixel efficiency where the chief ray angle of incoming light is not normal or perpendicular.

Further, in some embodiments, the buried grid structure 120 may be laterally shifted or offset (e.g., along the x-axis) relative to the isolation structure 140 in at least one direction by an amount "D2". The amount "D2" may be measured from the sidewall 402S of the trench 402_a_ of the isolation structure 140 to the sidewall 902S of the buried grid structure 120. In some embodiments, the amount "D2" is from about 0 μm to about ±0.2 μm. Although the buried grid structure 120 is laterally shifted in a direction toward the centerline 1420 of the image-sensing element 112_b_ it should be noted that depending upon the desired optical properties, the buried grid structure 120 may be laterally shifted away from the centerline 1420 of the image-sensing element 112_b_. Shifting of the buried grid structure 120 can also help improve pixel efficiency where the chief ray angle of incoming light is not normal or perpendicular.

Referring to FIG. 14C, color filters 164_a-c_ are formed over the light transmission layer 130. In some embodiments where the upper grid structure 1410 is present, the upper grid structure 1410 is in the color filters 164_a-c_. In some embodiments where the dielectric capping layer 1404 is present, the color filters 164_a-c_ may be formed over or on the dielectric capping layer 1404. In some embodiments where the dielectric capping layer 1404 is not present, the color filters 164_a-c_ may be formed over or on the light transmission layer 130.

Still referring to FIG. 14C, the micro lenses 160_a-c_ are formed above the color filters 164_a-c_. In some embodiments, as depicted in FIG. 14C, due to the lateral shifting of the upper grid structure 1410, a centerline 1430 of the micro lenses 160_b_ is offset relative to the centerline 1420 of the corresponding image-sensing element 112_b_. It should be noted that the optical structure depicted in FIGS. 14A-14C may be tunable for various light conditions by modifying the isolation structure 140 by, for example, removing one or more of the isolation structure sections 602_a-b_ and/or modifying the upper grid structure 1410, by removing one or more portions of the upper grid structure 1410.

Figure 15A:
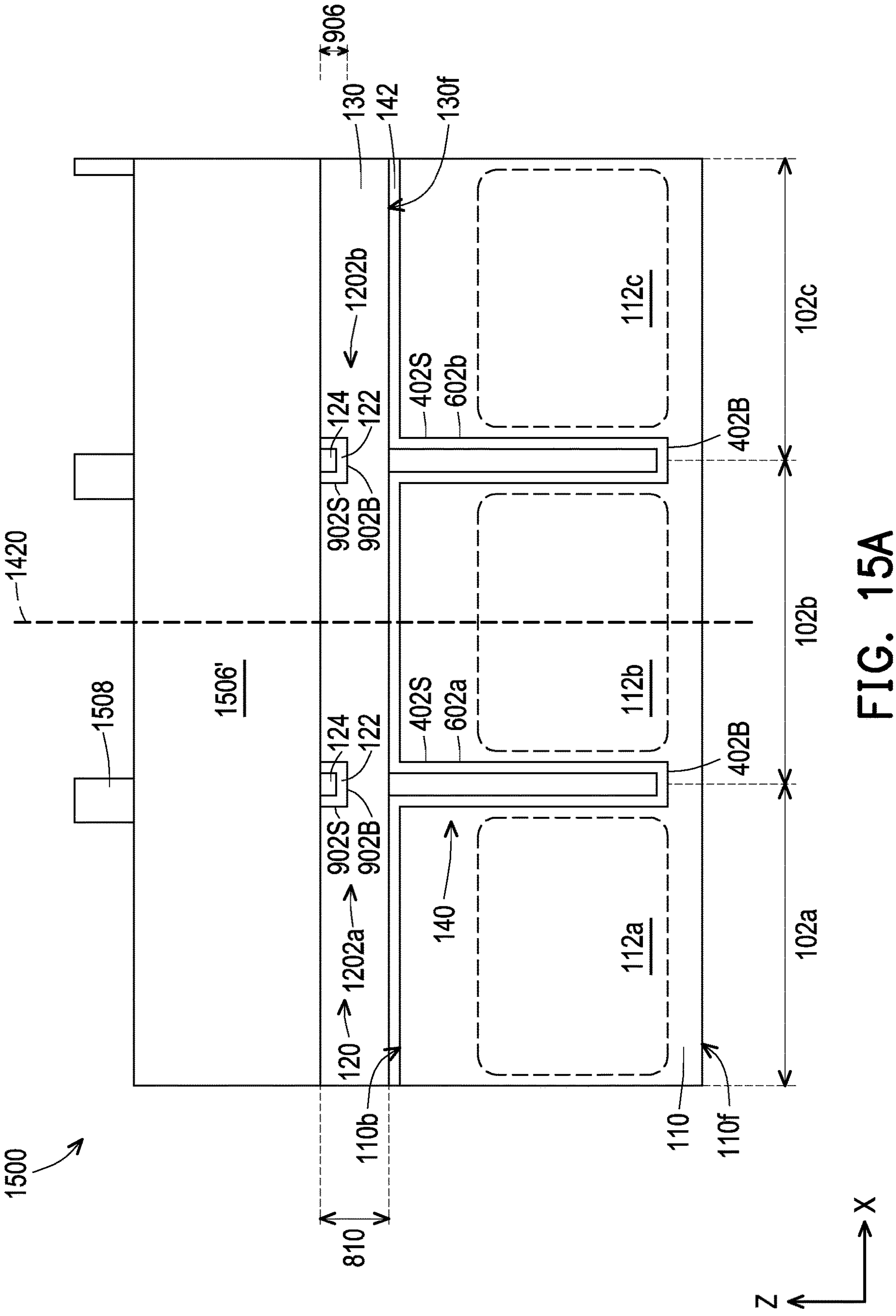
Figure 15B:
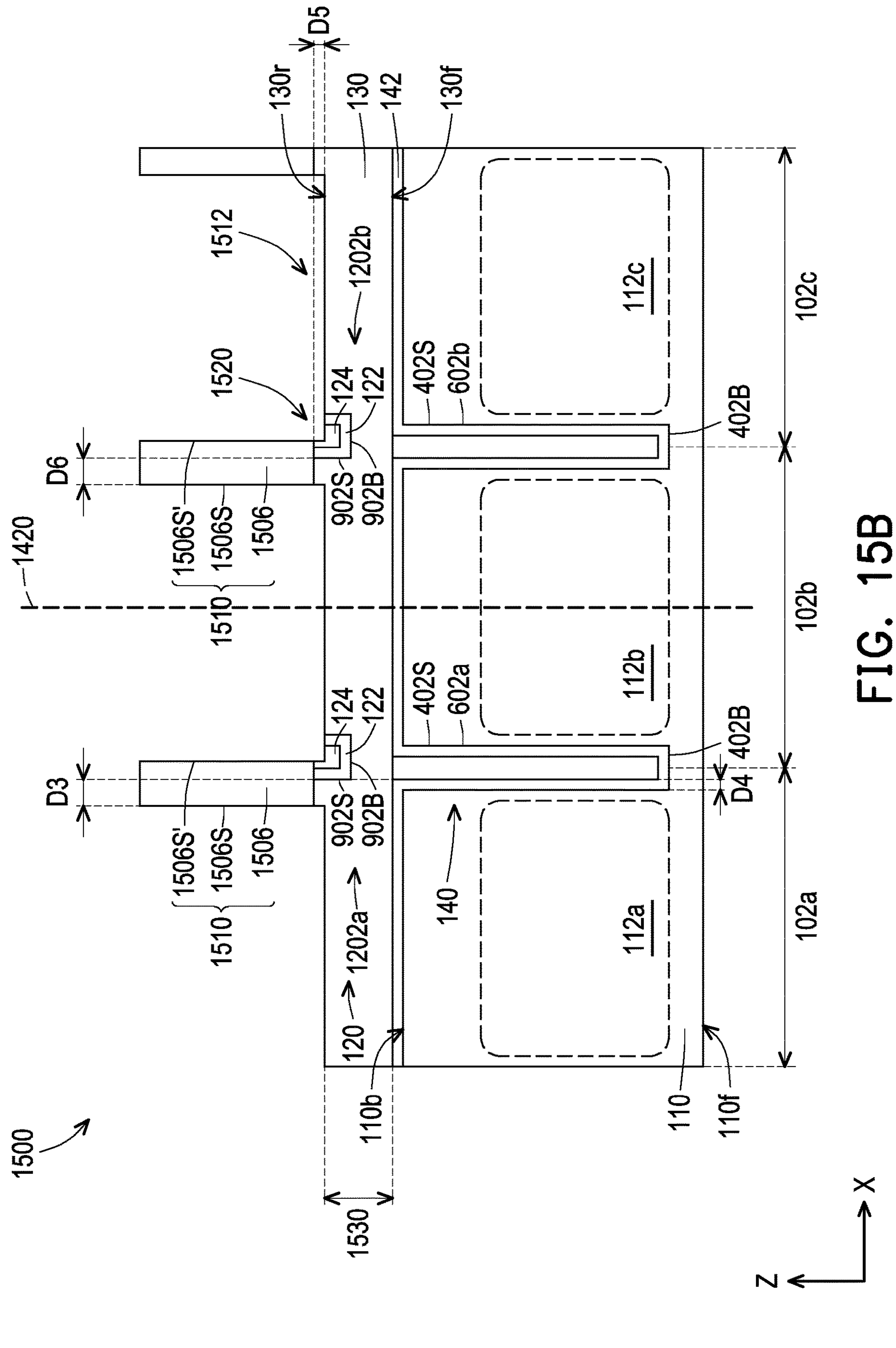
Figure 15C:
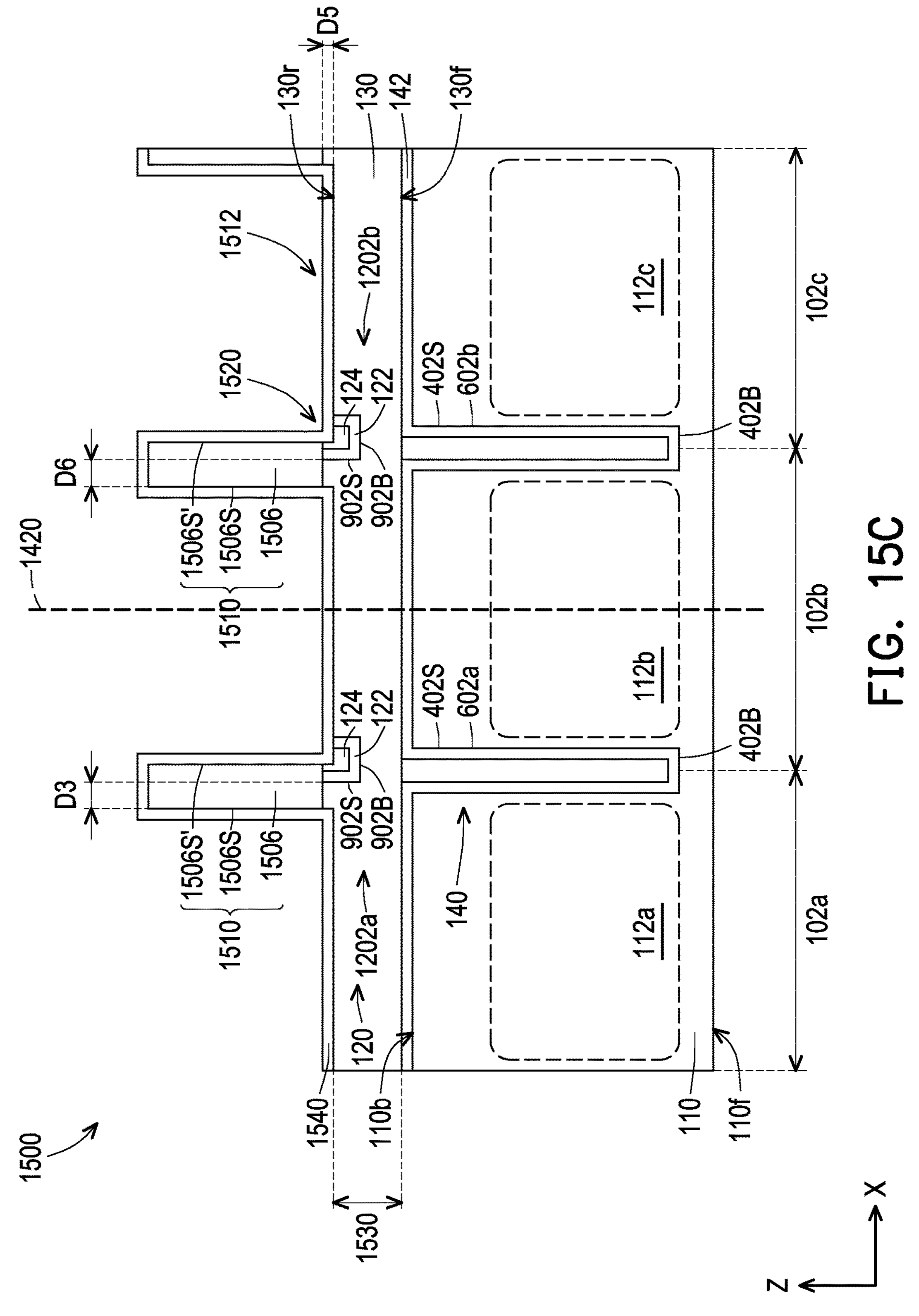
Figure 15D:
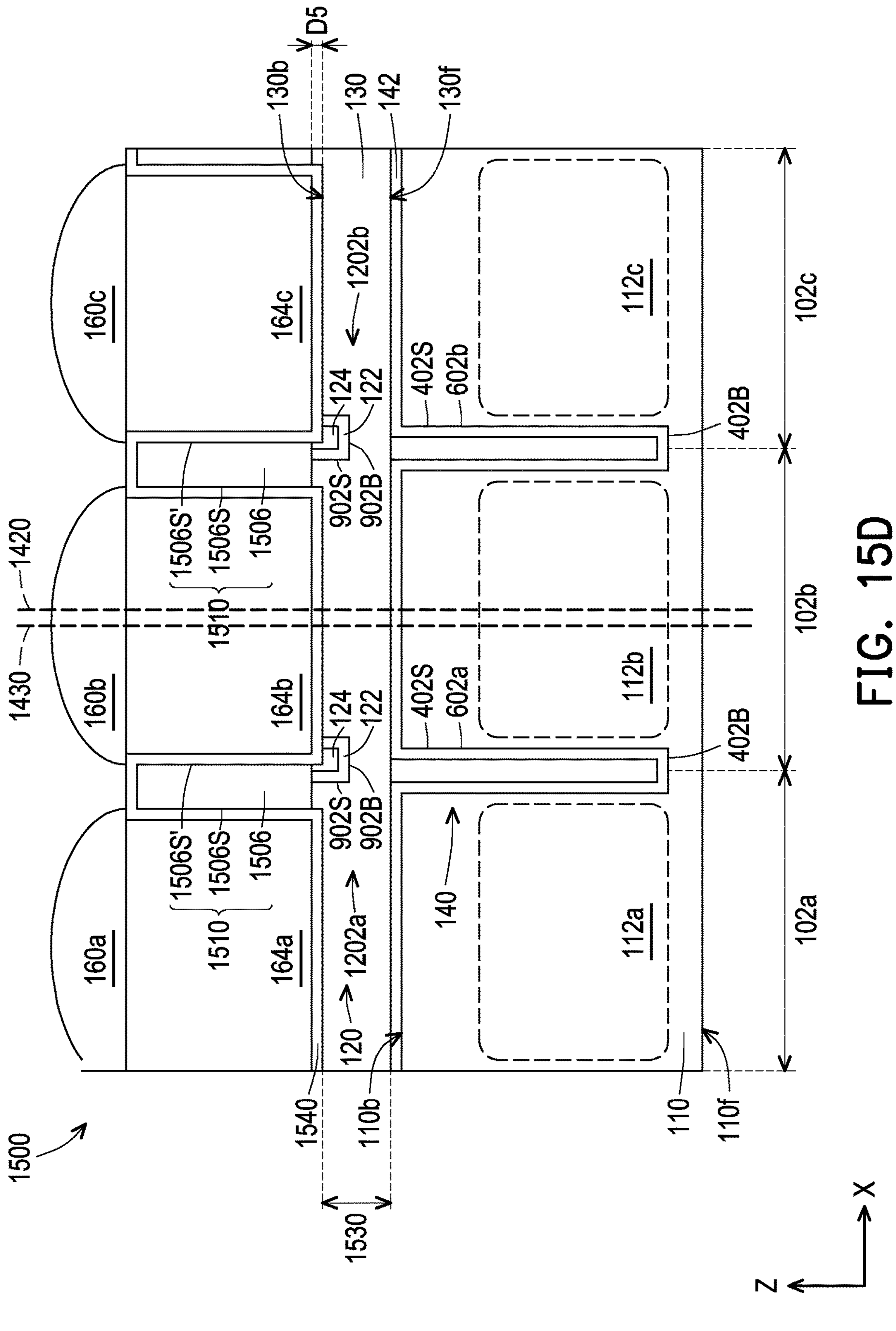

FIGS. 15A-15D illustrate a cross-sectional view 1500 of an optical structure during intermediate stages of manufacturing operations, in accordance with some embodiments. FIGS. 15A-15D depict an optical structure in which an upper grid structure 1510 is formed over the backside 130_b_ of the light transmission layer 130, which includes the buried grid structure 120. The upper grid structure 1510 includes an oxide material. In some embodiments, the oxide material has a refractive index less than the refractive index of the color filters 164_a-c_. Due to the low refractive index, the oxide material isolates neighboring color filters 164*a*-*c* and directs light to the color filters 164*a*-*c* to increase the effective size of the color filters 164*a*-*c*. In some embodiments, the upper grid structure 1510 may have a tetragon shape or circular shape from a top view. In some embodiments, the upper grid structure 1510 is vertically aligned with the buried grid structure 120. In some embodiments, the upper grid structure 1510 is vertically aligned with the isolation structure 140 and a width or diameter of the upper grid structure 1510 may be identical or substantially identical to a width or a diameter of the image-sensing element 112 or the light detection region 102. In some embodiments, the upper grid structure 1510 is aligned with both the buried grid structure 120 and the isolation structure 140. In some embodiments, the upper grid structure 1510 is laterally shifted or offset (e.g., along the x-axis) relative to the buried grid structure 120 as is shown in FIGS. 15B-15D. In some embodiments, the upper grid structure 1510 is laterally shifted or offset (e.g., along the x-axis) relative to the isolation structure 140 as is also shown in FIGS. 15B-15D. In some embodiments, the buried grid structure 120 is laterally shifted or offset (e.g., along the x-axis) relative to both the buried grid structure 120 and the isolation structure 140 as is also shown in FIGS. 15B-15D.

Turning to FIG. 15A, an oxide material layer 1506' is formed over or on the light transmission layer 130. In some embodiments, the oxide material layer 1506' has a refractive index less than a refractive index of the color filters 164*a*-*c*. In some embodiments, the oxide material layer 1506' is a dielectric, such as an oxide (e.g., $SiO_2$) or hafnium oxide (e.g., $HfO_2$), or an oxide material with a refractive index less than silicon. The oxide material layer 1506' may be formed by a variety of techniques, such as CVD, PVD, atomic layer deposition (ALD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), sub-atmospheric CVD (SACVD), and/or other suitable operations.

Still referring to FIG. 15A, subsequently, a photolithography operation is performed, wherein the oxide material layer 1506' is patterned by a masking layer 1508 to form an oxide grid section 1506 of the upper grid structure 1510 shown in FIG. 15B. It should be noted that the upper grid structure 1510 may have a circular shape or a tetragon shape from a top view perspective. The masking layer 1508 is subsequently removed.

In some embodiments, the upper grid structure 1510 is vertically aligned with the isolation structure 140 and the buried grid structure 120 to improve the alignment between an arrangement of each of the image-sensing elements 112*a*-*c* and an arrangement of the corresponding upper grid structure 1510. In other embodiments, as shown in FIG. 15C and FIG. 15D, the upper grid structure 1510 may be laterally shifted or offset (e.g., along the x-axis) relative to the buried grid structure 120 and/or the isolation structure 140 in at least one direction by an amount "D3". The amount "D3" may be measured from the sidewall 902S of the buried grid structure 120 to sidewall 1506S of the upper grid structure 1510. In some embodiments, the amount "D3" is from about 0 μm to about ±0.2 μm. Although the upper grid structure 1510 is laterally shifted in a direction away from the centerline 1420 of the image-sensing element 112*b* it should be noted that depending upon the desired optical properties, the upper grid structure 1510 may be laterally shifted toward the centerline 1420 of the image-sensing element 112*b*.

Further, in some embodiments, the buried grid structure 120 may be laterally shifted or offset (e.g., along the x-axis) relative to the isolation structure 140 in at least one direction by an amount "D4". The amount "D4" may be measured from the sidewall 402S of the trench 402 of the isolation structure 140 to the sidewall 902S of the buried grid structure 120. In some embodiments, the amount "D4" is from about 0 μm to about ±0.2 μm. In some embodiments, the amount "D3" is greater than the amount "D4". Although the buried grid structure 120 is laterally shifted in a direction toward the centerline 1420 of the image-sensing element 112*b* it should be noted that depending upon the desired optical properties, the buried grid structure 120 may be laterally shifted away from the centerline 1420 of the image-sensing element 112*b*.

Referring to FIG. 15B, in some embodiments, the photolithography operation not only patterns the oxide material layer 1506' but also removes a portion of the backside 130*b* of the light transmission layer 130 to form a recessed portion 1512 defined by a recessed surface 130*r*. By forming the recess portion 1512 in the transmission layer 130, the thickness of the transmission layer 130 may be reduced, thus, further reducing optical cross talk between neighboring pixel cells. The recessed portion 1512 has a thickness represented by "D5", which is measured in the z-direction. The thickness "D5" can be calculated by subtracting a recessed thickness 1530 of the light transmission layer 130 from the initial thickness 810 of the light transmission layer 130. In some embodiments, the amount "D5" is from about 0 Å to about 500 Å. In addition, in some embodiments where the buried grid structure 120 is shifted or offset relative to the upper grid structure 1510, the photolithography operation removes a portion of the buried grid structure 120 to form a notch 1520 in the buried grid structure 120. In some embodiments, the photolithography operation removes a portion of the metal nitride grid section 122, a portion of the metallic grid section 124, or both a portion of the metal nitride grid section 122 and a portion of the metallic grid section 124. In some embodiments, as shown in FIG. 15B, the notch 1520 is defined by both the metal nitride grid section 122 and the metallic grid section 124. In some embodiments, the notch 1520 may have a thickness measured in the z-direction, which is represented by "D5", and a width measured in the x-direction which is represented by "D6". In some embodiments, the amount "D5" is from about 0 Å to about 500 Å and the amount "D6" is from about 0 Å to about 500 Å. In some embodiments, a sidewall of the notch 1520 is defined by the metallic grid section 124 and a bottom surface of the notch 1520 is defined by the metal nitride grid section 122 and the metallic grid section 124. In some embodiments, as shown in FIG. 15B, sidewall 1506S of the upper grid structure 1510 is defined by the oxide grid section 1506 and a portion of the light transmission layer 130 and sidewall 1506S' is also defined by the oxide grid section 1506 and a portion of the metallic grid section 124.

Referring to FIG. 15C, in some embodiments, a dielectric capping layer 1540 is formed over the exposed lateral surfaces of the light transmission layer 130, for example, the recessed surface 130*r*, the upper grid structure 1510, and exposed portions of the buried grid structure 120, for example, the metallic grid section 124 and the metal nitride grid section 122 that define the notch 1520. Thereby the upper grid structure 1510 is inside the dielectric capping layer 1540 and surrounded by the dielectric capping layer 1540. In some embodiments, the dielectric capping layer 1540 may be a conformal layer. Additional details about the dielectric capping layer 1540 are described with reference to the dielectric capping layer 168 and the description is not repeated herein.

Referring to FIG. 15D, color filters 164*a-c* are formed over the light transmission layer 130. In some embodiments where the upper grid structure 1510 is present, the upper grid structure 1510 is formed in between the color filters 164*a-c*. In some embodiments where the dielectric capping layer 1540 is present, the color filters 164*a-c* may be formed over or on the dielectric capping layer 1540. In some embodiments where the dielectric capping layer 1540 is not present, the color filters 164*a-c* may be formed over or on the light transmission layer 130. In some embodiments, a refractive index of the color filters 164*a-c* is greater than a refractive index of the upper grid structure 1510 and/or the buried grid structure 120. In some embodiments, a thickness of the color filters 164*a-c* is identical or substantially identical with a height of the upper grid structure 1510. Alternatively in some other embodiments, a thickness of the color filters 164*a-c* is greater than a height of the upper grid structure 1510.

Still referring to FIG. 15D, the micro lenses 160*a-c* are formed above the color filters 164*a-c*. In some embodiments, as depicted in FIG. 15D, due to the shifting of the upper grid structure 1510, the centerline 1430 of the micro lenses 160*b* is offset relative to the centerline 1420 of the corresponding image-sensing element 112*b*. It should be noted that the optical structure depicted in FIGS. 15A-15D may be tunable for various light conditions by modifying the isolation structure 140 by, for example, removing one or more of the isolation structure sections 602*a-b* and/or modifying the upper grid structure 1510, by removing one or more portions of the upper grid structure 1510.

With reference to FIGS. 16-28 and 29A-29D, cross-sectional views of some embodiments of an optical structure for image sensors at various stages of manufacture are provided to illustrate the method of FIG. 2. Although FIGS. 16-28 and 29A-29D are described in relation to the method 200, it will be appreciated that the structures disclosed in FIGS. 16-28 and 29A-29D are not limited to the method 200, but instead may stand alone as structures independent of the method 200. Similarly, although the method 200 is described in relation to FIGS. 16-28 and 29A-29D, it will be appreciated that the method 200 is not limited to the structures disclosed in FIGS. 16-28 and 29A-29D, but instead may stand alone independent of the structures disclosed in FIGS. 16-28 and 29A-29D.

FIGS. 16-28 illustrate cross-sectional side views of various stages of manufacturing an optical structure including a buried grid structure that can be used with the image sensor device 100B of FIG. 1B in accordance with some embodiments. As an initial matter, it is noted that the optical structures depicted in FIGS. 16-28 are similar to the optical structures depicted in FIGS. 3-12B. However, it is also noted that the optical structures depicted in FIGS. 16-25 are modified to accommodate a 2×2 pixel array.

Figure 16:
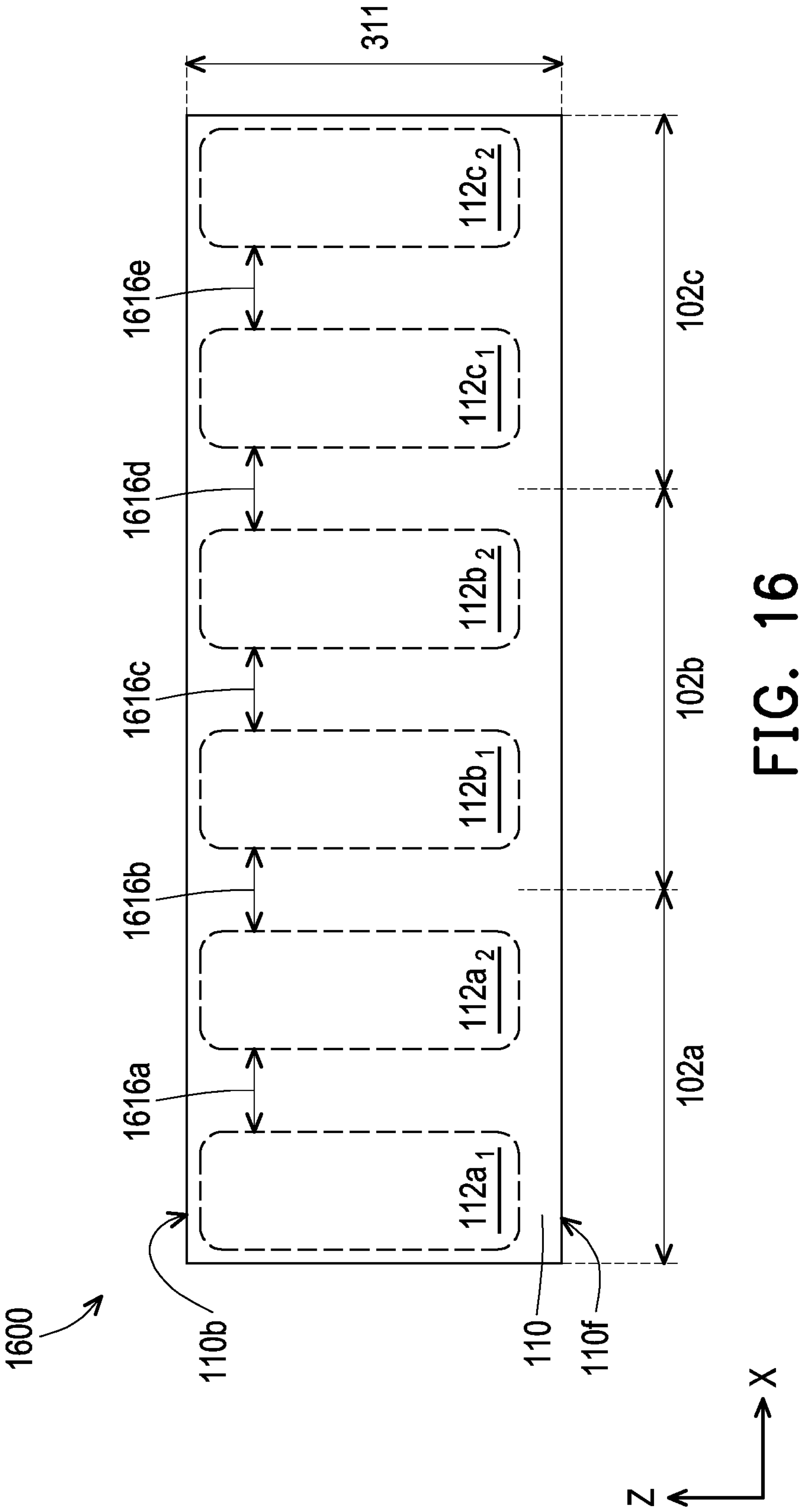
FIGS. 16-28 and 29A-29D illustrate views of various stages of manufacturing another optical structure in accordance with some embodiments.

FIG. 16 illustrates a cross-sectional view 1600 of an optical structure during intermediate stages of manufacturing operations corresponding to operation 202, in accordance with some embodiments. The device substrate 110 has the frontside 110*f* and the backside 110*b* opposite the frontside 110*f*. The device substrate 110 includes, for example, image-sensing elements 112$a_1$, 112$a_2$, 112$b_1$, 112$b_2$, 112$c_1$, and 112$c_2$ arranged to correspond to the light detection regions 102*a*, 102*b*, and 102*c*, respectively. For the sake of simplicity, only six image-sensing elements 112$a_1$-$c_2$ are illustrated in FIG. 16, but it is understood that any number of image-sensing elements may be implemented in the device substrate 110. The image-sensing elements 112$a_1$-$c_2$ may be formed by any suitable method.

The image-sensing elements 112$a_1$-112$c_2$ are separated from one another by a plurality of gaps in the device substrate 110. For example, a gap 1616*a* separates the image-sensing elements 112$a_1$ and 112$a_2$, a gap 1616*b* separates the image-sensing elements 112$a_2$ and 112$b_1$, a gap 1616*c* separates the image-sensing elements 112$b_1$ and 112$b_2$, a gap 1616*d* separates the image-sensing elements 112$b_2$ and 112$c_1$, and a gap 1616*e* separates the image-sensing elements 112$c_1$ and 112$c_2$. Of course, it is understood that the gaps 1616*a*-1616*e* are not voids or open spaces in the device substrate 110 but may be regions of the device substrate 110 (either a semiconductor material or a dielectric isolation element) that are located between the adjacent image-sensing elements.

Figure 17:
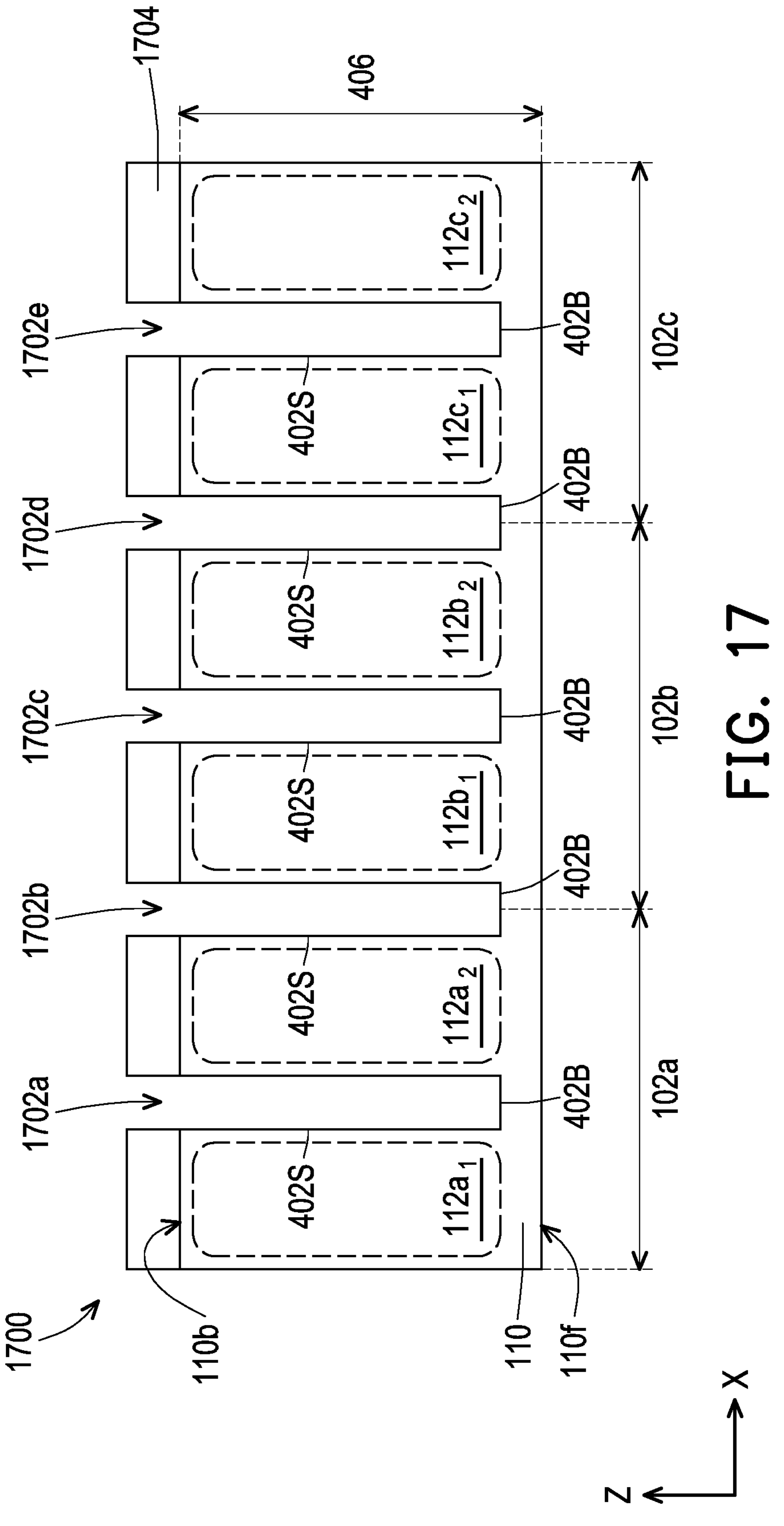

FIG. 17 illustrates a cross-sectional view 1700 of an optical structure during intermediate stages of manufacturing operations corresponding to operation 204, in accordance with some embodiments. As shown in FIG. 17, a patterning process is performed to form a trench 1702*a-e* (collectively 1702) within the backside 110*b* of the device substrate 110. The trench 1702*a* is formed between adjacent image-sensing elements 112$a_1$ and 112$a_2$, the trench 1702*b* is formed between adjacent image-sensing elements 112$a_2$ and 112$b_1$, the trench 1702*c* is formed between adjacent image-sensing elements 112$b_1$ and 112$b_2$, the trench 1702*d* is formed between adjacent image-sensing elements 112$b_2$ and 112$c_1$, and the trench 1702*e* is formed between adjacent image-sensing elements 112$c_1$ and 112$c_2$. The trench 1702 includes sidewalls 402S defined by the device substrate 110 and a bottom surface 402B also defined by the device substrate 110 that extends between the sidewalls 402S. In some embodiments, the device substrate 110 may be etched by forming a masking layer 1704 on the backside 110*b* of the device substrate 110. The device substrate 110 is then exposed to an etchant in regions not covered by the masking layer 1704. The trench 1702 extends from the backside 110*b* of the device substrate 110 to a first depth 406 within the device substrate 110. After the etch process, the masking layer 1704 may be removed. The trenches 1702 are formed at locations laterally removed from the image-sensing elements 112$a_1$-$c_2$. In some embodiments, the trenches 1702 laterally surround each of the image-sensing elements 112$a_1$-$c_2$. Additional details about the trenches 1702 are described with reference to trench 402 of FIG. 4 and the description is not repeated herein.

Figure 18:
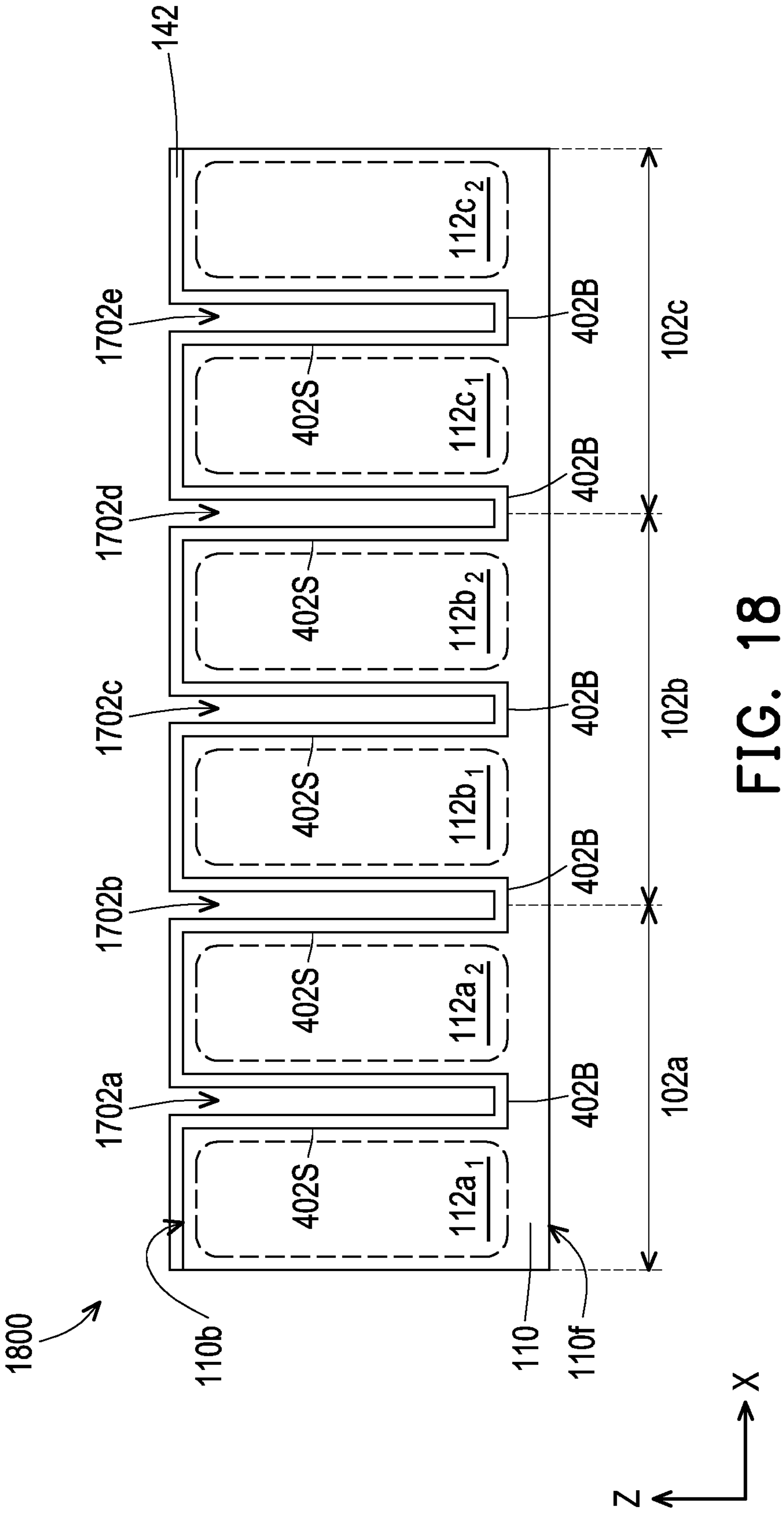

FIG. 18 illustrates a cross-sectional view 1800 of an optical structure during intermediate stages of manufacturing operations also corresponding to operation 204, in accordance with some embodiments. As shown in FIG. 18, in some embodiments, a high-k dielectric liner 142 is deposited over the device substrate 110. The high-k dielectric liner 142 lines the sidewalls 402S and the bottom surfaces 402B of the trenches 1702. The high-k dielectric liner 142 may function as a passivation layer and separate the device substrate 110 from the subsequently deposited isolation material 144 (See FIG. 19). In addition, the high-k dielectric liner 142 may help alleviate crosstalk between adjacent image-sensing elements 112$a_1$-$c_2$. The high-k dielectric liner 142 may be a conformal layer. In some embodiments, as shown in FIG. 18, the high-k dielectric liner 142 has top surfaces coplanar with a lateral surface of the backside 110*b* of the device substrate 110, the high-k dielectric liner 142 may extend upwardly from the trench 1702 over the backside 110*b* of the device substrate 110 and laterally disposed along the backside 110*b* of the device substrate 110. Additional details about the high-k dielectric liner 142 are described with reference to FIG. 5 and the description is not repeated herein.

Figure 19:
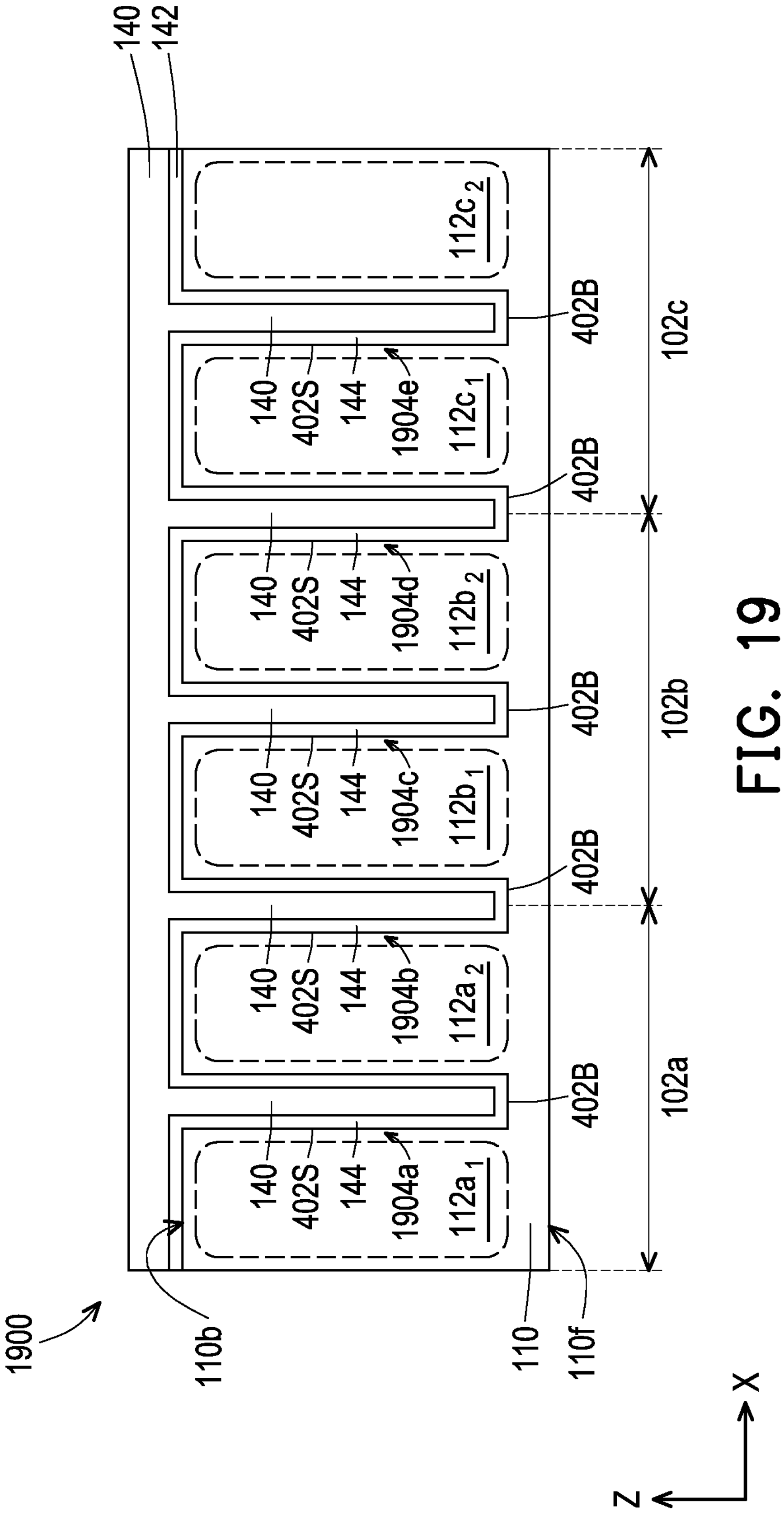

FIG. 19 illustrates a cross-sectional view 1900 of an optical structure during intermediate stages of manufacturing operations also corresponding to operation 204, in accordance with some embodiments. Turning to FIG. 19, the trenches 1702 are filled with isolation material 144 to form an isolation structure 140. The isolation structure 140 includes a plurality of isolation structure sections 1904*a-e*, each isolation structure section 1904*a-e* is defined by a corresponding trench (see FIG. 18). In some embodiments, the isolation structure 140 may be a deep trench isolation (DTI) structure, such as a backside deep trench isolation (BDTI) structure. In some embodiments where the high-k dielectric liner 142 is present, each isolation structure section 1904*a-e* includes the high-k dielectric liner 142 and the isolation material 144. The isolation material 144 is deposited to fill the area of the trenches 1702 not filled by the high-k dielectric liner 142 (if present). The optical structure shown in FIG. 19 may be an intermediate structure, and the high-k dielectric liner 142 and the isolation material 144 may or may not subject to a planarization process such that top surfaces of the layers could be altered as will be discussed in FIG. 20. Additional details about the isolation structure 140 are described with reference to FIG. 6 and the description is not repeated herein.

Figure 20:
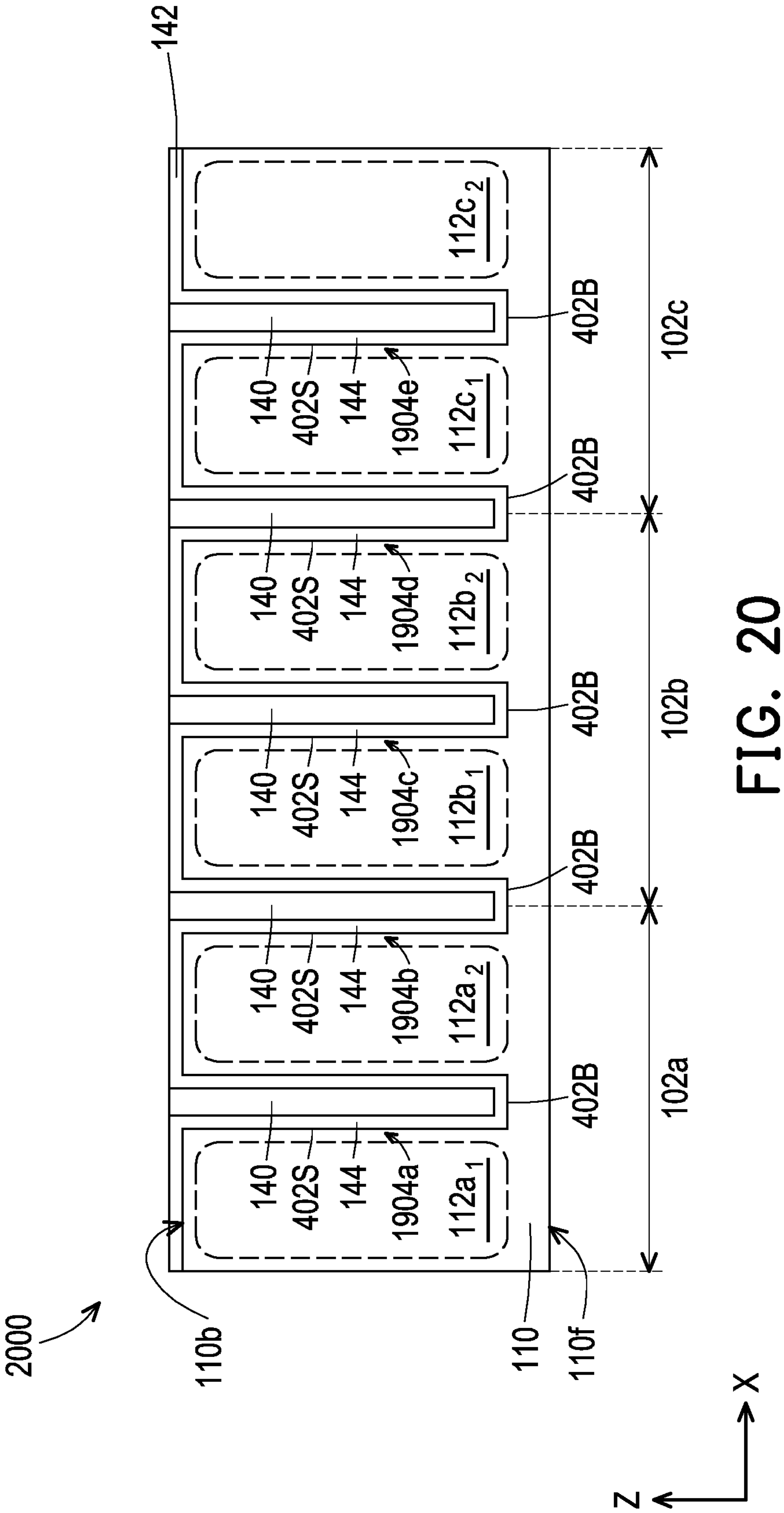

FIG. 20 illustrates a cross-sectional view 2000 of an optical structure during intermediate stages of manufacturing operations also corresponding to operation 204, in accordance with some embodiments. In some embodiments, isolation material 144 is subjected to a planarization process, for example, a CMP process, to form a planar surface. In some embodiments, as shown in FIG. 20, the isolation material 144 above the high-k dielectric liner 142 is removed such that a top surface of the isolation material 144 is co-planar or substantially co-planar with a top surface of the high-k dielectric liner 142 formed on the lateral surfaces of the backside 110*b* of the device substrate 110. In other embodiments, a portion of the isolation material 144 above the high-k dielectric liner 142 is removed to planarize a top surface of the isolation material 144 such that a top surface of the isolation material 144 remains above a top surface of the high-k dielectric liner 142 as shown in FIG. 20. In alternative embodiments, the isolation material 144 and the high-k dielectric liner 142 are removed such that a top surface of the isolation material 144 and a top surface of the high-k dielectric liner 142 are both co-planar or substantially co-planar with the backside 110*b* of the device substrate 110.

Referring to FIG. 20, in the 2×2 pixel array design, light detection region 102*b* includes image-sensing elements $\mathbf{112}b_1$ and $\mathbf{112}b_2$. Isolation structure section 1904*b* and isolation structure section 1904*c* define a first region of the light detection region 102*b* including image-sensing element $\mathbf{112}b_1$ and isolation structure section 1904*b* and isolation structure section 1904*d* define a second region of the light detection region 102*b* including image-sensing element $\mathbf{112}b_2$. Isolation structure section 1904*b* and isolation structure section 1904*d* define the light detection region 102*b*. In some embodiments, the isolation structure section 1904*c* can be removed to modify the optical properties of the isolation structure 140. The isolation structure section 1904*c* can also be removed to accommodate a single pixel design similar to the design shown in FIG. 12A.

Figure 21:
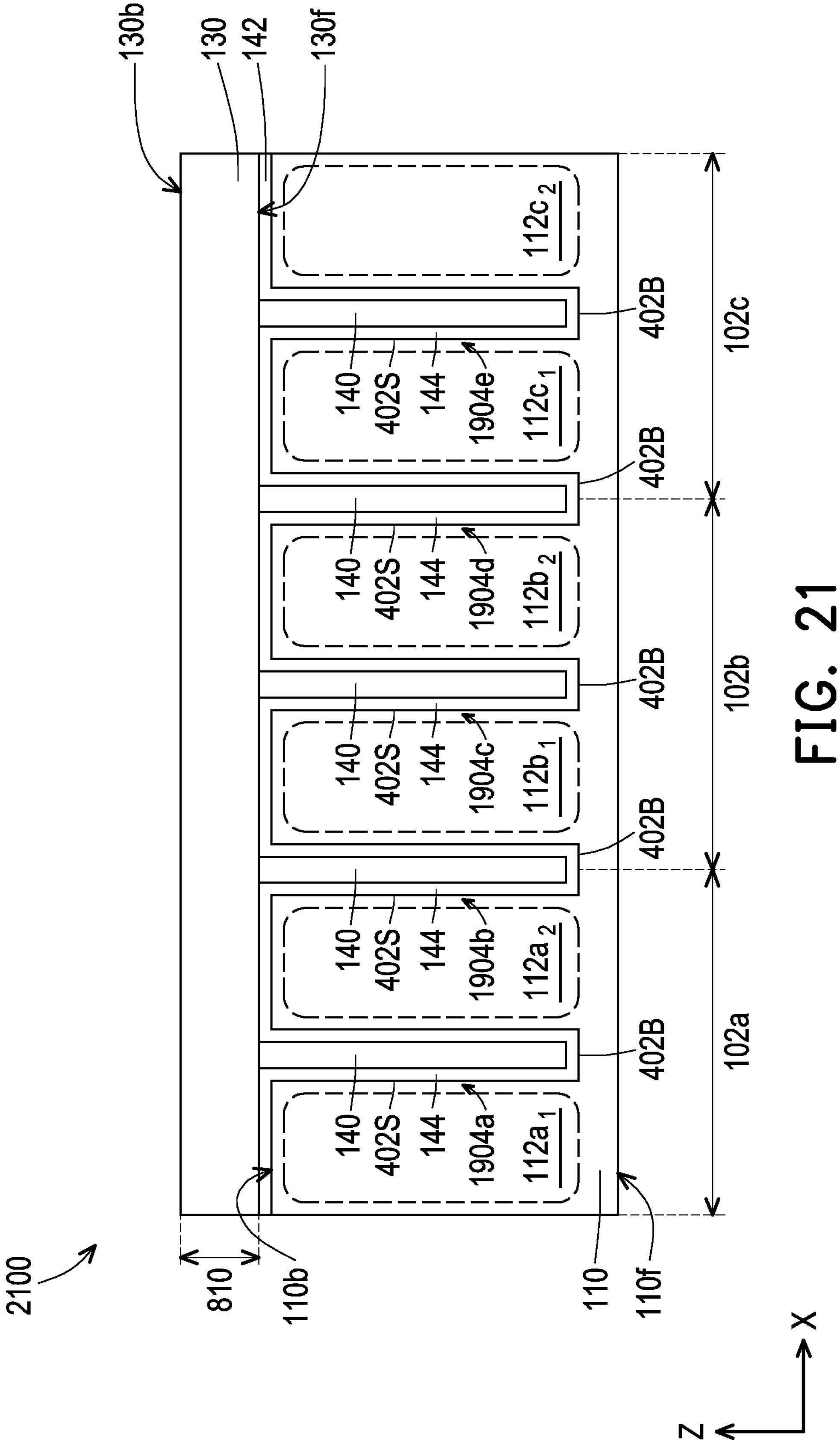

FIG. 21 illustrates a cross-sectional view 2100 of an optical structure during intermediate stages of manufacturing operations also corresponding to operation 206, in accordance with some embodiments. As shown in FIG. 21, the light transmission layer 130 is formed over the device substrate 110 and the isolation structure 140. The light transmission layer 130 has the backside 130*b* opposite to the device substrate 110 and the frontside 130*f* facing the backside 110*b* of the device substrate 110. Additional details about the light transmission layer 130 are described with reference to FIG. 8 and the description is not repeated herein.

In some embodiments where the material of the light transmission layer 130 is the same as the isolation material 144 of the isolation structure 140, both the light transmission layer 130 and the isolation structure 140 may be formed by the same deposition process. For example, with reference to FIG. 19, the isolation material 144 formed above the high-k dielectric liner 142 formed on the lateral surfaces of the backside 110*b* may function as the light transmission layer 130.

Figure 22:
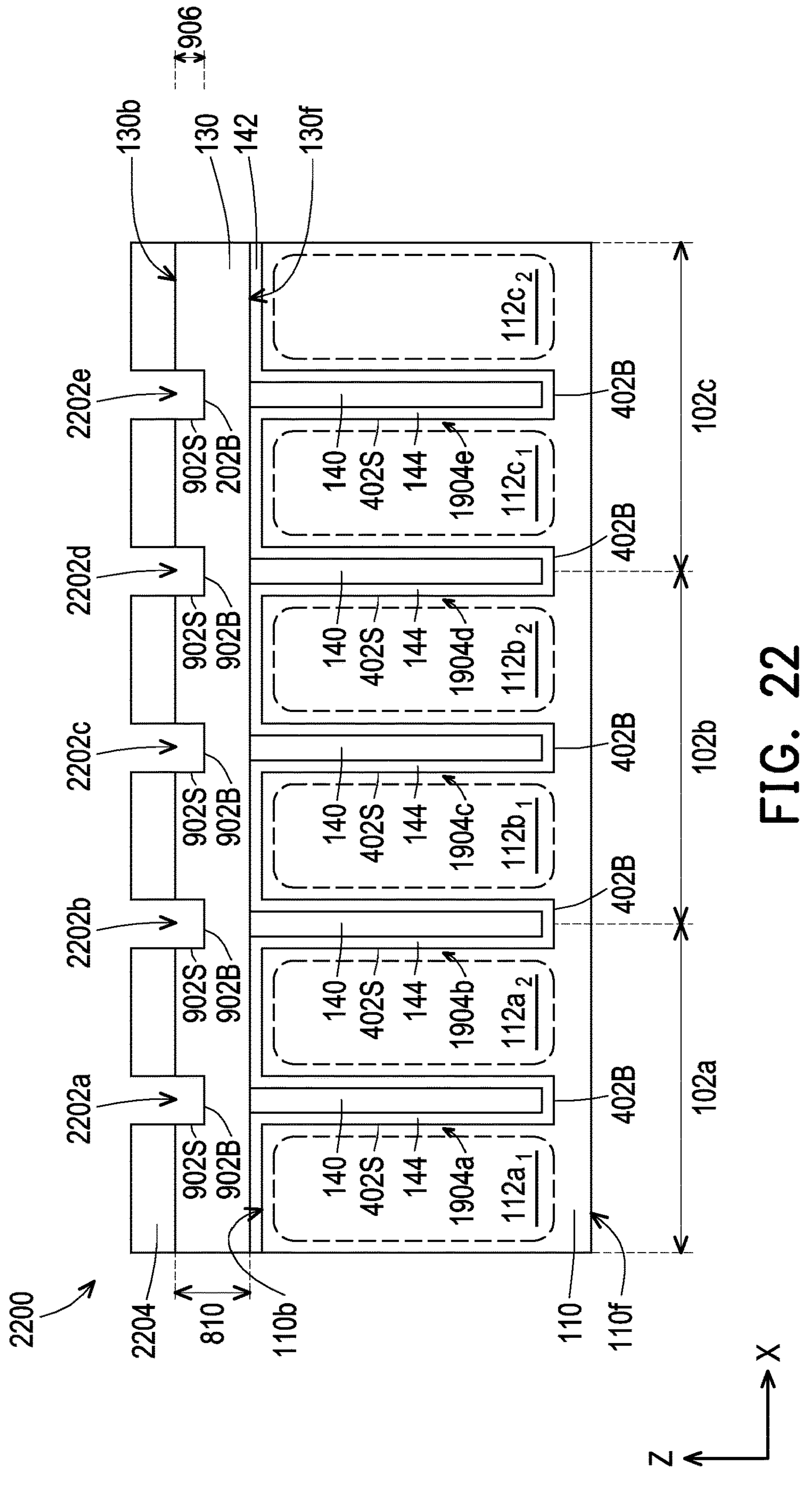

FIG. 22 illustrates a cross-sectional view 2200 of an optical structure during intermediate stages of manufacturing operations also corresponding to operation 208, in accordance with some embodiments. As shown in FIG. 2200, a patterning process is performed to form buried grid (BG) trench 2202*a-e* (collectively 2202) within the backside 130*b* of the light transmission layer 130. The BG trench 2202 includes sidewalls 902S defined by the light transmission layer 130 and a bottom surface 902B also defined by the light transmission layer 130 that extends between the sidewalls 902S. In some embodiments, the light transmission layer 130 may be etched by forming a masking layer 2204 on the backside 130*b* of the light transmission layer 130. The light transmission layer 130 is then exposed to an etchant in regions not covered by the masking layer 2204. The etchant etches the light transmission layer 130 to form the BG trench 2202. The BG trench 2202 extends from the backside 130*b* of the light transmission layer 130 to a second depth 906 within the device substrate 110. After the etch process, the masking layer 2204 may be removed. In some embodiments, the BG trenches 2202 are formed at locations laterally removed from the image-sensing elements $\mathbf{112}a_1$-$c_2$. In some embodiments, the BG trenches 2202 laterally surround each of the image-sensing elements $\mathbf{112}a_1$-$c_2$. In some embodiments, the BG trenches 2202 are laterally shifted (e.g., along the x-axis) to partially overlap with one or more of the image-sensing elements $\mathbf{112}a_1$-$c_2$. Additional details about the BG trench 2202 are described with reference to BG trench 902 in FIG. 9 and the description is not repeated herein.

Figure 23:
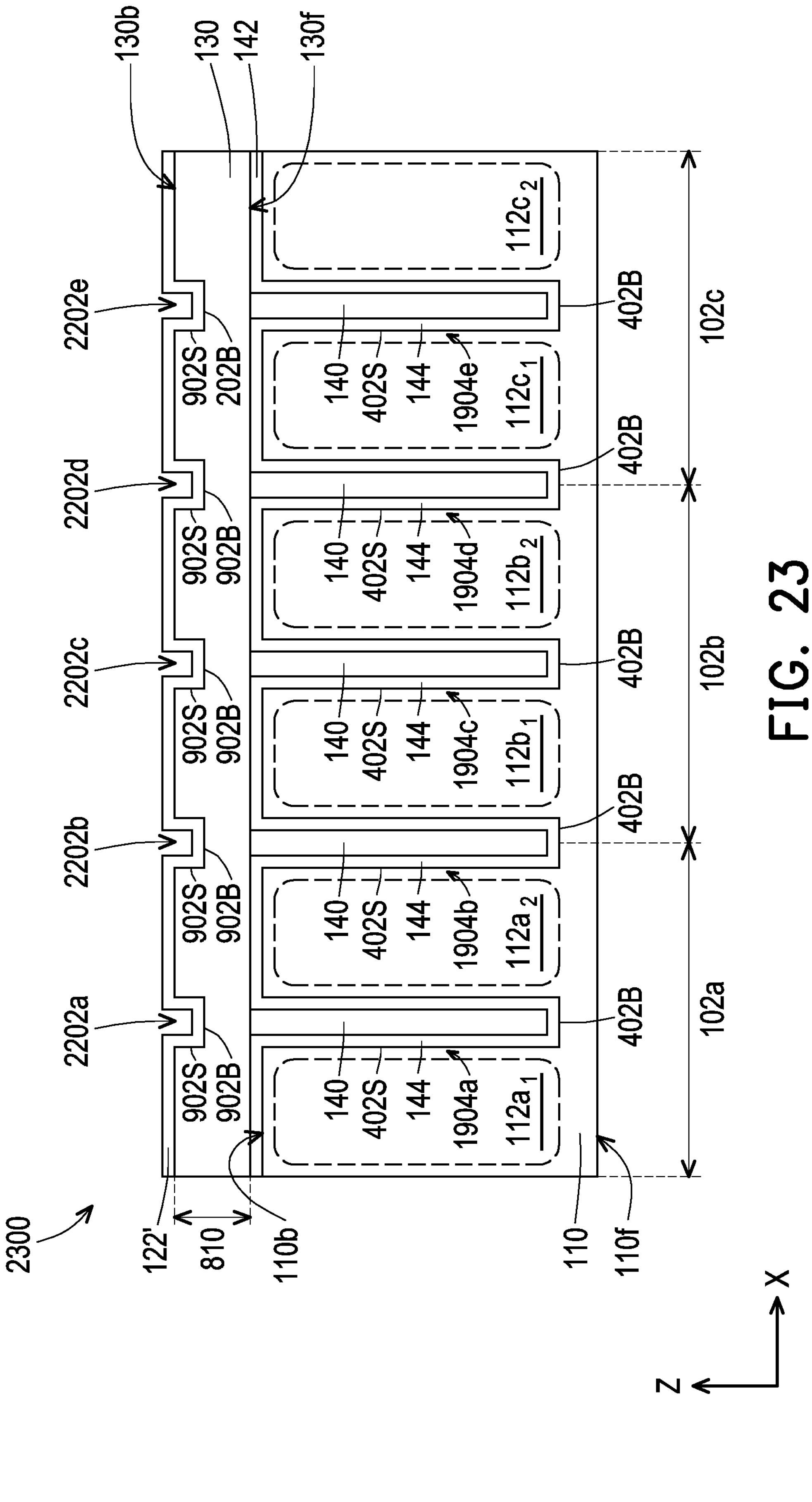

FIG. 23 illustrates a cross-sectional view 2300 of an optical structure during intermediate stages of manufacturing operations also corresponding to operation 208, in accordance with some embodiments. As shown in FIG. 23, in some embodiments, metal nitride layer 122' is deposited over the device substrate 110. The metal nitride layer 122' lines the backside 130*b* of the light transmission layer 130, the sidewalls 902S and the bottom surfaces 902B of the BG trenches 2202. The metal nitride layer 122' may function as a barrier layer and separate the light transmission layer 130 from the subsequently deposited metallic layer 124' (See FIG. 24). In addition, the metal nitride layer 122' may help alleviate crosstalk between adjacent image-sensing elements $\mathbf{112}a_1$-$\mathbf{112}c_2$. The metal nitride layer 122' may be a conformal layer. In some embodiments, as shown in FIG. 23, the metal nitride layer 122' has top surfaces coplanar with a lateral surface of the backside 130*b* of the light transmission layer 130, the metal nitride layer 122' may extend upwardly from the BG trench 2202 over the backside 130*b* of the light transmission layer 130 and laterally disposed along the backside 130*b* of the light transmission layer 130. Additional details about the metal nitride layer 122' are described with reference to FIG. 10 and the description is not repeated herein.

Figure 24:
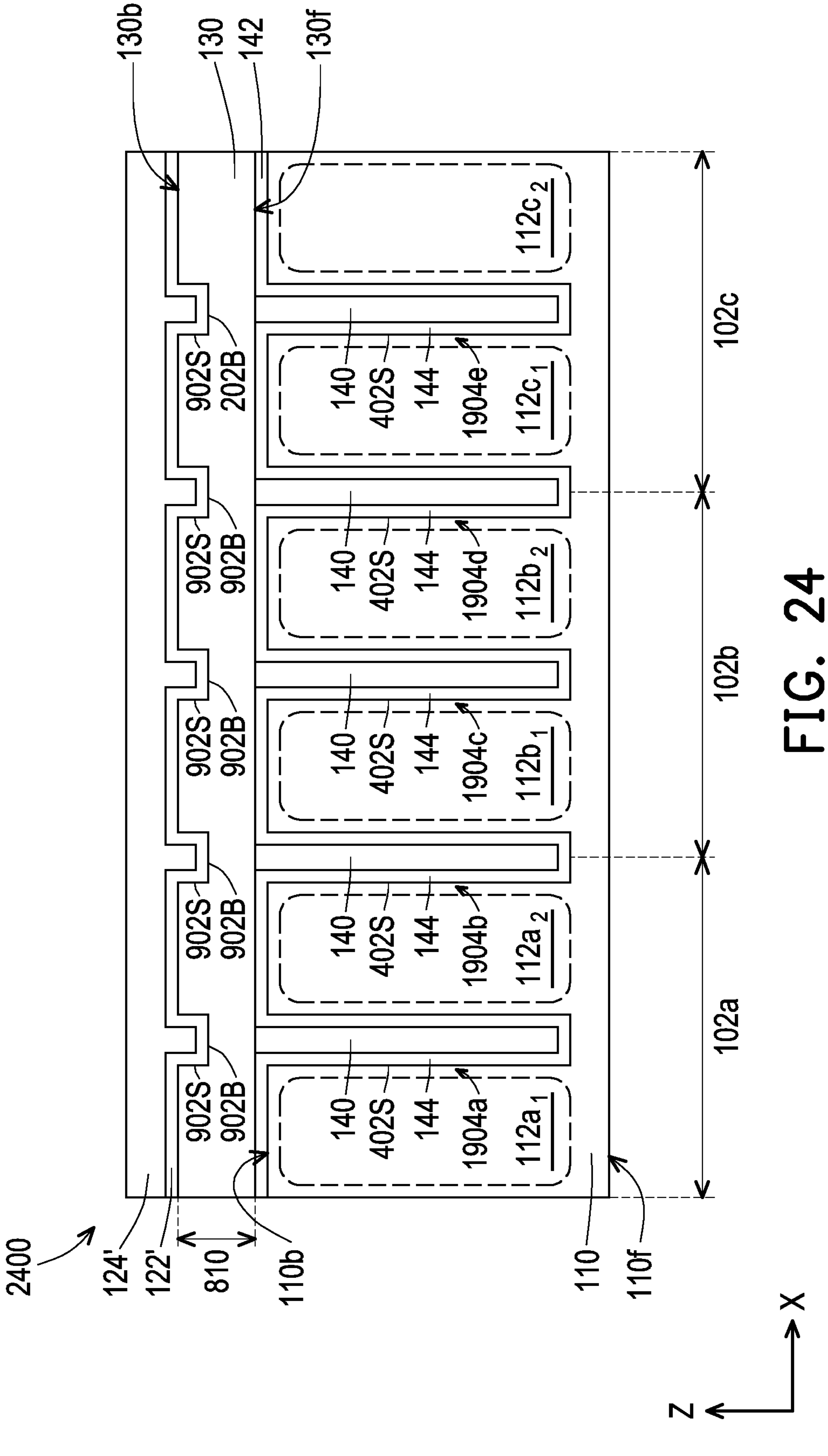

FIG. 24 illustrates a cross-sectional view 2400 of an optical structure during intermediate stages of manufacturing operations also corresponding to operation 208, in accordance with some embodiments. As shown in FIG. 24, the BG trenches 2202 are filled with metallic layer 124'. The metallic layer 124' is deposited to fill the area of the BG trenches 2202 not filled by the metal nitride layer 122' (if present). The cross-sectional view 2400 may be an intermediate structure, and the metal nitride layer 122' and the metallic layer 124' may or may not subject to a planarization process such that top surfaces of the layers could be altered as will be discussed in relation to FIG. 25. Additional details about the metallic layer 124' are described with reference to FIG. 11 and the description is not repeated herein.

Figure 25:
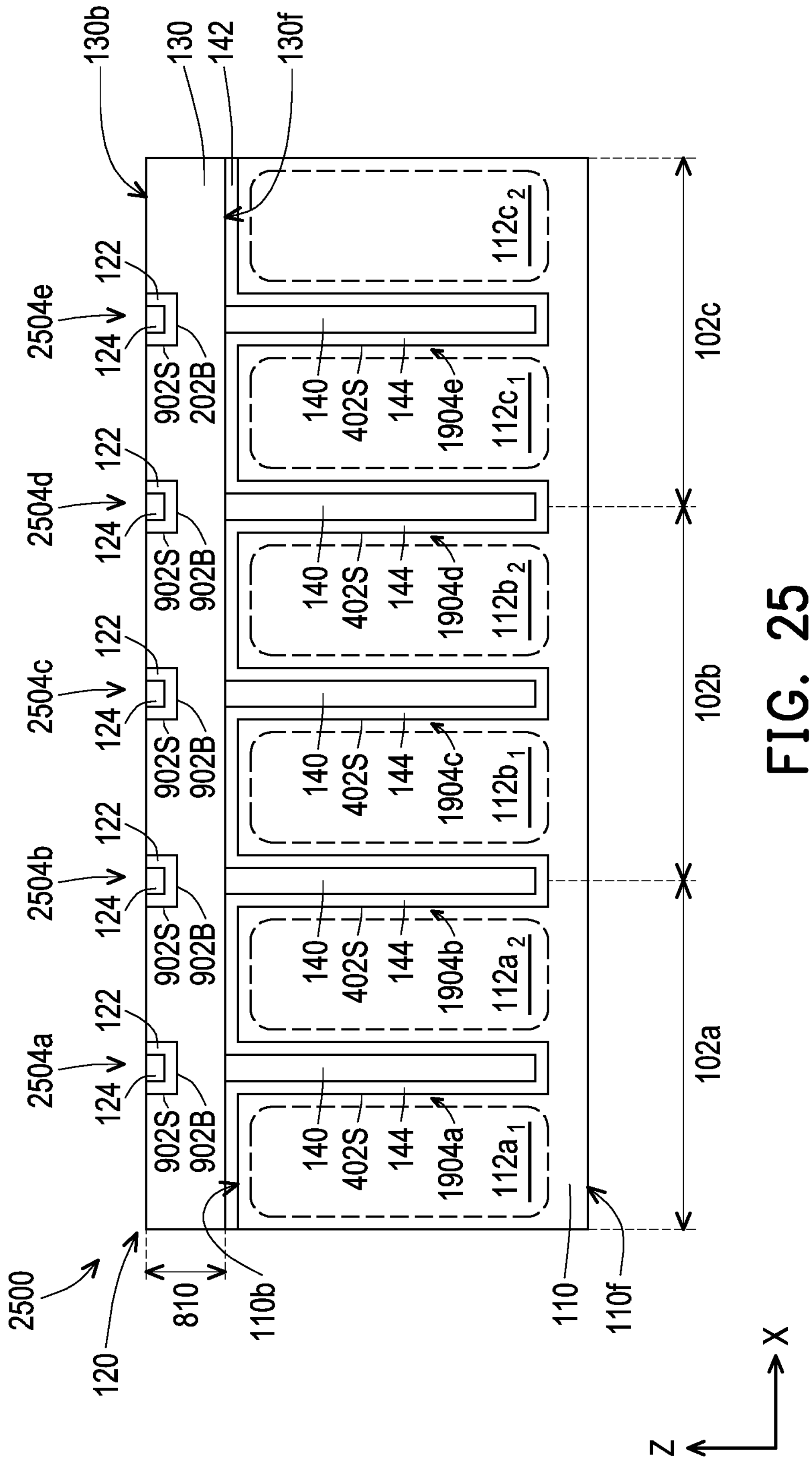

FIG. 25 illustrates a cross-sectional view 2500 of an optical structure during intermediate stages of manufacturing operations also corresponding to operation 208, in accordance with some embodiments. In some embodiments, the metallic layer 124' and the metal nitride layer 122' are subjected to a planarization process, for example, a CMP process, to form a planar surface and the buried grid structure 120. The buried grid structure 120 includes a plurality of buried grid structure sections 2504*a-e*, each buried grid structure section 2504*a-e* is defined by a corresponding BG trench 2202*a-e* (see FIG. 23). In some embodiments, as shown in FIG. 25, portions of the metallic layer 124' and the metal nitride layer 122' above the backside 130*b* of the light transmission layer 130 are removed to form the metal nitride grid section 122 and the metallic grid section 124 such that a top surface of the metal nitride grid section 122 and a top surface of the metallic grid section 124 are co-planar or substantially co-planar with a top surface or the lateral surfaces of the backside 130*b* of the light transmission layer 130.

Figure 26:
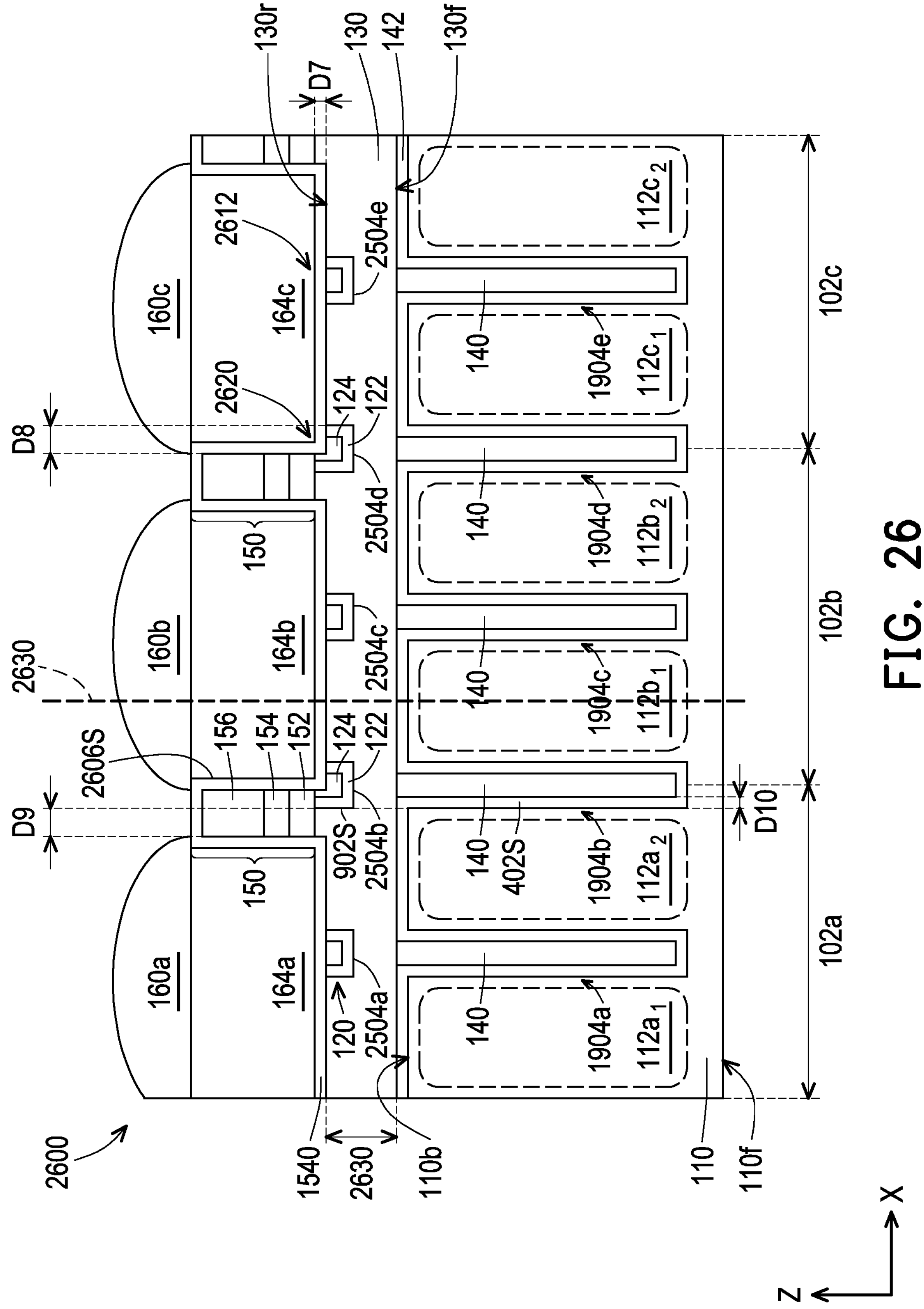

FIG. 26 illustrates a cross-sectional view 2600 of an optical structure including the buried grid structure 120 in accordance with some embodiments. The optical structure of FIG. 26 incorporates the buried grid structure 120 and isolation structure 140 depicted in FIG. 25 with the upper grid structure 150 depicted in FIG. 13E. The upper grid structure 150 may be formed over the buried grid structure 120 using the operations depicted in FIGS. 13A-13E and the related description is not repeated herein. First, similar to FIG. 13A, blanket layers 152', 154', and 156' are formed over the buried grid structure 120. Next, similar to FIG. 13B, the blanket layers 152', 154', and 156' are exposed to a photolithography operation to pattern blanket layers 152', 154', and 156' forming the metal nitride grid section 152, the metallic grid section 154, and the dielectric grid section 156 of the upper grid structure 150. In some embodiments, the photolithography operation not only patterns the blanket layers 152', 154', and 156' but also removes exposed portions of the backside 130*b* of the light transmission layer 130 to form a recessed portion 1512 defined by a recessed surface 130*r*. The recessed portion 2612 has a thickness represented by "D7", which is measured in the z-direction. The thickness "D7" can be calculated by subtracting a recessed thickness 2630 of the light transmission layer 130 from the initial thickness 810 of the light transmission layer 130. In some embodiments, the amount "D7" is from about 0 Å to about 500 Å.

In addition, in some embodiments where the buried grid structure 120 is laterally shifted or offset relative to the upper grid structure 150, the photolithography operation removes a portion of the buried grid structure 120 to form a notch 2620 in the buried grid structure 120. For example, the buried grid structure sections 2504*b* and 2504*d*, which are partially exposed during pattering due to the lateral shift or offset of the upper grid structure 150, have notches 2620 formed therein. The buried grid structure sections 2504*a*, 2504*c*, and 2504*e*, which are fully exposed during patterning are reduced in thickness by the thickness "D7" of the recessed portion 2612. In some embodiments, the photolithography operation removes a portion of the metal nitride grid section 122, a portion of the metallic grid section 124, or both a portion of the metal nitride grid section 122 and a portion of the metallic grid section 124. In some embodiments, as shown in FIG. 26, the notch 2620 is defined by both the metal nitride grid section 122 and the metallic grid section 124. In some embodiments, the notch 2620 may have a thickness measured in the z-direction, which is represented by "D7", and a width measured in the x-direction which is represented by "D8". In some embodiments, the amount "D7" is from about 0 Å to about 500 Å and the amount "D8" is from about 0 Å to about 500 Å. In some embodiments, a sidewall of the notch 2620 is defined by the metallic grid section 124 and a bottom surface of the notch 1520 is defined by the metal nitride grid section 122 and the metallic grid section 124.

In some embodiments, the upper grid structure 150 is vertically aligned with the isolation structure 140 and the buried grid structure 120 to improve the alignment between an arrangement of each of the image-sensing elements 112$a_1$-$c_2$ and an arrangement of the corresponding upper grid structure 150. In other embodiments, as shown in FIG. 26, the upper grid structure 150 may be laterally shifted or offset (e.g., along the x-axis) relative to the buried grid structure 120 and/or the isolation structure 140 in at least one direction by an amount "D9". The amount "D9" may be measured from the sidewall 902S of the buried grid structure 120 to sidewall 2606S of the upper grid structure 150. For example, the amount "D9" may be measured from the sidewall 902S of buried grid structure section 2504*b* to the sidewall 2606S of the upper grid structure 150 as is shown in FIG. 26. In some embodiments, the amount "D9" is from about 0 μm to about ±0.2 μm. Although the upper grid structure 150 is shifted in a direction away from a centerline 2630 of the image-sensing element 112$b_1$ it should be noted that depending upon the desired optical properties, the upper grid structure 150 may be shifted toward the centerline 2630 of the image-sensing element 112$b_1$.

Further, in some embodiments, the buried grid structure 120 may be laterally shifted or offset (e.g., along the x-axis) relative to the isolation structure 140 in at least one direction by an amount "D10". The amount "D10" may be measured from the sidewall 402S of the trench 402*a* to the sidewall 902S of the buried grid structure 120. For example, the amount "D10" may be measured from the sidewall 902S of buried grid structure section 2504*b* to the sidewall 402S of the isolation structure section 1904*b* as is shown in FIG. 26. In some embodiments, the amount "D10" is from about 0 μm to about ±0.2 μm. In some embodiments, the amount "D9" is greater than the amount "D10". Although the buried grid structure 120 is shifted in a direction toward the centerline 2630 of the image-sensing element 112$b_1$ it should be noted that depending upon the desired optical properties, the buried grid structure 120 may be shifted away from the centerline 2630 of the image-sensing element 112$b_1$.

In some embodiments, similar to FIGS. 13C and 15C, dielectric capping layer 1540 is formed over the exposed lateral surfaces of the light transmission layer 130, for example, the recessed surface 130*r*, the upper grid structure 1510, and exposed portions of the buried grid structure 120, for example, the metallic grid section 124 and the metal nitride grid section 122 that define the notch 1520. Thereby the upper grid structure 1510 is inside the dielectric capping layer 1540 and surrounded by the dielectric capping layer 1540. Color filters 164*a-c* are formed over the light transmission layer 130. Micro lenses 160*a-c* are then formed above the color filters 164*a-c*. It should be noted that the optical structure depicted in FIG. 26 may be tunable for various light conditions by modifying the isolation structure 140 by, for example, removing one or more of the isolation structure sections 1904*a-e* and/or modifying the upper grid structure 150, by removing one or more portions of the upper grid structure 150.

Figure 27:
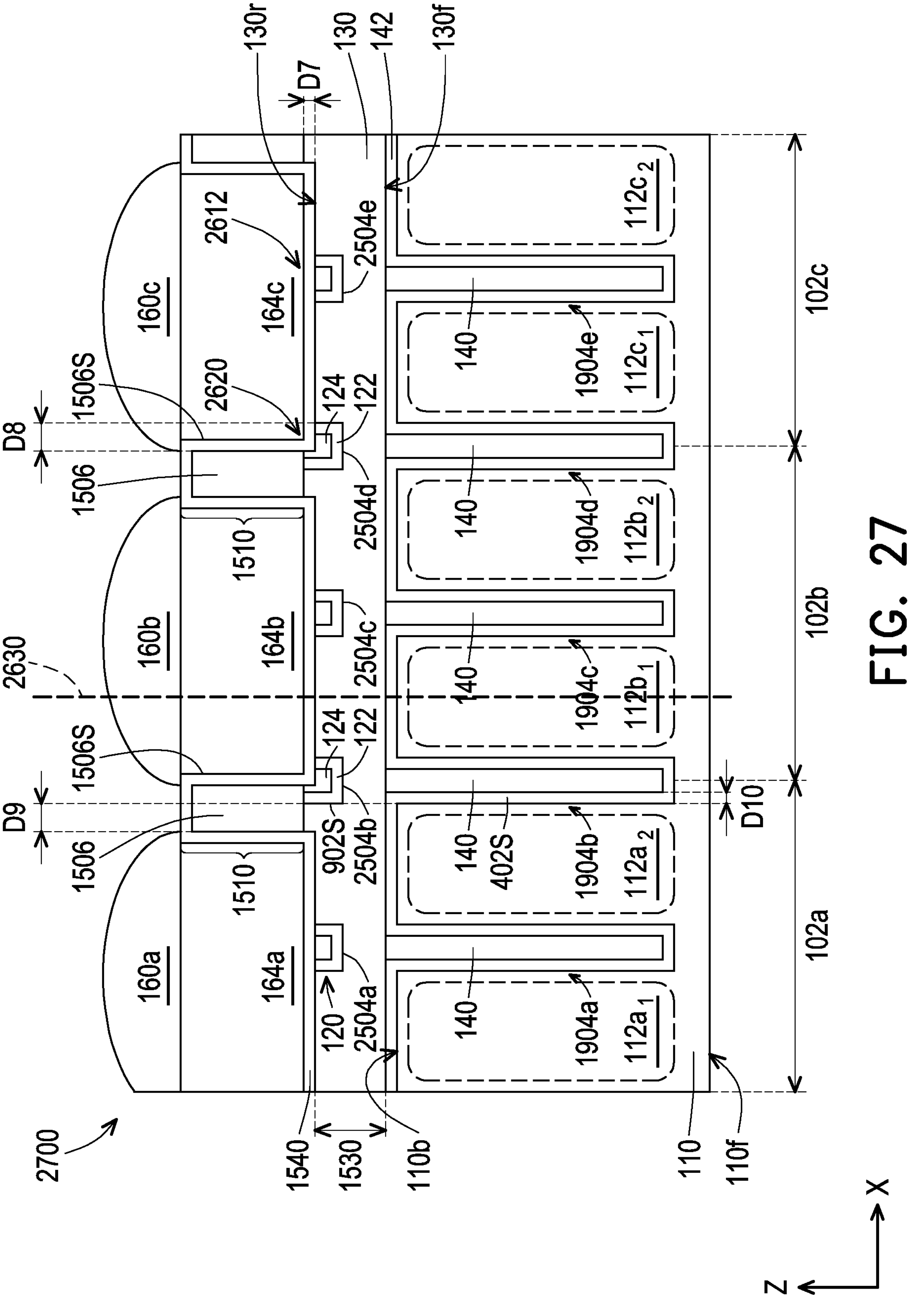

FIG. 27 illustrates a cross-sectional view 2700 of an optical structure including the buried grid structure 120 in accordance with some embodiments. The optical structure of FIG. 27 incorporates the buried grid structure 120 and the isolation structure 140 depicted in FIG. 25 with the upper grid structure 1510 depicted in FIGS. 15C and 15D. The optical grid structure of FIG. 27 is similar to the optical grid structure of FIG. 26, except that the upper grid structure 150 of FIG. 26 is replaced with the upper grid structure 1510. The upper grid structure 1510 may be formed over the buried grid structure 120 using the operations depicted in FIGS. 15A-15D and the related description is not repeated herein. First, similar to FIG. 15A, an oxide material layer, for example, the oxide material layer 1506' is formed over the buried grid structure 120. Next, similar to FIG. 15A, the oxide material layer 1506' is exposed to a photolithography operation to pattern the oxide material layer 1506' and form the oxide grid section 1506 of the upper grid structure 1510. In some embodiments, the photolithography operation not only patterns the oxide material layer 1506' but also removes exposed portions of the backside 130*b* of the light transmission layer 130 to form the recessed portion 2612 defined by the recessed surface 130*r* as previously described. The recessed portion 2612 has a thickness represented by "D7", which is measured in the z-direction. In addition, in some embodiments where the buried grid structure 120 is shifted or offset relative to the upper grid structure 1510, the photolithography operation removes a portion of the buried grid structure 120 to form the notch 2620 in the buried grid structure 120 as previously described. It should be noted that the optical structure depicted in FIG. 27 may be tunable for various light conditions by modifying the isolation structure 140 by, for example, removing one or more of the isolation structure sections 1904*a-e* and/or modifying the upper grid structure 1510, by removing one or more portions of the upper grid structure 1510.

Figure 28:
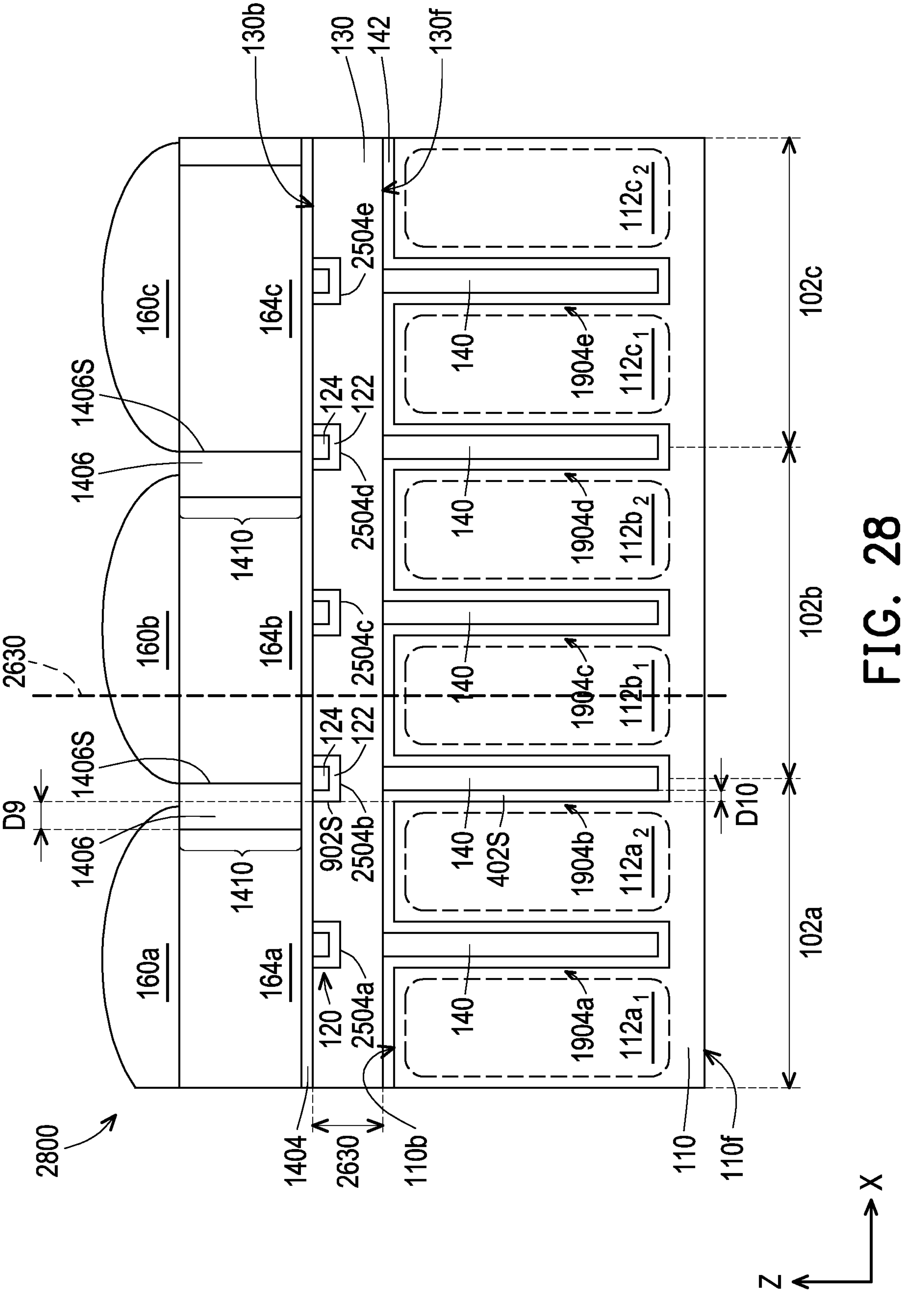

FIG. 28 illustrates a cross-sectional view 2800 of an optical structure including the buried grid structure 120 in accordance with some embodiments. The optical structure of FIG. 28 incorporates the buried grid structure 120 and the isolation structure 140 depicted in FIG. 25 with the upper grid structure 1410 depicted in FIGS. 14B and 14C. The upper grid structure 1410 may be formed over the buried grid structure 120 using the operations depicted in FIGS. 14A-14C and the related description is not repeated herein. First, similar to FIG. 14A, a dielectric capping layer, for example, the dielectric capping layer 1404 is formed over the backside 130*b* of the light transmission layer 130. Next, a low-n material layer, for example, the low-n material layer 1406', is formed over the dielectric capping layer 1404 if the dielectric capping layer was previously formed over the light transmission layer 130. Next, similar to FIG. 14B, the low-n material layer 1406' is exposed to a photolithography operation to pattern the low-n material layer 1406' and form the low-n material grid section 1406, which makes up the upper grid structure 1410. In some embodiments, the dielectric capping layer 1404 functions as an etch stop during the photolithography operation to protect the backside 130*b* of the light transmission layer 130 from etching. Similar to FIG. 14C, color filters 164*a-c* are formed over the light transmission layer 130. Micro lenses 160*a-c* are then formed above the color filters 164*a-c*. The buried grid structure 120 and/or the upper grid structure 1410 may be shifted or offset as previously described. It should be noted that the optical structure depicted in FIG. 28 may be tunable for various light conditions by modifying the isolation structure 140 by, for example, removing one or more of the isolation structure sections 1904*a-e* and/or modifying the upper grid structure 1410, by removing one or more portions of the upper grid structure 1410.

FIG. 29A-29D illustrate a cross-sectional view 2900 of an optical structure during intermediate stages of manufacturing operations, that can be used with the image sensor device 100B of FIG. 1B in accordance with some embodiments. Referring to FIGS. 29A-29D, in some embodiments, an upper grid structure 2910 is formed over the backside 130*b* of the light transmission layer 130. In some embodiments, the upper grid structure 2910 is a composite grid structure. The upper grid structure 2910 may include a metal section, a metal nitride section, a dielectric section, a low-n material, and/or an organic section. In some embodiments, the upper grid structure 2910 may have a tetragon shape or circular shape from a top view. In some embodiments, the upper grid structure 2910 is vertically aligned with the buried grid structure 120. In some embodiments, the upper grid structure 2910 is vertically aligned with the isolation structure 140. In some embodiments, the upper grid structure 2910 is aligned with both the buried grid structure 120 and the isolation structure 140. In some embodiments, the upper grid structure 2910 is laterally shifted or offset (e.g., along the x-axis) to at least one of the buried grid structure 120 and the isolation structure 140 as is shown, for example, in FIG. 29B.

Figure 29A:
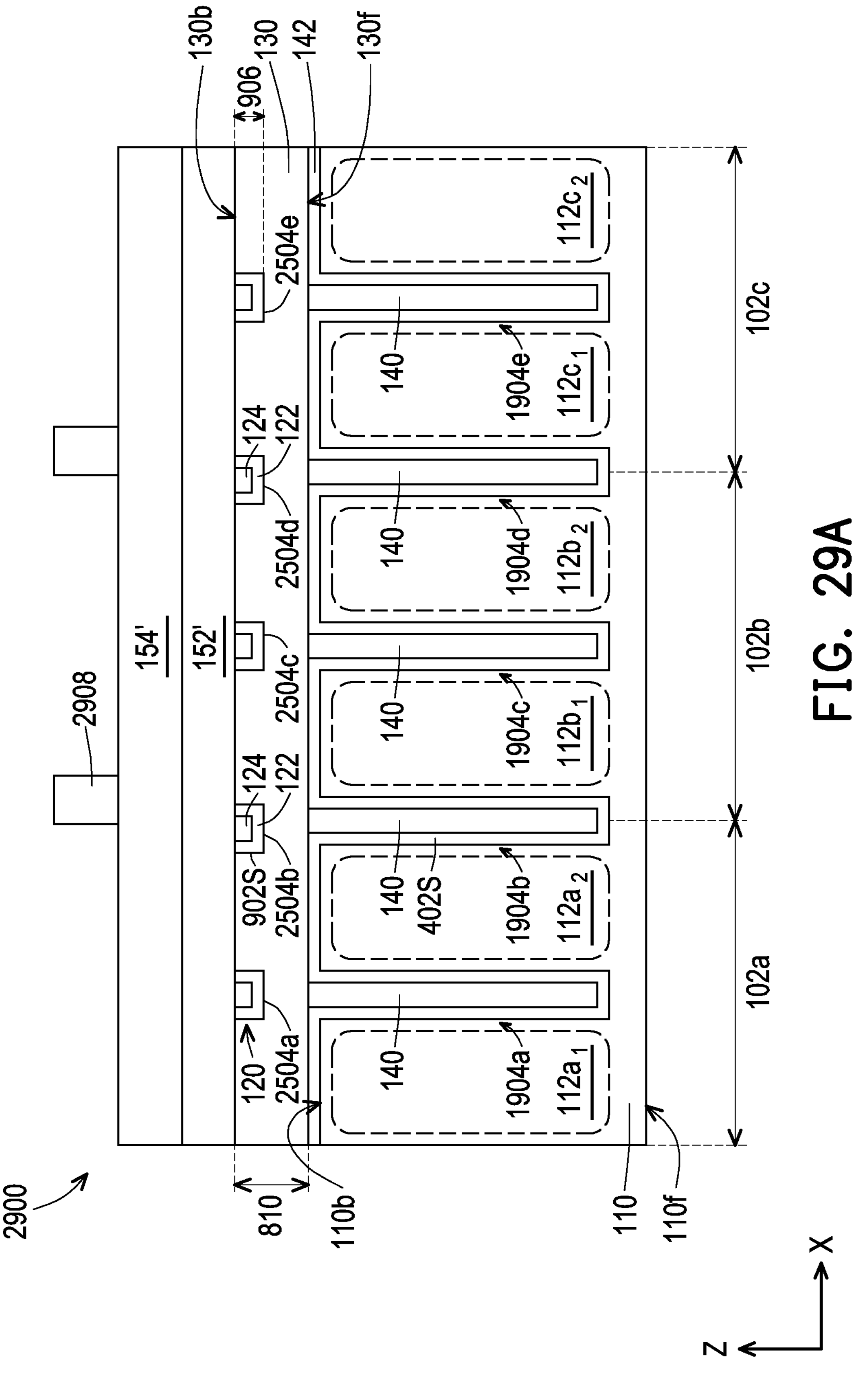

Referring to FIG. 29A, FIG. 29A depicts the formation of one example of the upper grid structure 2910 in which the upper grid structure 2910 is a composite structure. Optionally, the metal nitride layer 152' is subsequently formed above the light transmission layer 130 when a composite grid is to be formed. The metallic layer 154' is formed over the light transmission layer 130, or over the metal nitride layer 152' if the metal nitride layer was previously formed over the light transmission layer 130.

Subsequently, a photolithography operation is performed, wherein the metal nitride layer 152' and the metallic layer 154' are patterned by a masking layer 2908 to form the upper grid structure 2910. Specifically, the metal nitride layer 152' and the metallic layer 154' are exposed to a photolithography operation to pattern the metal nitride layer 152' and the metallic layer 154' into the metal nitride grid section 152 and the metallic grid section 154 respectively, which make up the upper grid structure 2910. It should be noted that the metal nitride grid section 152 and the metallic grid section 154 may have a circular shape or a tetragon shape from a top view perspective. In addition, the metal nitride grid section 152, and the metallic grid section 154 (which would become a portion of the upper grid structure 2910 subsequently) may be laterally shifted or offset (e.g., along the x-axis) relative to the isolation structure 140 and the buried grid structure 120 to improve the alignment between an arrangement of each of the image-sensing elements 112$a_1$-$c_2$ and an arrangement of the corresponding upper grid structure 2910. The masking layer 2908 is subsequently removed.

In some embodiments, the photolithography operation not only patterns the metal nitride layer 152' and the metallic layer 154' but also removes exposed portions of the backside 130*b* of the light transmission layer 130 to form a recessed portion 2912 defined by a recessed surface 130*r*. The recessed portion 2912 has a thickness represented by "D11", which is measured in the z-direction.

In addition, in some embodiments where the buried grid structure 120 is shifted or offset relative to the upper grid structure 2910, the photolithography operation removes a portion of the buried grid structure 120 to form a notch 2920 in the buried grid structure 120. For example, buried grid structure sections 2504*b* and 2504*d*, which are partially exposed during patterning due to the lateral shift or offset of the upper grid structure 2910, have notches 2920 formed therein. The buried grid structure sections 2504*a*, 2504*c*, and 2504*e*, which are fully exposed during patterning are reduced in thickness by the thickness "D11" of the recessed portion 2912. The thickness "D11" can be calculated by subtracting a recessed thickness 1530 of the light transmission layer 130 from the initial thickness 810 of the light transmission layer 130. In some embodiments, the amount "D11" is in a range from about 0 Å to about 500 Å.

Figure 29B:
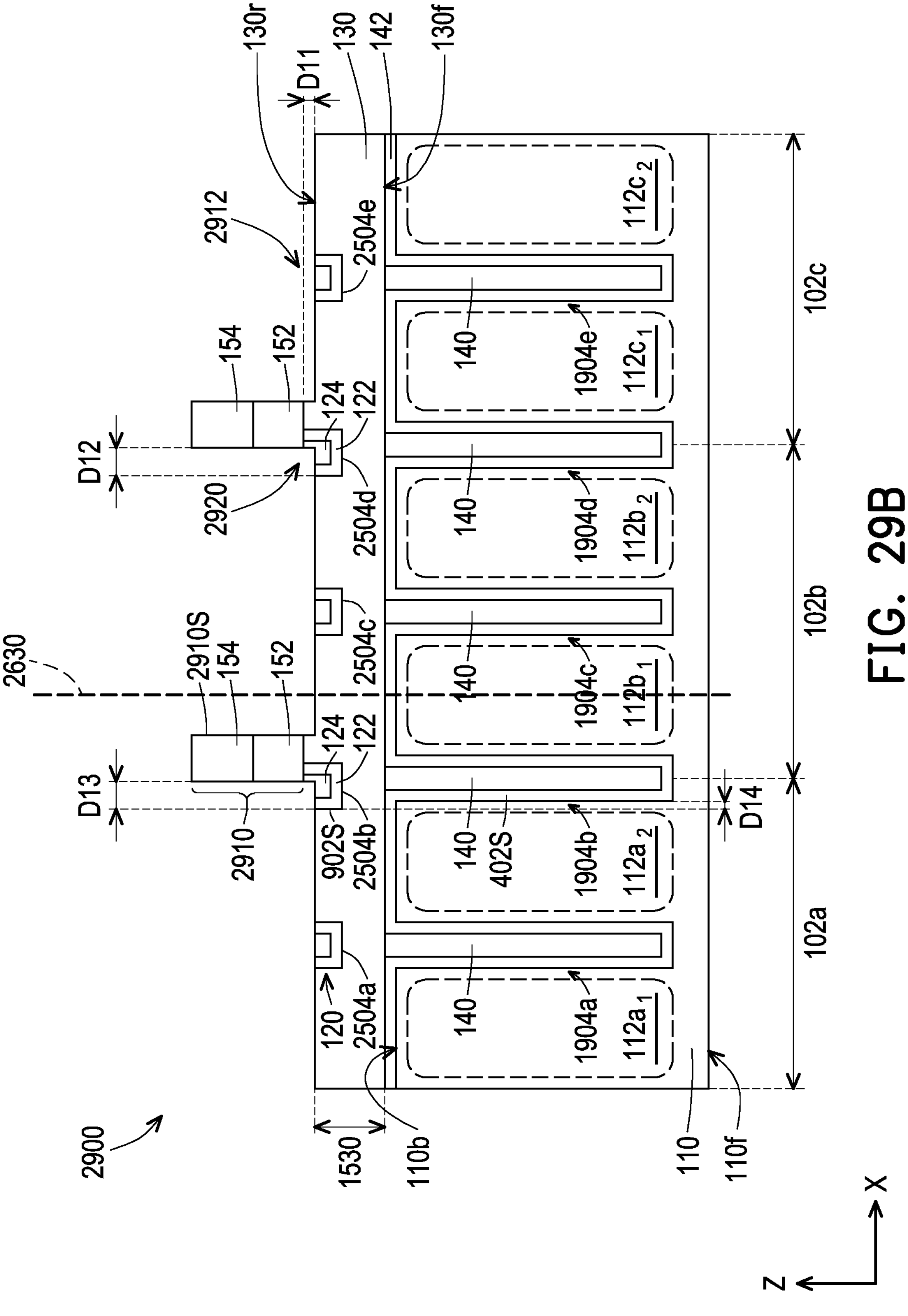

In some embodiments, the photolithography operation removes a portion of the metal nitride grid section 122, a portion of the metallic grid section 124, or both a portion of the metal nitride grid section 122 and a portion of the metallic grid section 124. In some embodiments, as shown in FIG. 29B, the notch 2920 is defined by both the metal nitride grid section 122 and the metallic grid section 124. In some embodiments, the notch 2920 may have a thickness measured in the z-direction, which is represented by "D11", and a width measured in the x-direction which is represented by "D12". In some embodiments, the amount "D11" is from about 0 Å to about 500 Å and the amount "D12" is from about A to about 500 Å. In some embodiments, a sidewall of the notch 2920 is defined by the metallic grid section 124 and a bottom surface of the notch 2920 is defined by both the metal nitride grid section 122 and the metallic grid section 124.

In some embodiments, the upper grid structure 2910 is vertically aligned with the isolation structure 140 and the buried grid structure 120 to improve the alignment between an arrangement of each of the image-sensing elements 112$a_1$-$c_2$ and an arrangement of the corresponding upper grid structure 2910. In other embodiments, as shown in FIG. 29B, the upper grid structure 2910 may be laterally shifted or offset (e.g., along the x-axis) relative to the buried grid structure 120 and/or the isolation structure 140 in at least one direction by an amount "D13". The amount "D13" may be measured from the sidewall 902S of the buried grid structure 120 to sidewall 2910S of the upper grid structure 2910. For example, the amount "D13" may be measured from the sidewall 902S of buried grid structure section 2504*b* to the sidewall 2910S of the upper grid structure 2910 as is shown in FIG. 29B. In some embodiments, the amount "D13" is from about 0 μm to about ±0.2 μm. Although the upper grid structure 2910 is shifted in a direction toward a centerline 2630 of the image-sensing element 112$b_1$ it should be noted that depending upon the desired optical properties, the upper grid structure 2910 may be shifted away from the centerline 2630 of the image-sensing element 112$b_1$.

Further, in some embodiments, the buried grid structure 120 may be laterally shifted or offset (e.g., along the x-axis) relative to the isolation structure 140 in at least one direction by an amount "D14". The amount "D14" may be measured from the sidewall 402S of the trench 402*a* to the sidewall 902S of the buried grid structure 120. For example, the amount "D14" may be measured from the sidewall 902S of buried grid structure section 2504*b* to the sidewall 402S of the isolation structure section 1904*b* as is shown in FIG. 29B. In some embodiments, the amount "D14" is from about 0 μm to about ±0.2 μm. In some embodiments, the amount "D13" is greater than the amount "D14". Although the buried grid structure 120 is shifted in a direction away from the centerline 2630 of the image-sensing element 112$b_1$ it should be noted that depending upon the desired optical properties, the buried grid structure 120 may be shifted toward the centerline 2630 of the image-sensing element 112$a_2$.

Figure 29C:
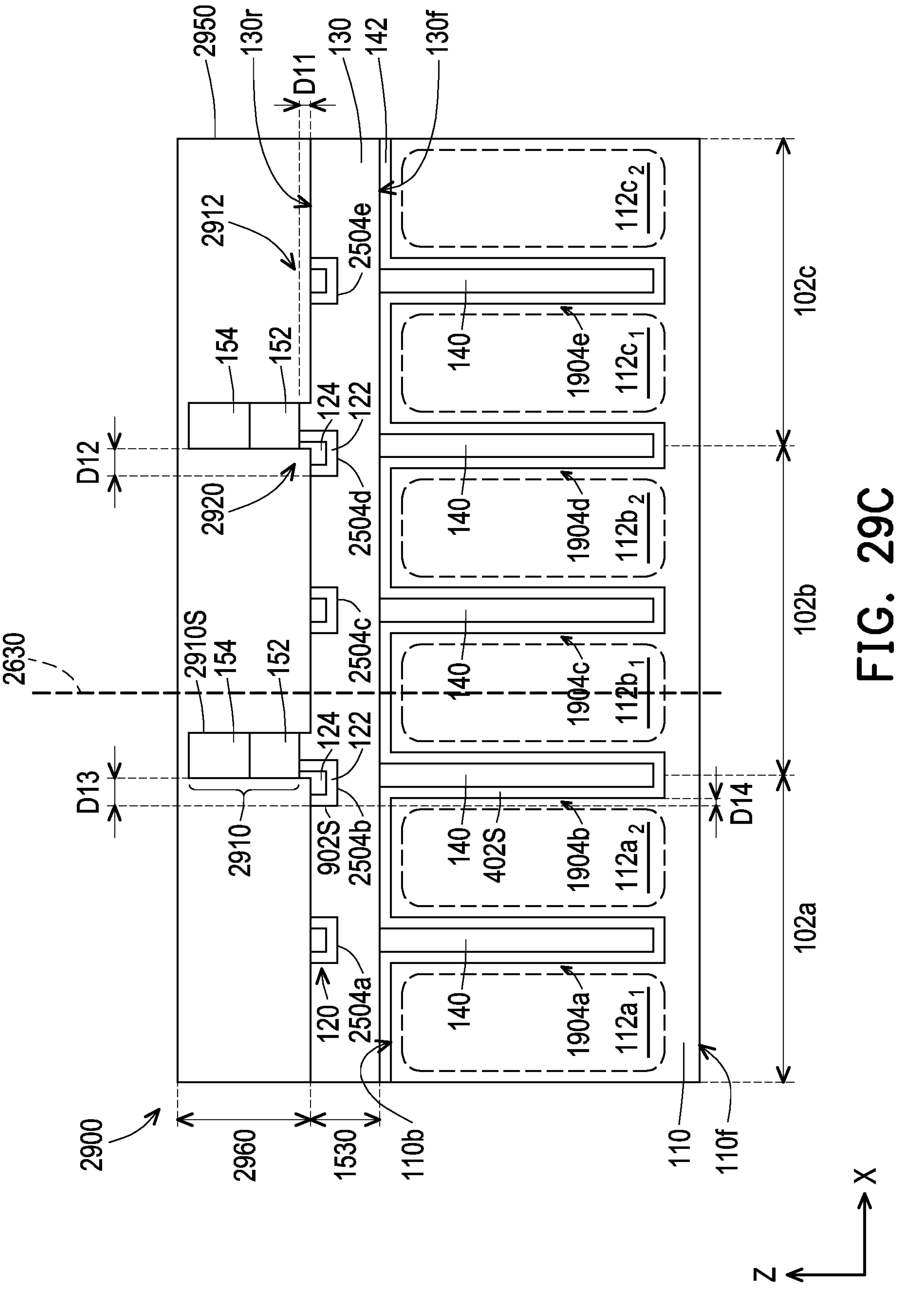

Turning to FIG. 29C, a dielectric layer 2950 is formed over the upper grid structure 2910 and the recessed surface 130*r* of the light transmission layer 130. The dielectric layer 2950 may include oxide, such as silicon oxide ($SiO_2$), hafnium oxide ($HfO_2$), or the like. In some embodiments, the dielectric layer 2950 includes the same material as the isolation material 144. In other embodiments, the dielectric layer 2950 includes material that is different than the material of the isolation material 144. Deposition of the dielectric layer 2950 may involve a variety of techniques, such as CVD, plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), sub-atmospheric CVD (SACVD), PVD, atomic layer deposition (ALD), sputtering, and/or other suitable operations. The refractive index of the dielectric layer 2950 may be less than the refractive index of silicon. After deposition, the dielectric layer 2950 may be exposed to a planarization process. In some embodiments, the dielectric layer 2950 has a thickness 2960 in a range from about 3500 Å to about 6000 Å.

Figure 29D:
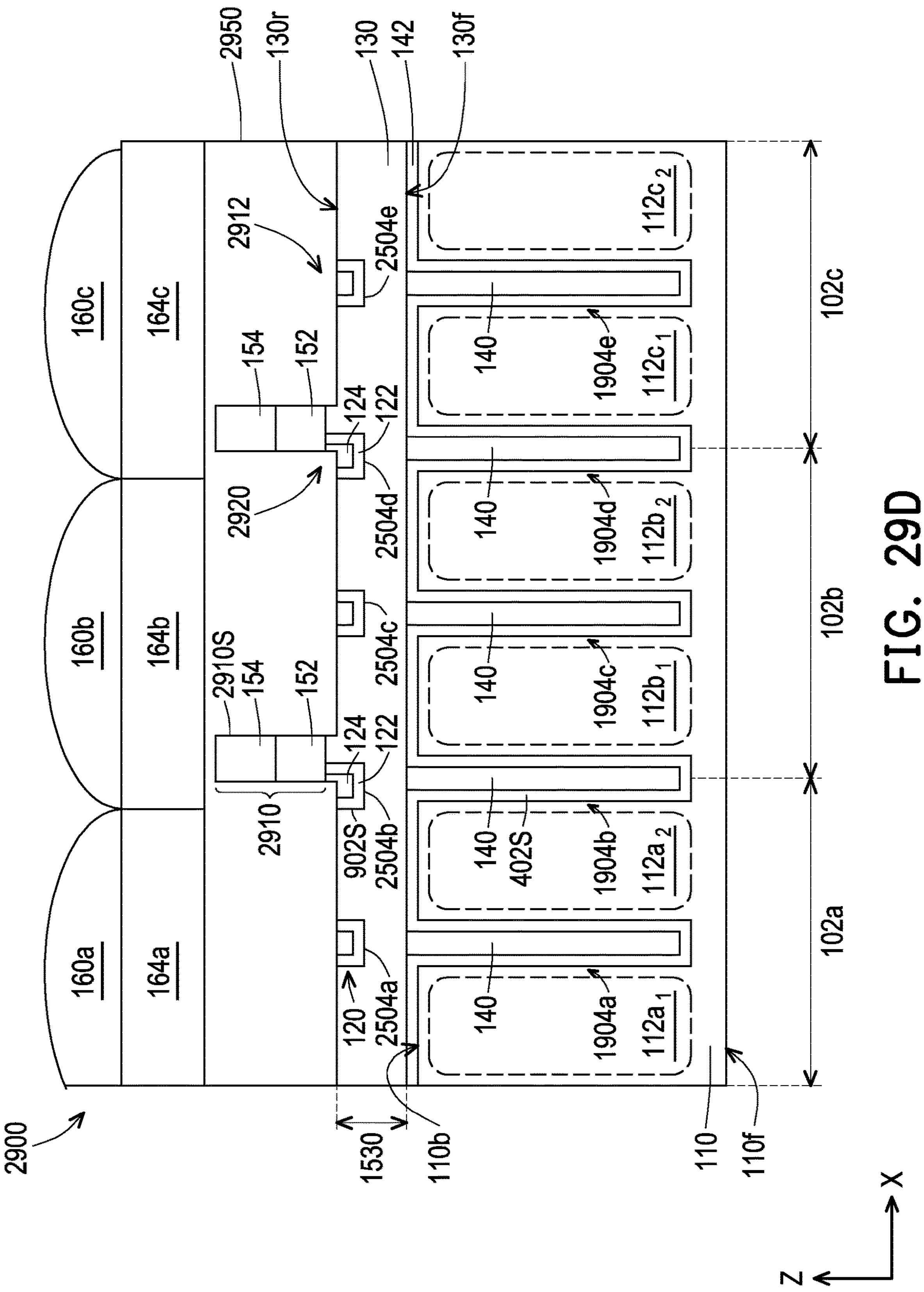

Turning to FIG. 29D, a color filters 164*a-c* may be formed over the dielectric layer 2950. Micro lenses 160*a-c* are then formed above the color filters 164*a-c*. It should be noted that the optical structure depicted in FIG. 29 may be tunable for various light conditions by modifying the isolation structure 140 by, for example, removing one or more of the isolation structure sections 1904*a-e* and/or modifying the upper grid structure 2910, by removing one or more portions of the upper grid structure 2910.

According to an embodiment, an optical structure is provided. The optical structure includes a substrate having a frontside and a backside opposite the frontside, a plurality of image-sensing elements arranged within the substrate, and a deep trench isolation (DTI) structure disposed between adjacent image-sensing elements. The DTI structure extends from the backside of the substrate to a first depth within the substrate and laterally surrounds the plurality of image-sensing elements. The optical structure further includes a light transmission layer formed over the backside of the substrate. The light transmission layer includes a first side, a second side opposite the first side, and the second side adjacent to the backside of the substrate. The optical structure further includes a buried grid structure in the light transmission layer, the buried grid structure extending from the first side of the light transmission layer to a second depth within the light transmission layer. In an embodiment, the buried grid structure includes a metallic section surrounded by a metal nitride section. In an embodiment, the metallic section includes tungsten, and the metal nitride section includes titanium nitride. In an embodiment, the optical structure further includes an upper grid structure extending upward from the first side of the light transmission layer. In an embodiment, the upper grid structure is laterally offset relative to the buried grid structure. In an embodiment, the buried grid structure is vertically aligned with the DTI structure. In an embodiment, the buried grid structure is offset relative to the DTI structure. In an embodiment, a centerline of the upper grid structure is vertically aligned with a centerline of the buried grid structure. In an embodiment, the centerline of the buried grid structure is vertically aligned with a centerline of the DTI structure. In an embodiment, the optical structure further includes a color filter layer formed over the backside of the substrate and a micro lens over the color filter layer. The color filter layer is formed in openings defined by the upper grid structure.

According to another embodiment, an optical structure is provided. The optical structure includes a substrate having a frontside and a backside opposite the frontside, a plurality of image-sensing elements arranged within the substrate, an isolation structure in the substrate, surrounding the image-sensing elements, a light transmission layer formed adjacent to the backside of the substrate, and a buried grid structure formed in the light transmission layer. The buried grid structure includes a plurality of buried grid structure segments that surround the outer perimeters of the plurality of image sensing elements respectively, such that a plurality of gaps defined by the buried grid structure segments overlie the plurality of image-sensing elements. The buried grid structure includes a metal, a metal nitride, or a combination thereof. The optical structure further includes an upper grid structure formed over the light transmission layer. The upper grid structure includes a plurality of upper grid structure sections that surround the outer perimeters of the plurality of image-sensing elements respectively, such that a plurality of openings defined by the upper grid structure sections overlie the plurality of image-sensing elements. The optical structure further includes color filters arranged in the openings. In an embodiment, the buried grid structure is closer to the isolation structure than the upper grid structure. In an embodiment, a height of the upper grid structure is greater than a height of the buried grid structure. In an embodiment, the buried grid structure and the upper grid structure include the same material. In an embodiment, the buried grid structure and the upper grid structure include tungsten and titanium nitride.

According to yet another embodiment, a method of forming an optical structure is provided. The method includes forming a plurality of image-sensing elements in a substrate, the substrate having a frontside and a backside opposite the frontside. The method further includes forming a deep trench isolation (DTI) structure disposed between adjacent image-sensing elements, wherein the DTI structure surrounds the plurality of image-sensing elements. The method further includes forming a light transmission layer on the backside of the substrate, the light transmission layer comprising a first side, a second side opposite the first side, the second side adjacent to the backside of the substrate. The method further includes forming a buried grid structure in the light transmission layer, the buried grid structure extending from the first side of the light transmission layer to a second depth within the light transmission layer. The buried grid structure is formed by forming a trench in the light transmission layer, depositing a metal nitride layer in the trench, and filling the trench with metallic material. In an embodiment, the buried grid structure is made up of a plurality of buried grid structure segments that surround the outer perimeters of the plurality of image sensing elements respectively, such that a plurality of gaps defined by the buried grid structure segments overlie the plurality of image-sensing elements. In an embodiment, the method further includes planarizing the buried grid structure so that an upper surface of the metal nitride layer and an upper surface of the metallic layer are coplanar with the first side of the light transmission layer. In an embodiment, forming the DTI structure includes forming a DTI trench extending from the backside of the substrate to a first depth within the substrate, depositing a high-k dielectric liner over sidewalls and a bottom surface of the DTI trench, and filling the DTI trench with an isolation material. The isolation material extends a thickness above the backside of the substrate. In an embodiment, the light transmission layer and the isolation material are composed of the same material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An optical structure, comprising:

a substrate having a frontside and a backside opposite the frontside;

a plurality of image-sensing elements arranged within the substrate;

a deep trench isolation (DTI) structure disposed between adjacent image-sensing elements, extending from the backside of the substrate to a first depth within the substrate and laterally surrounding the plurality of image-sensing elements;

a light transmission layer formed over the backside of the substrate, the light transmission layer comprising a first side, a second side opposite the first side, the second side adjacent to the backside of the substrate;

a buried grid structure in the light transmission layer, the buried grid structure extending from the first side of the light transmission layer to a second depth within the light transmission layer; and an upper grid structure extending upward from the first side of the light transmission layer, wherein the buried grid structure is offset relative to the DTI structure along a first direction, and the upper grid structure is offset relative to the DTI along a second direction different from the first direction, wherein the buried grid structure and the light transmission layer includes a recessed portion, and the upper grid structure surrounds the recessed portion.

2. The optical structure of claim 1, wherein the buried grid structure comprises a metallic section surrounded by a metal nitride section.

3. The optical structure of claim 2, wherein the metallic section comprises tungsten and the metal nitride section comprises titanium nitride.

4. The optical structure of claim 1, wherein the upper grid structure is laterally shifted away from centerline of the imaging sensing element and the buried grid structure is shifted towards the centerline of the image sensing element.

5. The optical structure of claim 1, further comprising:

a color filter layer formed over the backside of the substrate, wherein the color filter layer is formed in openings defined by the upper grid structure; and a micro lens over the color filter layer.

6. An optical structure, comprising:

a substrate having a frontside and a backside opposite the frontside;

a plurality of image-sensing elements arranged within the substrate;

an isolation structure in the substrate, surrounding the plurality of image-sensing elements;

a light transmission layer formed adjacent to the backside of the substrate;

a buried grid structure formed in the light transmission layer, the buried grid structure made up of a plurality of buried grid structure segments that surround outer perimeters of the plurality of image-sensing elements respectively, such that a plurality of gaps defined by the plurality of buried grid structure segments overlie the plurality of image-sensing elements, wherein the buried grid structure comprises a metal, a metal nitride, or a combination thereof; and an upper grid structure formed over the light transmission layer, the upper grid structure made up of a plurality of upper grid structure sections that surround the outer perimeters of the plurality of image-sensing elements respectively, such that a plurality of openings defined by the plurality of upper grid structure sections overlie the plurality of image-sensing elements, wherein the buried grid structure is offset with at least one of the upper grid structure and the isolation structure, and the light transmission layer and buried grid structure have a plurality of recess portions, and the upper grid structure sections surround the plurality of recess portions.

7. The optical structure of claim 6, wherein the buried grid structure is closer to the isolation structure than the upper grid structure is to the isolation structure.

8. The optical structure of claim 7, wherein a height of the upper grid structure is greater than a height of the buried grid structure.

9. The optical structure of claim 7, wherein the buried grid structure and the upper grid structure comprise the same material.

10. The optical structure of claim 7, wherein the buried grid structure and the upper grid structure comprise tungsten and titanium nitride.

11. A method of forming an optical structure, comprising:

forming a plurality of image-sensing elements in a substrate, the substrate having a frontside and a backside opposite the frontside;

forming a deep trench isolation (DTI) structure disposed between adjacent image-sensing elements, wherein the DTI structure surrounds the plurality of image-sensing elements;

forming a light transmission layer on the backside of the substrate, the light transmission layer comprising a first side, a second side opposite the first side, the second side adjacent to the backside of the substrate;

forming a buried grid structure in the light transmission layer, the buried grid structure extending from the first side of the light transmission layer to a second depth within the light transmission layer, wherein forming the buried grid structure, comprises:

forming a trench in the light transmission layer;

depositing a metal nitride layer in the trench; and filling the trench with metallic material, wherein forming the buried grid structure comprises laterally shifting centerlines of the buried grid structure from centerlines of the plurality of image-sensing elements; and removing a portion of the buried grid structure to form a notch in the buried grid structure.

12. The method of claim 11, wherein the buried grid structure is made up of a plurality of buried grid structure segments that surround outer perimeters of the plurality of image-sensing elements respectively, such that a plurality of gaps defined by the plurality of buried grid structure segments overlie the plurality of image-sensing elements.

13. The method of claim 12, further comprising, prior to removing a portion of the buried grid structure, planarizing the buried grid structure so that an upper surface of the metal nitride layer and an upper surface of the metallic layer are substantially coplanar with the first side of the light transmission layer.

14. The method of claim 12, wherein forming the DTI structure, comprises:

forming a DTI trench extending from the backside of the substrate to a first depth within the substrate;

depositing a high-k dielectric liner over sidewalls and a bottom surface of the DTI trench; and filling the DTI trench with an isolation material, wherein the isolation material extends a thickness above the backside of the substrate.

15. The method of claim 14, wherein the light transmission layer and the isolation material are composed of the same material.

16. The optical structure of claim 6, wherein the buried grid structure is laterally offset relative to the upper grid structure and the isolation structure, and the isolation structure is laterally offset relative to the upper grid structure.

17. The optical structure of claim 6, wherein the buried grid structure and the upper grid structure are offset relative to the isolation structure along opposite directions.

18. The method of claim 12, further comprising: forming an upper grid structure over the buried grid structure and the light transmission layer.

19. The method of claim 18, wherein forming an upper grid structure comprises: laterally shifting centerlines of the upper grid structure from the centerlines of the plurality of image-sensing elements.

20. The optical structure of claim 1, wherein the buried grid structure has a notch formed between an upper surface of the light transmission layer and a recessed surface of the recessed portion.

* * * * *